United States Patent
Conger

(10) Patent No.: US 8,212,140 B2
(45) Date of Patent: Jul. 3, 2012

(54) SOLAR ARRAY SUPPORT METHODS AND SYSTEMS

(75) Inventor: Steven J. Conger, Carbondale, CO (US)

(73) Assignee: P4P, LLC, Carbondale, CO (US)

( * ) Notice: Subject to any disclaimer, the term of this patent is extended or adjusted under 35 U.S.C. 154(b) by 859 days.

(21) Appl. No.: 12/255,178

(22) Filed: Oct. 21, 2008

(65) Prior Publication Data

US 2009/0038672 A1  Feb. 12, 2009

Related U.S. Application Data

(63) Continuation-in-part of application No. 12/143,624, filed on Jun. 20, 2008, which is a continuation-in-part of application No. 12/122,228, filed on May 16, 2008, which is a continuation-in-part of application No. 11/856,521, filed on Sep. 17, 2007, now Pat. No. 7,687,706, which is a continuation of application No. 10/606,204, filed on Jun. 25, 2003, now Pat. No. 7,285,719.

(60) Provisional application No. 60/459,711, filed on Apr. 2, 2003.

(51) Int. Cl.
*H01L 31/04* (2006.01)

(52) U.S. Cl. ........ 136/248; 136/243; 136/244; 126/569; 126/561; 126/621; 126/562; 126/684; 438/52

(58) Field of Classification Search .................. 136/248, 136/243, 244; 126/569, 561, 621, 562, 684; 438/52

See application file for complete search history.

(56) References Cited

U.S. PATENT DOCUMENTS

| | | | |
|---|---|---|---|
| 3,449,874 A | 6/1969 | Beaupre' |
| 3,704,560 A | 12/1972 | Ratliff, Jr. |
| 3,750,349 A | 8/1973 | Deike |
| 4,025,786 A | 5/1977 | Hamilton |
| 4,063,963 A | 12/1977 | Bond, Jr. |
| 4,071,017 A | 1/1978 | Russell, Jr. et al. |
| 4,119,863 A | 10/1978 | Kelly |
| 4,122,675 A | 10/1978 | Polyak |
| 4,186,720 A | 2/1980 | Schmauder et al. |

(Continued)

FOREIGN PATENT DOCUMENTS

CA  2004980  *  6/1990

(Continued)

OTHER PUBLICATIONS

U.S. Appl. No. 29/383,562, filed Jan. 19, 2011, Conger.

(Continued)

*Primary Examiner* — Jennifer Michener
*Assistant Examiner* — Jayne Mershon
(74) *Attorney, Agent, or Firm* — Sheridan Ross, P.C.

(57) ABSTRACT

Systems and methods for disposing and supporting a solar panel array are disclosed. In one embodiment, a system for supporting a solar panel array includes the use of support columns and cables suspended between the support columns, with the solar panels received by solar panel receivers that are adapted to couple to the cables. The solar panel array may then be used to provide power as well as shelter. Cooling, lighting, security, or other devices may be added to the solar panel array. Embodiments of the invention include differing ways to support the solar panels by receivers of differing construction. Special installations of the system can include systems mounted over structure, such as parking lots, roads and aqueducts.

1 Claim, 58 Drawing Sheets

U.S. PATENT DOCUMENTS

| | | | |
|---|---|---|---|
| 4,216,762 A | 8/1980 | Klaila | |
| 4,245,616 A | 1/1981 | Wyland | |
| 4,245,895 A | 1/1981 | Wildenrotter | |
| 4,269,173 A | 5/1981 | Krueger et al. | |
| D260,679 S | 9/1981 | Mayerovitch | |
| 4,380,996 A | 4/1983 | Mengeringhausen | |
| 4,386,600 A | 6/1983 | Eggert, Jr. | |
| 4,415,759 A | 11/1983 | Copeland et al. | |
| 4,429,178 A | 1/1984 | Prideaux et al. | |
| 4,449,347 A | 5/1984 | Rooney | |
| 4,457,035 A | 7/1984 | Habegger et al. | |
| 4,487,989 A | 12/1984 | Wakefield et al. | |
| 4,574,535 A | 3/1986 | Pabsch | |
| 4,587,951 A | 5/1986 | Townsend et al. | |
| 4,602,613 A | 7/1986 | Barr | |
| D285,829 S | 9/1986 | Lock | |
| 4,656,996 A | 4/1987 | Aharon | |
| 4,832,001 A | 5/1989 | Baer | |
| 4,835,918 A | 6/1989 | Dippel | |
| D303,244 S | 9/1989 | Hanak | |
| D311,722 S | 10/1990 | Cheng | |
| 5,058,565 A | 10/1991 | Gee et al. | |
| 5,069,540 A | 12/1991 | Gonder | |
| 5,125,608 A | 6/1992 | McMaster et al. | |
| 5,176,758 A | 1/1993 | Nath et al. | |
| 5,212,916 A | 5/1993 | Dippel et al. | |
| 5,236,378 A | 8/1993 | Newman | |
| 5,347,402 A | 9/1994 | Arbogast | |
| D353,129 S | 12/1994 | Ricaud et al. | |
| 5,478,407 A | 12/1995 | Dorison et al. | |
| 5,524,401 A | 6/1996 | Ishikawa et al. | |
| D380,191 S | 6/1997 | White | |
| 5,769,068 A | 6/1998 | Takahashi | |
| D408,554 S | 4/1999 | Dinwoodie | |
| 5,937,849 A * | 8/1999 | Myles et al. | 126/562 |
| 5,961,099 A | 10/1999 | Thommen, Jr. | |
| D425,013 S | 5/2000 | Lai | |
| 6,091,016 A | 7/2000 | Kester | |
| 6,105,316 A | 8/2000 | Bottger et al. | |
| D442,139 S | 5/2001 | Sasaoka | |
| RE37,498 E | 1/2002 | Thomas | |
| 6,397,869 B1 | 6/2002 | Jennings | |
| 6,443,145 B1 | 9/2002 | Buron et al. | |
| D469,399 S | 1/2003 | Shugar | |
| 6,563,040 B2 | 5/2003 | Hayden et al. | |
| D475,320 S | 6/2003 | Hensley et al. | |
| 6,930,237 B2 | 8/2005 | Mattiuzzo | |
| D511,576 S | 11/2005 | Shingleton et al. | |
| 7,285,719 B2 | 10/2007 | Conger | |
| D560,605 S | 1/2008 | McClintock et al. | |
| D560,606 S | 1/2008 | McClintock et al. | |
| 2005/0109384 A1 | 5/2005 | Shingleton et al. | |
| 2005/0141153 A1 | 6/2005 | Mucci et al. | |
| 2006/0124168 A1 | 6/2006 | Momii et al. | |
| 2008/0047546 A1 | 2/2008 | Cummings | |
| 2008/0057776 A1 | 3/2008 | Cummings | |
| 2008/0061193 A1 | 3/2008 | Conger | |
| 2008/0066801 A1 | 3/2008 | Schwarze | |
| 2008/0135095 A1 | 6/2008 | Cummings et al. | |
| 2008/0168981 A1 | 7/2008 | Cummings et al. | |
| 2009/0184223 A1 | 7/2009 | Schwarze et al. | |
| 2009/0200808 A1 | 8/2009 | Parmley | |
| 2009/0211625 A1 | 8/2009 | Schwarze | |
| 2009/0244890 A1 | 10/2009 | Pelken et al. | |
| 2010/0038507 A1 | 2/2010 | Schwarze et al. | |
| 2010/0051083 A1 | 3/2010 | Boyk | |
| 2010/0095609 A1 | 4/2010 | Kim | |
| 2010/0183443 A1 | 7/2010 | Thorne | |
| 2010/0212654 A1 | 8/2010 | Trevijano | |
| 2010/0251618 A1 | 10/2010 | Nishikawa et al. | |
| 2011/0089698 A1 | 4/2011 | Ahmadi | |
| 2011/0113705 A1 | 5/2011 | Raczkowski | |
| 2011/0197418 A1 | 8/2011 | Overturf et al. | |
| 2011/0221203 A1 | 9/2011 | Miller | |
| 2011/0277809 A1 | 11/2011 | Dalland et al. | |

FOREIGN PATENT DOCUMENTS

| | | |
|---|---|---|
| CA | 2397850 | 2/2004 |
| DE | 3504133 | 8/1986 |
| DE | 3643487 | 6/1988 |
| DE | 4038646 | 6/1992 |
| DE | 10050021 | 4/2001 |
| DE | 10116783 | 10/2002 |
| EP | 0373234 | 6/1990 |
| JP | 10-266499 | 10/1998 |
| JP | 2004-71805 | 9/2005 |
| WO | WO 2005/085633 | 9/2005 |
| WO | WO 2008/141813 | 11/2008 |
| WO | WO 2009/065377 | 5/2009 |

OTHER PUBLICATIONS

U.S. Appl. No. 29/400,363, filed Aug. 26, 2011, Conger.
U.S. Appl. No. 29/394,051, filed Jun. 13, 2011, Conger.
U.S. Appl. No. 29/394,727, filed Jun. 21, 2011, Conger.
Official Action for Australia Patent Application No. 2009246194, dated Aug. 22, 2011 2 pages.
Baumgartner et al. "Solar Wings a New Lightweight PV Tracking System", 23re Eu PVSEC, Valencia, Sep. 4, 2008, invited talk 4DO.9.5.
Solyndra web pages available at http://ww.solyndra.com, printed May 11, 2009, 7 pages.
"Single Axis Sun Power T20 Trackers", date unknown, 5 pages.
U.S. Appl. No. 29/357,531, filed Mar. 12, 2010, Conger.
Solon Hilber—Malaga/Spain, available at http://www.solonhilber.at, translated by Google translate, available at least as early as Sep. 21, 2007, printed Mar. 23, 2010, 7 pages.
U.S. Appl. No. 12/817,063, filed Jun. 16, 2010, Conger.
U.S. Appl. No. 12/122,228, filed May 16, 2008, Conger.
U.S. Appl. No. 29/318,238, filed May 15, 2008, Conger.
U.S. Appl. No. 12/143,624, filed Jun. 20, 2008, Conger.
U.S. Appl. No. 29/319,853, filed Jun. 16, 2008, Conger.
"Coolearth technology" coolearth, available at http://www.coolearthsolar.com/technology, date unknown, p. 1-2.
"Sharp Provides Solar Panels for Winery's "Floatovoltaic" Solar Array", available at http://solarbuss.com/News/NewsNAPR1099.htm, dated May 29, 2008 (accessed Jun. 23, 2008), pp. 1-2.
Foster + Partners "Hearst Headquarters", available at http://www.fosterandpartners.com/Projects/1124/Default.aspx, printerd Aug. 5, 2008, 11 pages.
Examination Report for European Patent Application No. 04759693.7-1528, dated Apr. 27, 2007.
International Search Report for International (PCT) Patent Application No. PCT/US2004/008509, dated Oct. 22, 2004.
Written Opinion for International (PCT) Patent Application No. PCT/US2004/008509, dated Oct. 21, 2004.
International Preliminary Report on Patentability for International (PCT) Patent Application No. PCT/US2004/008509, dated Oct. 14, 2005.
Examiner's First Report for Australian Patent Application No. 2004231646, dated Jul. 23, 2008.
International Search Report for International (PCT) Patent Application No. PCT/US08/71414, dated Sep. 26, 2008.
Written Opinion for International (PCT) Patent Application No. PCT/US08/71414, dated Sep. 26, 2008.
U.S. Appl. No. 12/466,331, filed May 14, 2009, Conger.
International Search Report for International (PCT) Patent Application No. PCT/US09/44060, mailed Jun. 24, 2009.
Written Opinion for International (PCT) Patent Application No. PCT/US09/44060, mailed Jun. 24, 2009.
U.S. Appl. No. 29/345,216, filed Oct. 12, 2009, Conger et al.
U.S. Appl. No. 12/580,170, filed Oct. 15, 2009, Conger et al.
U.S. Appl. No. 12/700,277, filed Feb. 4, 2010, Conger et al.
U.S. Appl. No. 29/376,719, filed Oct. 11, 2010, Conger.
Definition of "column," http://www.thefreedictionary.com/p/column, printed Dec. 14, 2010, 4 pages.

Difference between shear connection and moment connections, http://wiki.answers.com/Q/Difference_between_shear_connection_and_moment_connections, printed Dec. 14, 2010, 1 page.

Definition of "moment connection," http://mbmisteelbuildings.com/metal-building-terms#m, printed Dec. 19, 2010, 1 page.

Definition of "moment," http://www.thefreedictionary.com/p/moment, printed Dec. 19, 2010, 4 pages.

International Preliminary Report on Patentability for International (PCT) Patent Application No. PCT/US2008/071414, mailed Nov. 25, 2010.

International Preliminary Report on Patentability for International (PCT) Patent Application No. PCT/US2009/044060, mailed Nov. 25, 2010.

* cited by examiner

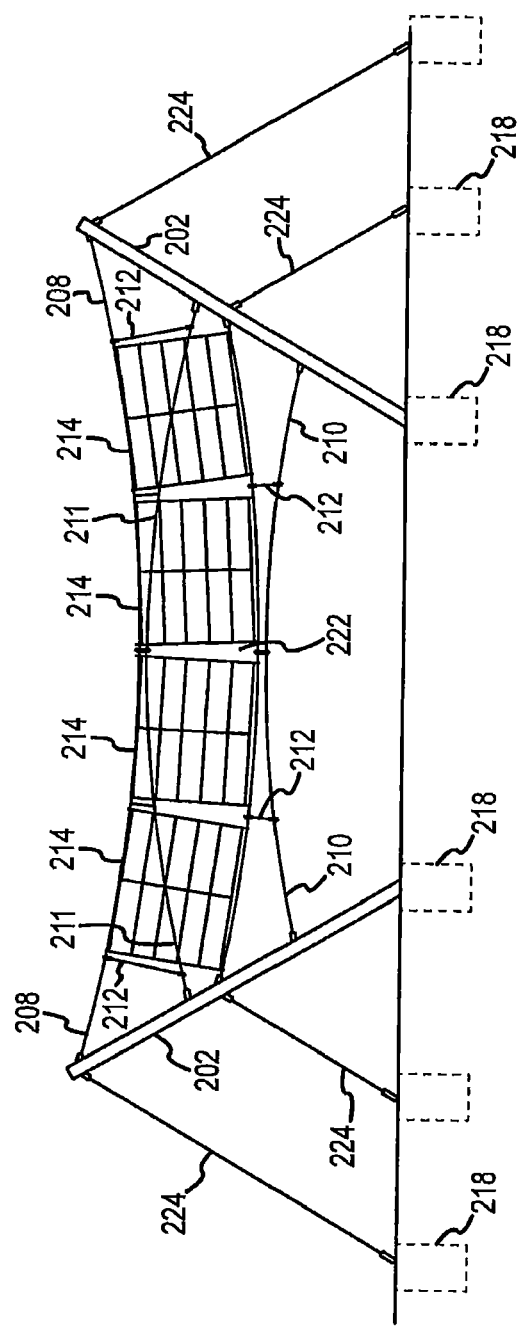
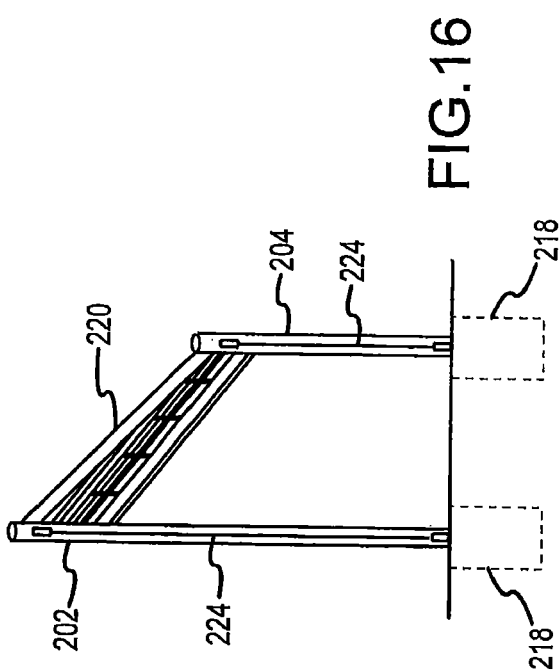
FIG. 15
FIG. 16

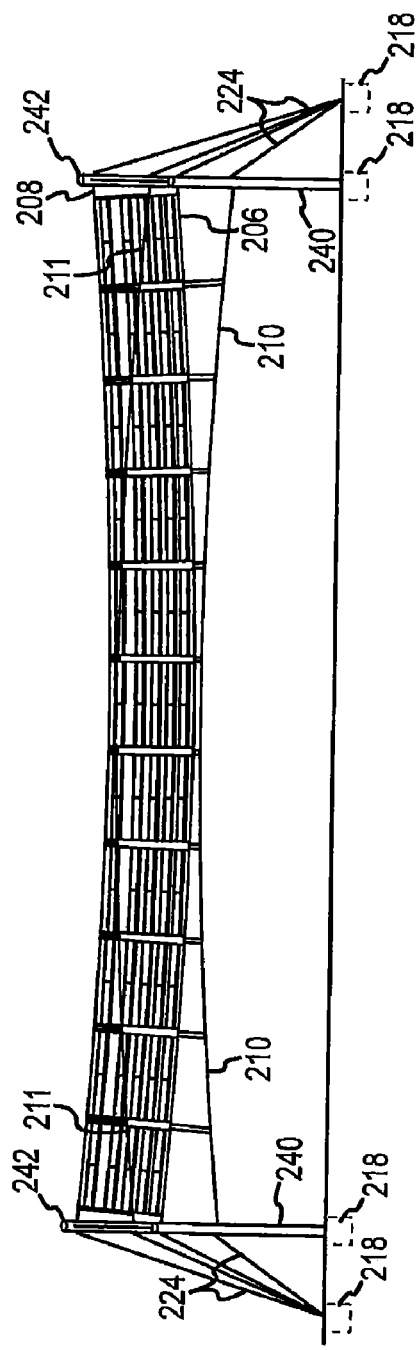
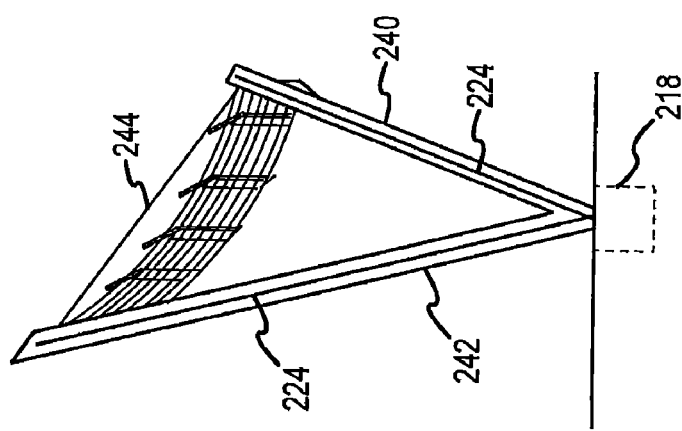

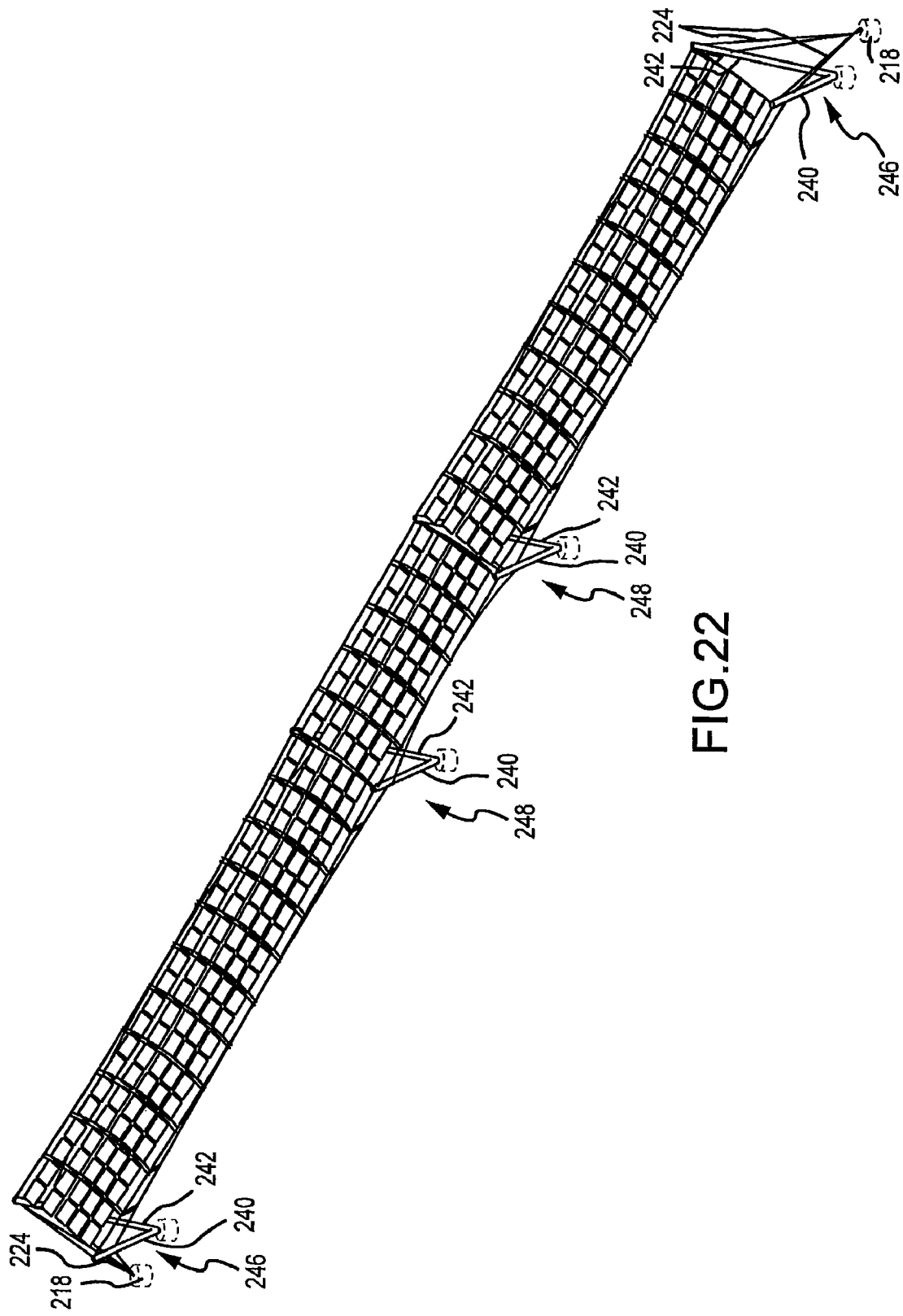

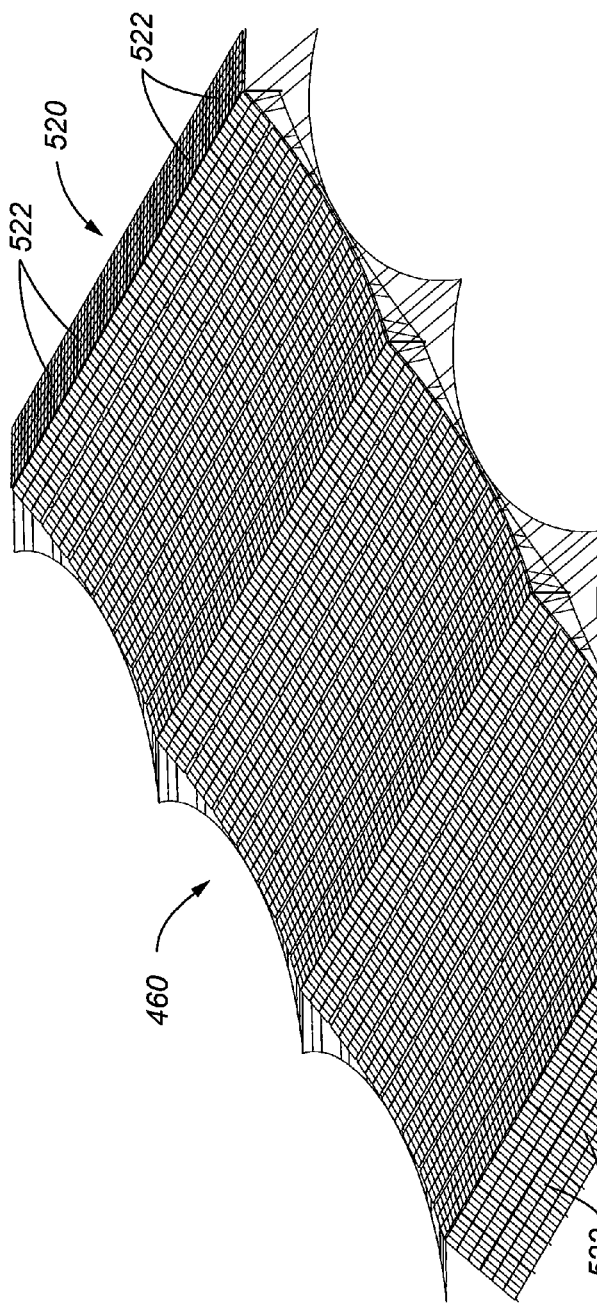
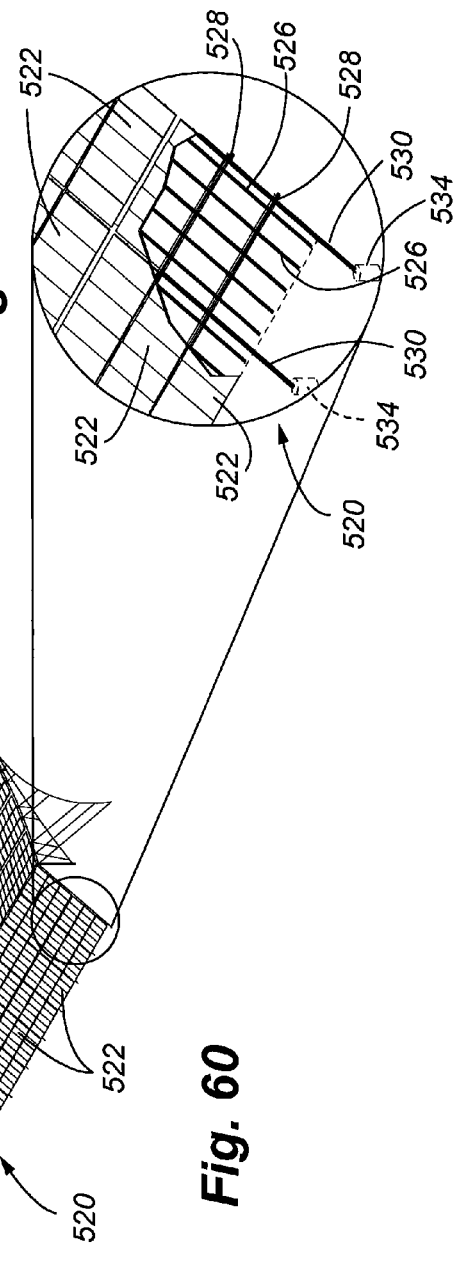
Fig. 60
Fig. 60A

SOLAR ARRAY SUPPORT METHODS AND SYSTEMS

CROSS REFERENCE TO RELATED APPLICATIONS

This application is a continuation-in-part application of U.S. application Ser. No. 12/143,624, filed on Jun. 20, 2008 entitled, "Solar Array Support Methods and Systems", which is a continuation-in-part application of U.S. application Ser. No. 12/122,228, filed on May 16, 2008, entitled "Solar Array Support Methods and Systems", which is a continuation-in-part of U.S. application Ser. No. 11/856,521, filed on Sep. 17, 2007, entitled "Solar Array Support Methods and Systems", which is a continuation application of U.S. application Ser. No. 10/606,204, filed Jun. 25, 2003, now the U.S. Pat. No. 7,285,719, entitled "Solar Array Support Methods and Systems", which claims priority from Provisional Application Ser. No. 60/459,711, filed Apr. 2, 2003, entitled "SOLAR SCULPTURE ENERGY AND UTILITY ARRAY", each prior application being incorporated herein by reference.

FIELD OF THE INVENTION

The present invention is related to the field of solar energy capture, and more particularly, to devices, systems, and methods relating to solar energy capture.

BACKGROUND OF THE INVENTION

Present systems for supporting solar panels tend to be bulky and expensive. Given the size and weight of such systems, implementation of solar panel arrays in remote locations is difficult and expensive. When large equipment is required, installation of a solar panel array in an environmentally sensitive area without significantly impacting the surrounding habitat becomes very difficult. Typically, such support systems do not allow for secondary uses of the solar panel arrays.

SUMMARY OF THE INVENTION

The present invention, in an illustrative embodiment, includes a system for supporting a solar panel array. The system includes two pairs of vertical columns, where each pair includes a tall column and a short column. The pairs of vertical columns are placed some distance apart. A first support cable is secured between the short columns and a second support cable is secured between the tall columns. A guy wire or other anchoring devices may be attached to the columns to provide lateral support to the columns against the tension created by suspending the support cables between the spaced columns. The system further includes a solar panel receiver adapted to be secured to the two support cables. The solar panel receiver may be adapted to receive any type of solar panel or several panels. The receiver may include a maintenance catwalk or other access providing design element.

In another illustrative embodiment, the present invention includes a system for providing both shelter and electricity. The system may again include columns, support cables, and one or more solar panel receivers as in the illustrative solar panel array support system noted above. The system further includes a number of solar panels secured to or received by the solar panel receiver. The columns may be sized to allow an activity to occur beneath the solar panel receivers. For example, if the desired activity is to provide a shaded parking lot, the columns may have a height allowing vehicles to be parked beneath the solar panel receivers, and the columns may be spaced apart to create a sheltered area sized to correspond to the desired area of the parking lot.

In yet another illustrative embodiment, the present invention includes a system for supporting a solar panel array, the system comprising four anchor points, with a first support cable suspended between a first pair of anchor points, and a second support cable suspended between a second pair of anchor points. The system further includes a solar panel receiver adapted to be supported by the first and second support cables, the solar panel receiver also adapted to receive one or more solar panels.

In a further embodiment, the present invention includes methods of supporting a solar panel array. The methods include the step of using cables to support solar panel receivers adapted to receive one or more solar panels. In yet another embodiment, the present invention includes a method of creating a sheltered space that makes use of a solar panel array that creates electricity, where the method also includes using the electricity to cool an area beneath the array. For example, the electricity produced from the array can be used to power a water pump that delivers water to a water-misting device secured to the array. A network of water lines and misting-nozzles can be distributed throughout the array to provide cooling under the array which when coupled with the shade, produced by the overhead array, can be used to effectively cool the area under the array.

In further embodiments, various combinations of curved shaped and planar shaped panel receivers are used in solar arrays sized to meet specific installation requirements.

In other embodiments, the present invention includes systems comprising various combinations of support cables, anchor lines, anchors, and support columns.

BRIEF DESCRIPTION OF THE DRAWINGS

FIG. 15 is a rear elevation view of the solar panel array illustrated in FIG. 14;

FIG. 16 is a side view of the solar panel array of FIG. 14;

FIG. 20 is a rear elevation view of the embodiment of FIG. 19;

FIG. 21 is an enlarged side view of the embodiment of FIG. 19;

FIG. 22 illustrates yet another solar panel array embodiment in accordance with the present invention;

FIG. 32A is a greatly enlarged section of FIG. 32 illustrating the intersection of four panel receivers/pods and showing the gaps between each pod and the cable arrangement providing support;

FIG. 60 is a perspective view of yet another embodiment of the present invention incorporating a pair of airfoils at each end of the array;

FIG. 60A is an enlarged fragmentary perspective view of one of the airfoils and specifically illustrating an example pod/receiver construction;

DETAILED DESCRIPTION

The following detailed description should be read with reference to the drawings. The drawings, which are not necessarily to scale, depict illustrative embodiments and are not intended to limit the scope of the invention.

Figure 1:
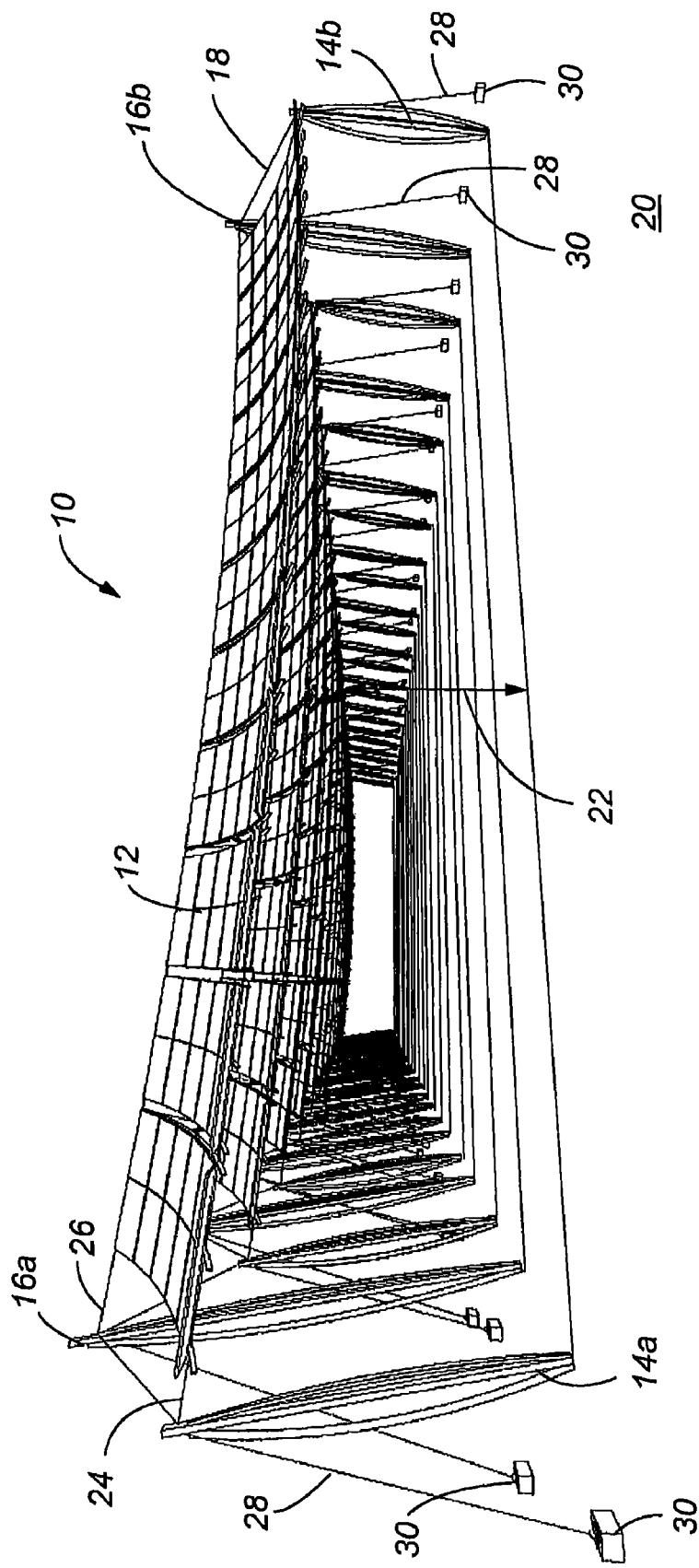
FIG. 1 is a perspective view of a solar panel array supported in accordance to an illustrative embodiment.

FIG. 1 is a perspective view of a solar panel array supported in accordance with an illustrative embodiment. A solar panel array 10 is illustrated as including a number of solar panel receivers 12. Pairs of short columns 14a, 14b and tall columns 16a, 16b are aligned with one another. The pairs of columns 14a, 16a and 14b, 16b may also be connected by a stability cable 18 that runs along the edges of the array 10. The solar panel receivers 12 are held above a surface 20 at a height 22 defined by the columns 14a, 14b, 16a, 16b. A first cable 24 is suspended between the short columns 14a, 14b, and a second cable 26 is suspended between the tall columns 16a, 16b. The solar panel receivers 12 are designed to be supported by the cables 24, 26, so that the overall design is a lightweight, flexible and strong solar panel array 10 that leaves plenty of usable, sheltered space below. Anchor lines 28 and anchors 30 may be used to provide further support and to enable the use of lightweight columns 14a, 14b, 16a, 16b. Anchor lines 28 may be cables or steel rods.

The surface 20 may be, for example, a generally flat area of ground, a picnic area in a park, a parking lot, or a playground. The height 22 may be chosen to allow for a desired activity to occur beneath the array 10. For example, if a parking lot is beneath the array 10, the height 22 may be sufficient to allow typical cars and light trucks to be parked underneath the array 10, or the height may be higher to allow commercial trucks to be parked beneath the array 10. If a playground is beneath the array 10, the array 10 may have a height 22 chosen to allow installation of desired playground equipment.

Any suitable material and/or structure may be used for the columns 14a, 14b, 16a, and 16b including, for example, concrete, metal, a simple pole, or a more complicated trussed column. In some embodiments a footing may be placed beneath the base of each of the columns 14a, 14b, 16a, and 16b to provide stability on relatively soft ground. The cables 18, 24, and 26 and anchor lines 28 may be made of any material and design include, for example, metals, composites, and/or polymeric fibers. In one embodiment the primary material used in the columns 14a, 14b, 16a, and 16b, the cables 24 and 26 and the anchor lines 28 are steel. Because the primary support technology for the array 10 are cables 24 and 26 under tension, the design is both visually and literally lightweight.

While FIG. 1 illustrates an embodiment wherein the columns 14a, 14b, 16a, and 16b are either "short" or "tall", in other embodiments all the columns may be the same height. No particular angle of elevation is required by the present invention; however, it is contemplated that, depending upon the latitude, time of year, and perhaps other factors, certain angles may be more effective in capturing incident sunlight.

Figure 2:
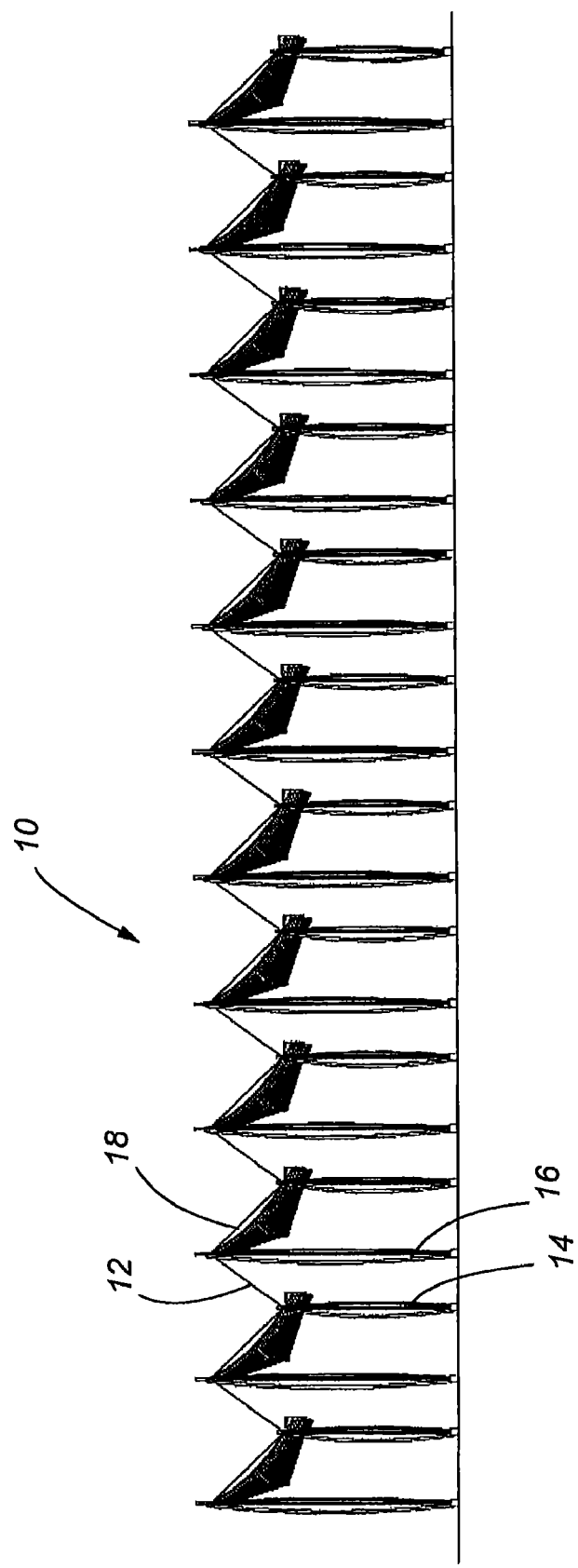
FIG. 2 is a longitudinal section view of a solar panel array supported in accordance to an illustrative embodiment.

FIG. 2 is a longitudinal section view of a solar panel array supported in accordance with an illustrative embodiment. The array 10 illustrates the relative spacing of the rows of the array 10, and helps show how the stability cable 18 connects the columns 14 and 16 of the array 10. The stability cable 18 may be coupled to an anchor member as well, though this is not shown in FIG. 2. It can be seen that the relative heights of the columns 14 and 16 help to define the angle the solar panel receivers 12 have with respect to the incident sunlight. In some embodiments, the columns 14 and 16 or the solar panel receivers 12 may include a mechanism allowing for adjustment of the angle of the solar panel receivers 12. To do so, for example, the length of the columns 14, 16 may be adjusted, or the solar panel receivers 12 may include a mechanism for changing the angle of individual panels or entire receivers 12. For example, as the season changes, the height of the sun in the sky may vary sufficiently to affect the efficiency of the solar panel receivers 12, and so it may be desirable to vary the angle of the receivers 12. Also, as the sun moves throughout the day it may be desirable to change the angle of the receivers 12 to improve light reception.

Figure 3:
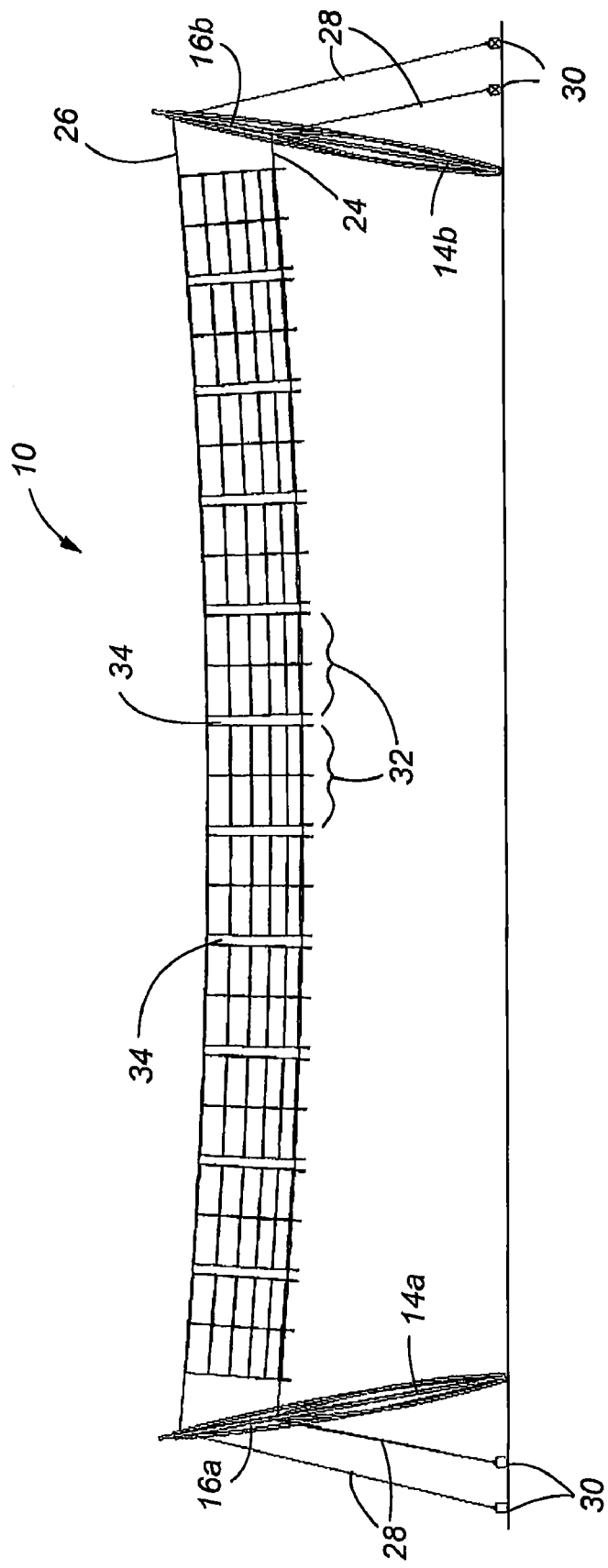
FIG. 3 is a horizontal section view of a solar panel array supported in accordance to an illustrative embodiment.

FIG. 3 is a horizontal section view of a solar panel array supported in accordance with an illustrative embodiment. As illustrated, the array 10 is supported by short columns 14a and 14b, tall columns 16a and 16b, and cables 24 and 26. Anchor lines 28 and anchors 30 are provided to improve stability and allow the use of lightweight columns 14a, 14b, 16a, and 16b. The solar panel receivers 12 are illustrated as pairs of individual units 32 having gaps 34 between each unit 32. The gaps 34 allow for air movement, reducing the amount of wind resistance of the array 10. The gaps 34 also allow for relative movement of the units 32 since the cables 24 and 26 are somewhat flexible.

Figure 4:
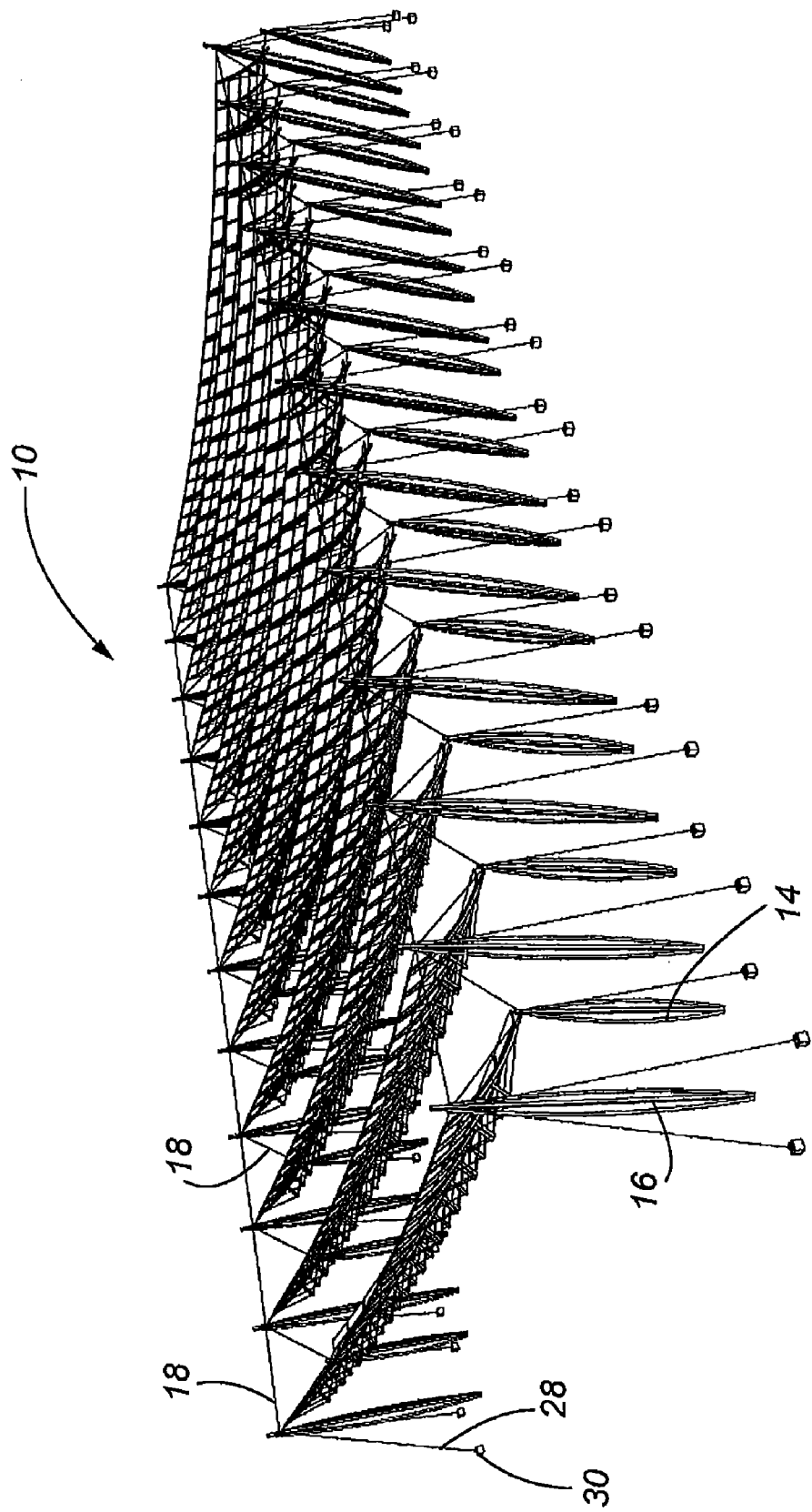
FIG. 4 is a perspective rear view of an illustrative solar panel array.

FIG. 4 is a perspective rear view of an illustrative solar panel array. It can be seen that the stability cables 18 are coupled in various configurations along the length of the array 10, linking the short columns 14 and tall columns 16 to create a linked structure. The array 10 also includes various anchor cables 28 and anchor points 30, including at the end of the array 10 that may help anchor the stability cables 18.

Figure 5:
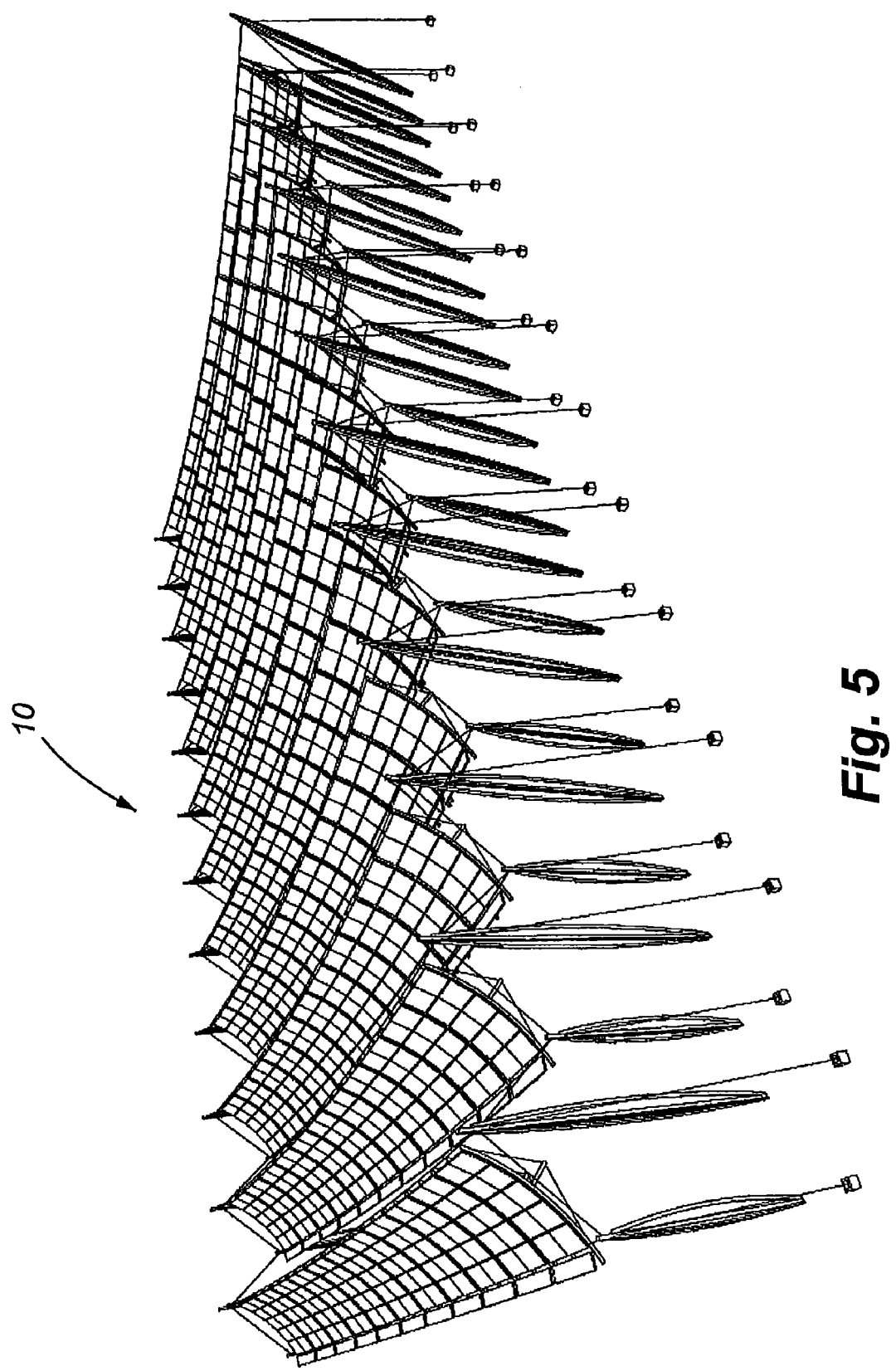
FIG. 5 is a perspective side view of an illustrative solar panel array.

FIG. 5 is a perspective side view of an illustrative solar panel array 10 that is similar to that shown in FIGS. 1-4. It can be appreciated from the several views of FIGS. 1-5 that the illustrative array 10 provides a readily usable shelter that is amenable to a variety of activities.

Figure 6:
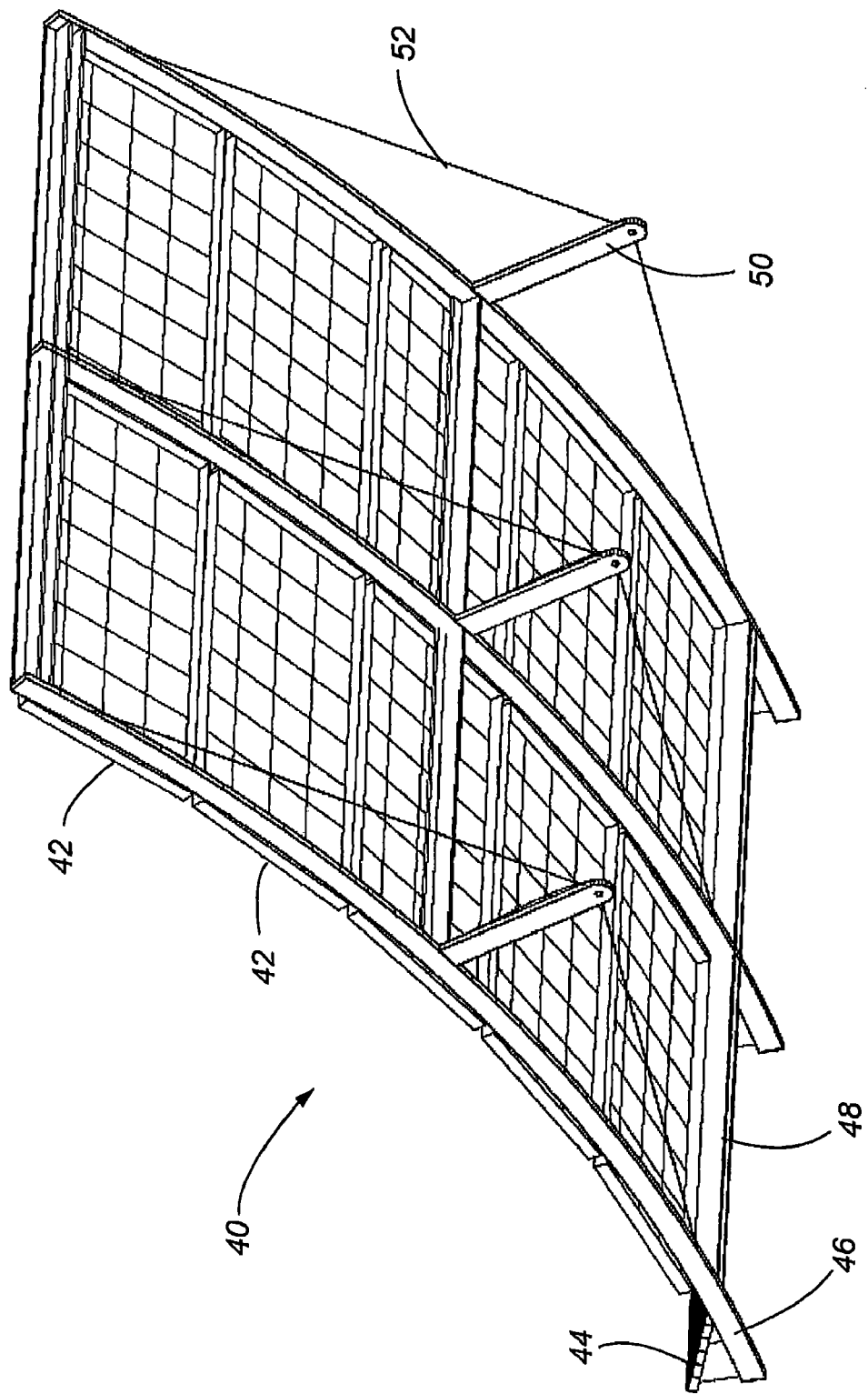
FIG. 6 is a rear perspective view of an illustrative pod showing the use of several struts and cords to create a rigid member.
Figure 7:
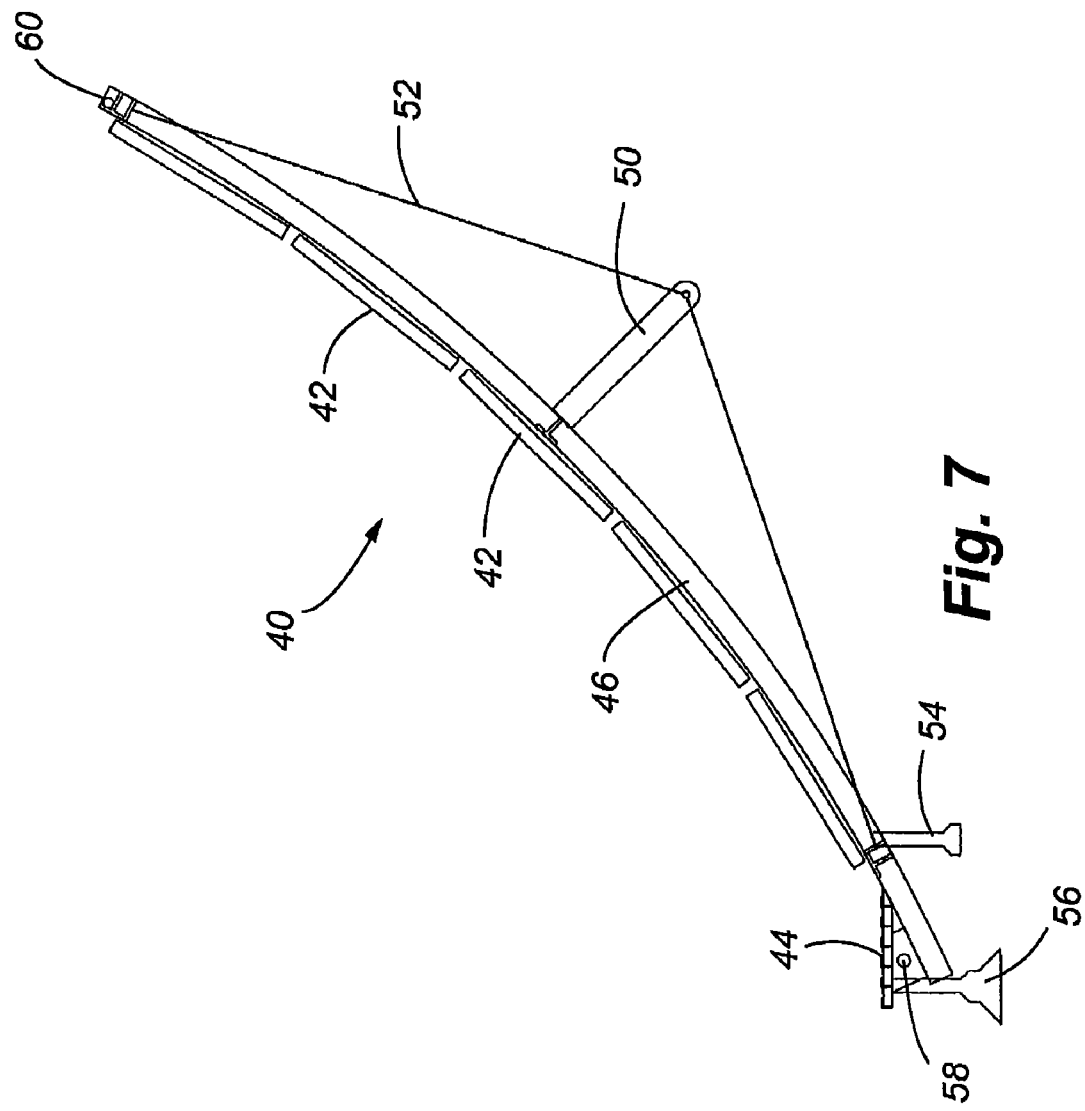
FIG. 7 is a section view of an illustrative pod including several optional features.

FIGS. 6 and 7 illustrate a pod that may be used as a solar panel receiver. The "pods" illustrated herein are intended to provide an example of a solar panel receiver that may be used with the present invention. The solar panel receiver may, of course, have a variety of other structures to perform its function of holding one or more solar panels while being adapted to couple to support cables as illustrated herein.

FIG. 6 is a rear perspective view of an illustrative pod showing the use of several struts and cords to create a rigid member. The pod 40 is shown with several solar panels 42 which may be, for example, photovoltaic panels. A maintenance walkway 44 is included as an optional feature of the pod 40. Several curved struts 46 extend vertically along the back of the pod 40, with several horizontal struts 48 coupled by moment connections to the curved struts 46. By using moment connections, the overall structure becomes a rigid yet lightweight frame for receiving the solar panels 42. A center strut 50 extends out of the back of the pod 40, and is connected to a truss cable 52 which provides another lightweight yet highly supportive aspect of the structure. The center strut 50 and truss cable 52 allow a lightweight curved strut 46 to be used, lending support to the center of the curved strut 46.

In another embodiment, rather than creating electricity with photovoltaic panels, the present invention may also be used to support solar panels that collect solar thermal energy. The solar thermal collectors could be mounted on the solar panel receivers illustrated herein, and thermal energy could be collected by the use of a heat transfer medium pumped through flexible tubing. In one such embodiment, glycol may be used as a mobile heat transfer medium, though any suitable material may be used.

FIG. 7 is a section view of an illustrative pod including several optional features. The pod 40 is shown with solar panels 42 in place. The optional maintenance walkway 44 is again shown on the lower portion of the curved member 46. The center strut 50 and truss cable 52 again provide support to the curved member 46. The pod 40 may include, for example, a mister 54 that can be used to provide evaporative cooling to the sheltered area beneath a solar array using the pod 40. The pod 40 may also include a light 56 or security camera, for example. In one embodiment, a solar array may be used to provide a parking shelter, with the solar array storing electricity during the day using, for example, fuel cells or batteries, and then discharging the stored electricity by lighting the shelter during the evening.

Two cable receivers 58 and 60 are also illustrated. While shown in the form of a simple opening that a cable may pass through, the cable receivers 58 and 60 may take on a number of other forms. For example, the cable receivers 58 and 60 may include a mechanism for releasably locking onto a cable. It can be appreciated from FIGS. 6 and 7 that the illustrative pod 40 is designed so that rain is readily directed off of the solar panels, as the water will run down the curve of the pod 40. In other embodiments, the pod 40 may be more or less flat, rather than having the curvature shown, or may have a different curvature than that shown.

Figure 8:
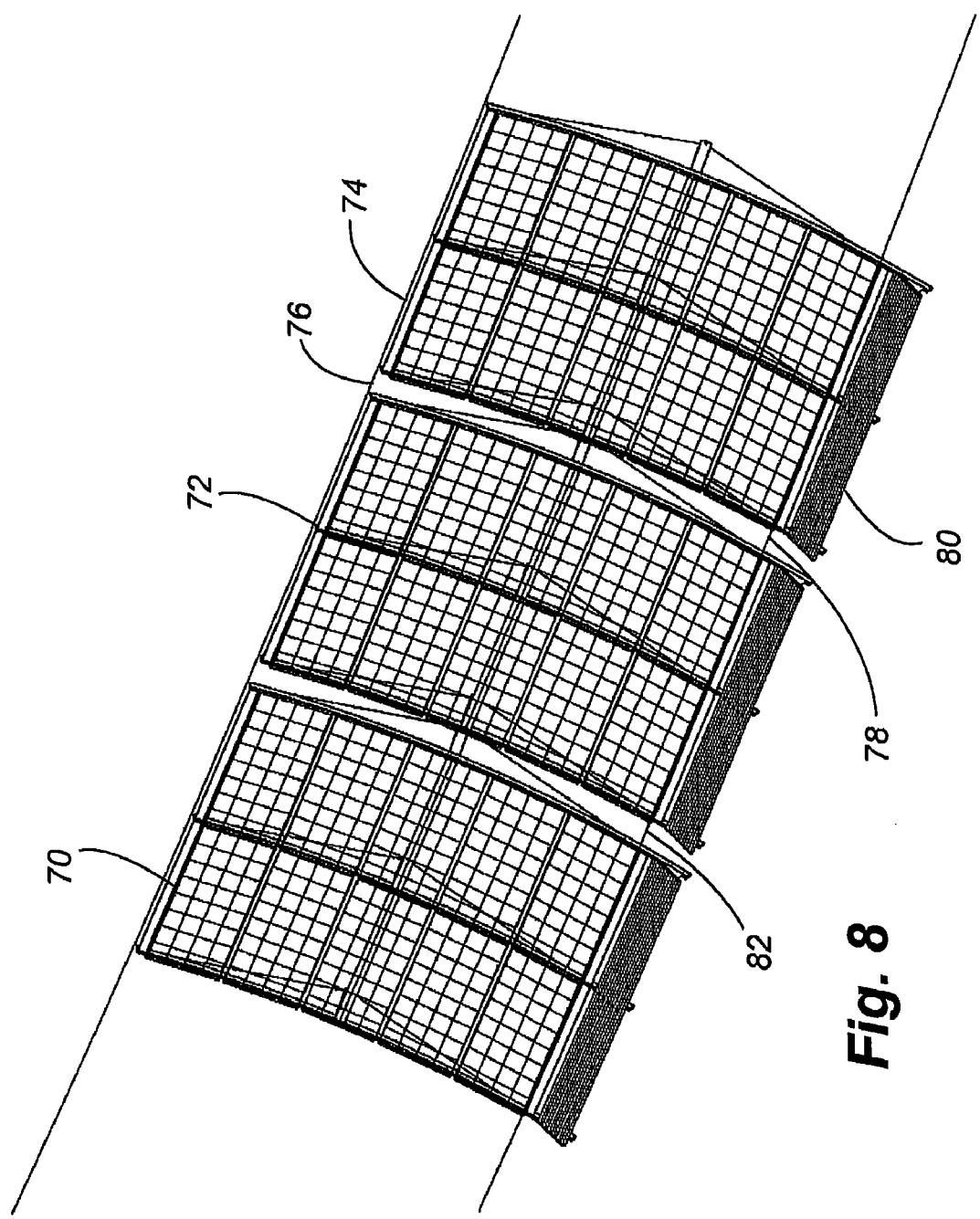
FIG. 8 is a front perspective view of several solar panel receivers linked together.

FIG. 8 is a perspective front view of several solar panel receivers linked together. A first solar panel receiver 70, a second solar panel receiver 72, and a third solar panel receiver 74 are supported by an upper support cable 76 and a lower support cable 78. An optional maintenance walkway 80 is illustrated as well. Also included is a flexible electric cable 82 that allows for transmission of electrical power from each of the solar panel receivers 70, 72 and 74 when solar energy is captured. The flexible electric cable 82 may also serve to distribute power to devices such as security cameras or lighting that may be provided beneath the solar panel receivers 70, 72 and 74.

Figure 9:
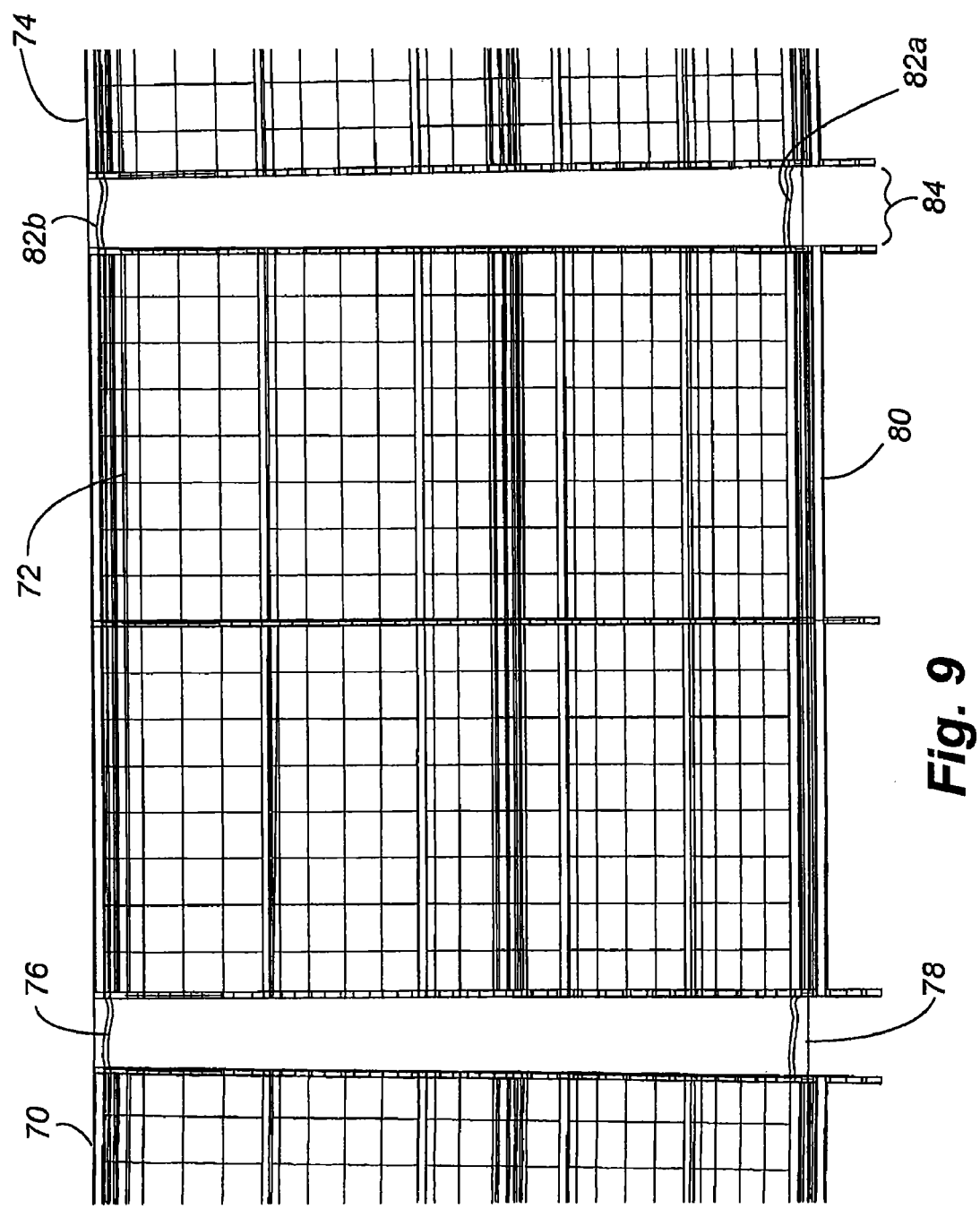
FIG. 9 is a front elevation view of several solar panel receivers linked together.

FIG. 9 is a front elevation view of several solar panel receivers linked together. Again, the solar panel receivers 70, 72 and 74 are shown supported by an upper support cable 76 and a lower support cable 78, and include an optional maintenance walkway 80. Two flexible electric cables 82a and 82b are illustrated in FIG. 9, and may serve the same purposes as that noted above with respect to FIG. 8. It is clearly shown in FIG. 9 that there is a gap 84 between the solar panel receivers 70, 72 and 74. The gap 84 allows the solar panel receivers 70, 72 and 74 to move independently, rendering the overall array less rigid and more likely to withstand high winds. The gap 84 also prevents neighboring solar panel receivers (i.e. 70 and 72 or 72 and 74) from damaging one another in windy conditions.

Depending on the desired output of the array, the flexible electric cables 82a and 82b may be coupled to a substation for gathering produced power and providing an output. For example, the electricity gathered is inherently direct current power; an array as illustrated herein may be easily used to charge batteries or fuel cells. The power may also be used with an electrolyzer to produce hydrogen and oxygen, with the hydrogen available for use as a fuel.

Figure 10:
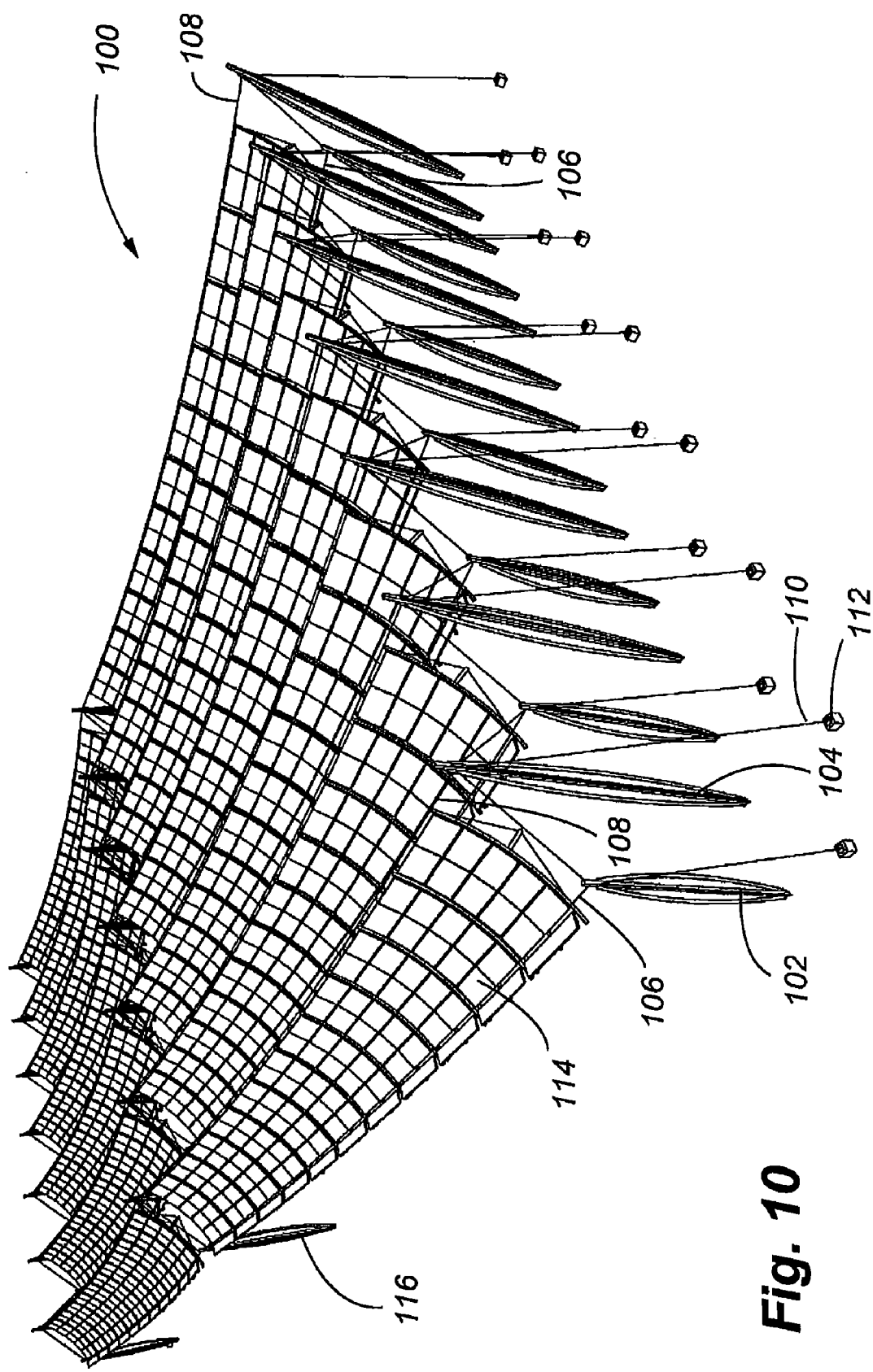
FIG. 10 is a front and side perspective view of an illustrative solar panel array including a center support member.

FIG. 10 is a perspective front and side view of an illustrative solar panel array including a center support member. The illustrative array 100 includes a number of alternating short columns 102 and tall columns 104, with support cables 106 and 108 suspended from the columns 102 and 104. Anchor lines 110 and anchors 112 provide additional support, and the array 100 supports a number of solar panel receivers 114. The further addition in FIG. 10 is the inclusion of a center support 116, which allows for a longer span to be covered between the columns 102 and 104, reducing the need to place additional anchors 112. Further, because the center support 116 does not have to provide stability against lateral movement, and only needs to provide vertical support, the center support 116 may be of an even lighter weight construction than the outer columns 102 and 104.

Figure 11:
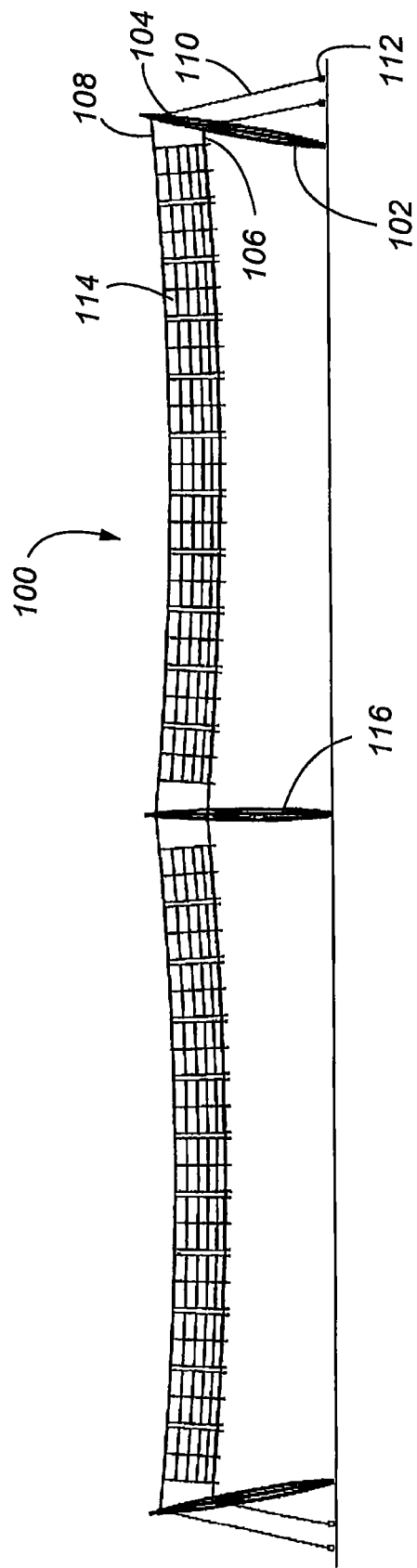
FIG. 11 is a section view showing an illustrative solar panel array including a center support member.

FIG. 11 is a section view showing an illustrative solar panel array including a center support member. Again, the array 100 is supported by the use of a short column 102, a tall column 104, a lower support cable 106 and an upper support cable 108. The array 100 is stabilized in part by the use of anchor lines 110 and anchors 112, and a number of solar panel receivers 114 are supported. The center column 116 provides a central support, but is not required to add to the lateral stability of the array 100, because there are portions of the array pulling equally on both sides of the center column 116.

Figure 12:
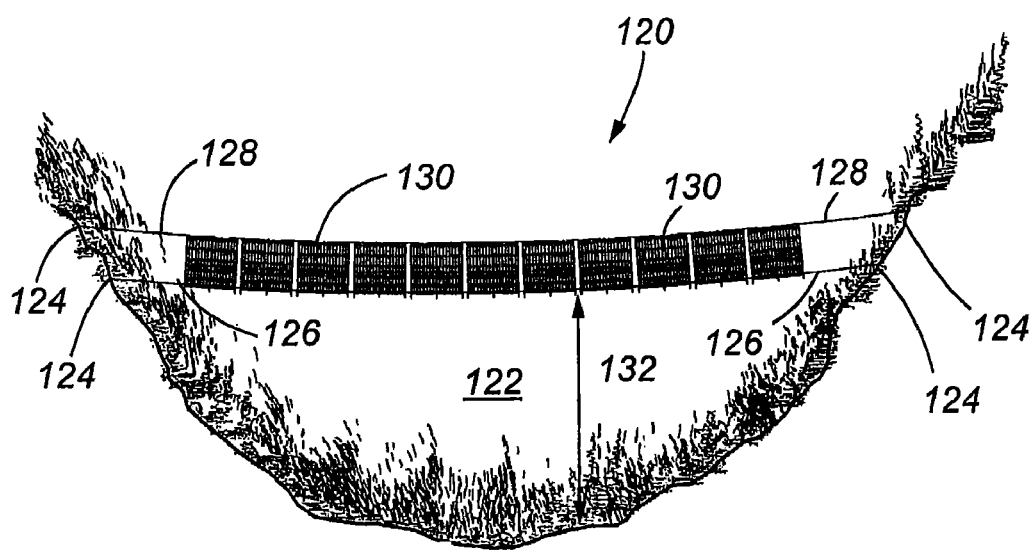
FIG. 12 is a front elevation view of an illustrative solar panel array suspended across a valley.

FIG. 12 is a front elevation view of an illustrative solar panel array suspended across a valley. An array 120 is suspended across a valley 122 by the use of four anchors 124 that enable two support cables 126 and 128 to be suspended across the valley 122. A number of solar panel receivers 130 are supported by the support cables 126 and 128. By suspending the array 120 across the valley 122, a desired height 132 above the valley floor can be achieved by the array. The height 132 may be sufficient to allow wildlife to pass below.

A number of potential environmental benefits from this type of structure can be identified, including that the structure provides a quiet and safe energy production array, the structure provides shade and/or shelter, and the structure can be installed without requiring a large amount of heavy machinery. The use of an array over eroding ground may encourage foliage growth in highly exposed locations and thus slow erosion.

Figure 13:
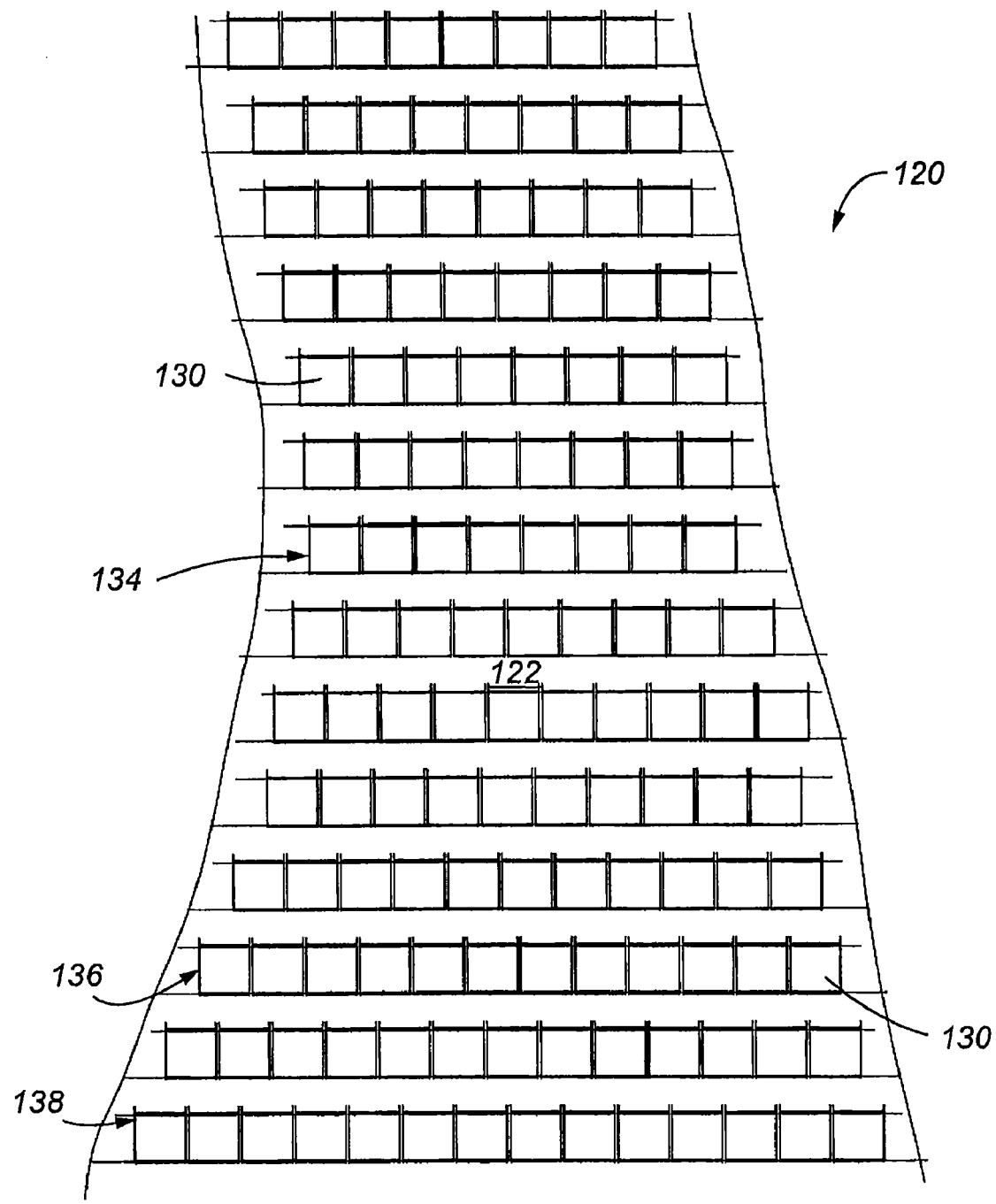
FIG. 13 is an overhead plan view of an illustrative solar panel array suspended across a valley.

FIG. 13 is an overhead plan view of an illustrative solar panel array suspended across a valley. It can be seen that the array 120 is designed to match the shape of the valley 122. In particular, the array 120 includes a number of individual lines of solar panel receivers 130. By varying the number of solar panel receivers 130 suspended by each pair of support cables, a relatively short line 134 can match a relatively narrow place in the valley 122, while longer lines 136 and 138 span a wider portion of the valley 122.

Figure 14:
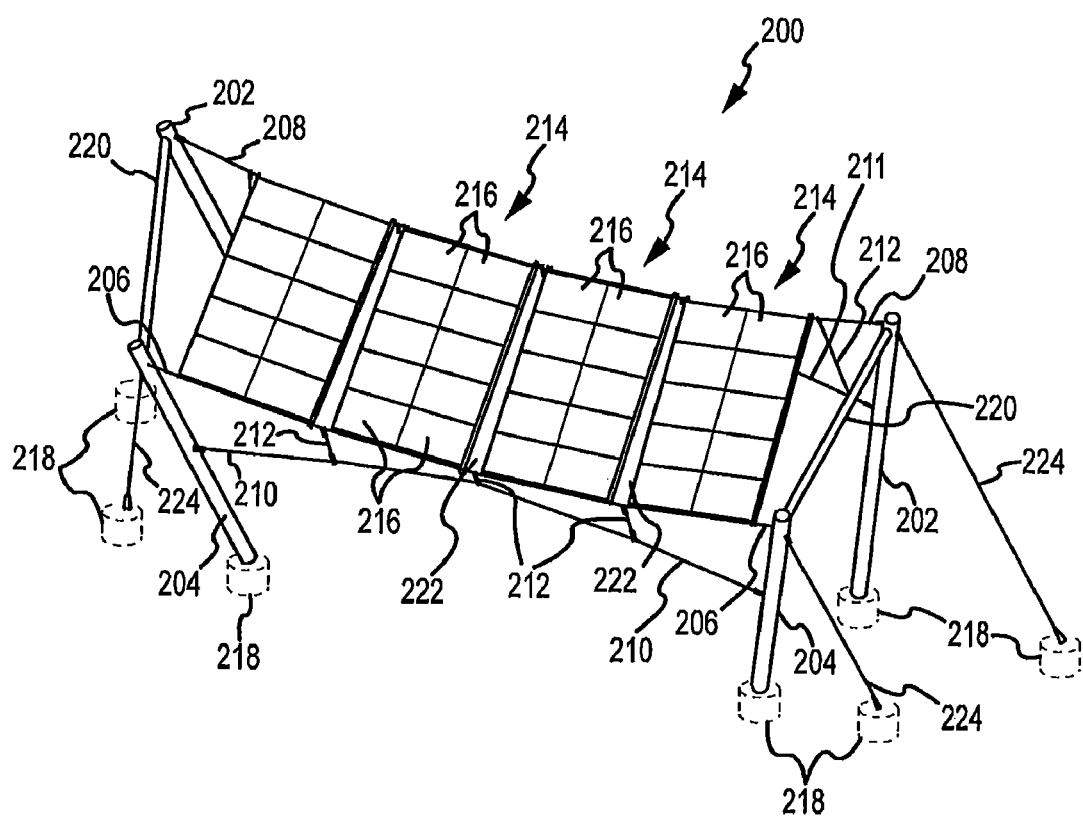
FIG. 14 is a perspective view of a solar panel array in accordance with another embodiment of the present invention.

FIGS. 14-16 illustrate yet another preferred embodiment of the present invention, in the form of a solar panel array 200 comprising a plurality of receivers or pods 214 supported by another arrangement of cables and columns. More specifically, FIGS. 14 and 15 illustrate a plurality of spaced pods 214 each containing a number of solar panels 216, a first cable 206 supporting one end of the pods, and a second cable 208 supporting an opposite end of the pods. First cable 206 is strung between short columns 204, while second cable 208 is strung between tall columns 202. A pair of complementary support cables is also provided to further support the pods 214, namely, a front complementary support cable 210 and a rear complementary support cable 211. Cables 210 and 211 are particularly useful in resisting upward forces generated by wind loads. A number of vertically oriented connecting cables 212 interconnect the complementary support cables 210 and 211 to their corresponding first and second cables 206 and 208. The embodiment of FIGS. 14-16 also includes cross-supports 220 that extend between the columns 202 and 204. Members 202, 204, and 220 may be metallic and made of material such as steel or aluminum; and these members may be configured as I-beams, channels, tubular members, and others. The gaps 222 provided between the pods 214 allow wind to pass between the pods and therefore prevent damage to the system during high wind conditions. Anchor lines 224 extend from each of the columns to respective anchors 218. It shall be understood that additional anchor lines 224 can be added to provide the necessary support to the columns. FIG. 15 is a rear elevation of the embodiment of FIG. 14, better illustrating the complementary support cables 210 and 211.

The side view of FIG. 16 also illustrates that the anchor lines 224 may be placed in-line with the columns to minimize the side profile of the system. FIGS. 14-16 also show a number of other geometrical features defining the construction and overall appearance of the system. For example, the complementary support cables 210 and 211 are coplanar with their corresponding first/second cables 206 and 208. The panel receivers or pods 214 have a first end residing at a first height, and a second end residing at a second lower height. The panel receivers or pods 214 are substantially rectangular shaped and evenly spaced from one another along the first and second cables 206 and 208. The first cable 206 defines a first curvature, the second cable 208 defines a second curvature extending substantially parallel to the first curvature. The complementary support cables 210 and 211 have a generally opposite curvature as compared to the first and second cables 206 and 208, and the complementary support cables 210 and 211 also extend substantially parallel to one another. The gaps 222 between each panel 216 may be substantially triangular shaped such that the portions of the gaps located adjacent to the second cable 208 are smaller than the portions of the gaps located adjacent to the first cable 206. As also shown in FIGS. 15 and 16, the columns 202 and 204 extend at an angle from the mounting surface such that the upper ends of the columns 202 and 204 are further apart from one another as compared to the lower ends of the columns 202 and 204. Angling the columns towards the outside of the structure in this manner increases the structure's efficiency to resist horizontal forces such as wind or seismic loads; and thus enables a reduction in the required size of the anchor lines 224 and anchors 218.

Depending upon the location where the solar panel array is to be installed, it may be necessary to adjust the location of the columns in order to take advantage of available ground space and to maximize the area to be covered by the solar panel array. For example, if the solar panel array is used to cover a parking lot, it may be necessary to adjust the location of the columns based upon available space in the parking lot, in order to maximize the overall area covered by the solar panels by the non-vertical columns. Thus, in the embodiment of FIGS. 14-16, non-vertical columns allow the group of pods to extend over a greater overall area as opposed to use of vertical columns anchored at the same column locations. Additionally, there may also be some aesthetic benefits achieved in arranging the columns in various combinations of both vertical and angular extensions from the mounting surface.

Figure 17:
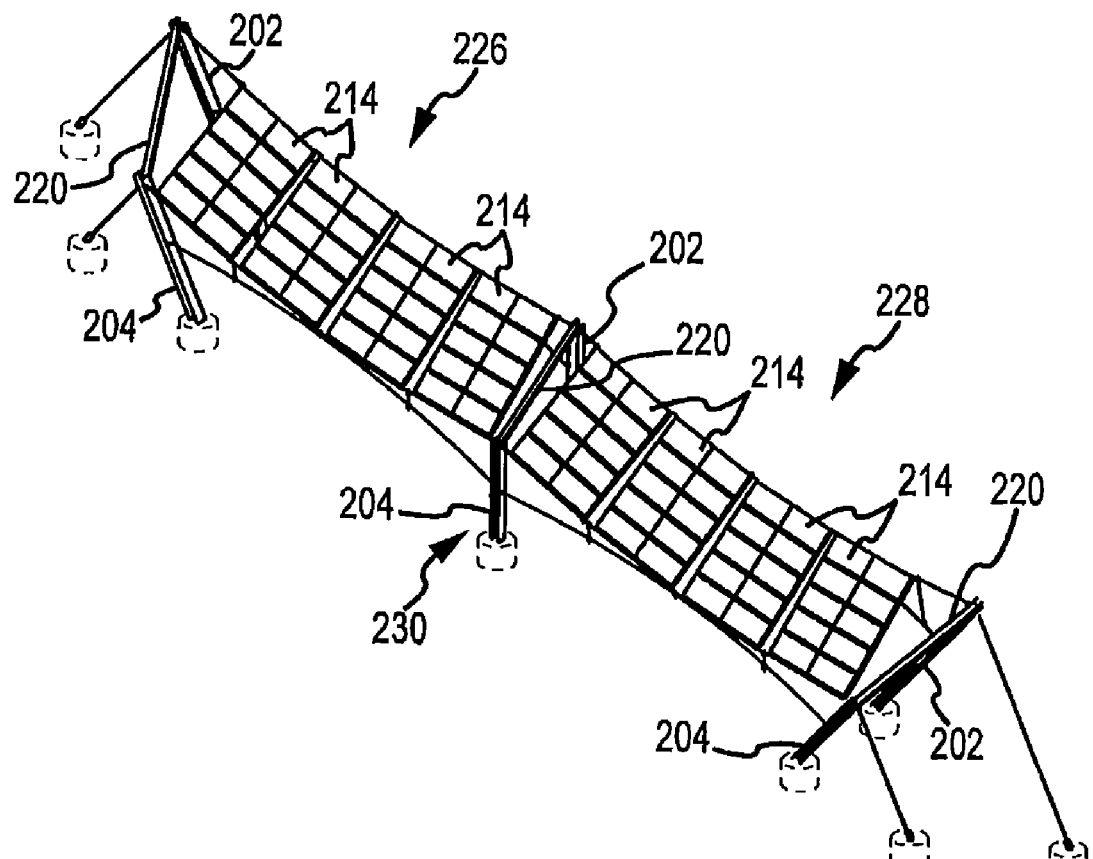
FIG. 17 is a perspective view of a solar panel array in yet another embodiment of the present invention.
Figure 18:
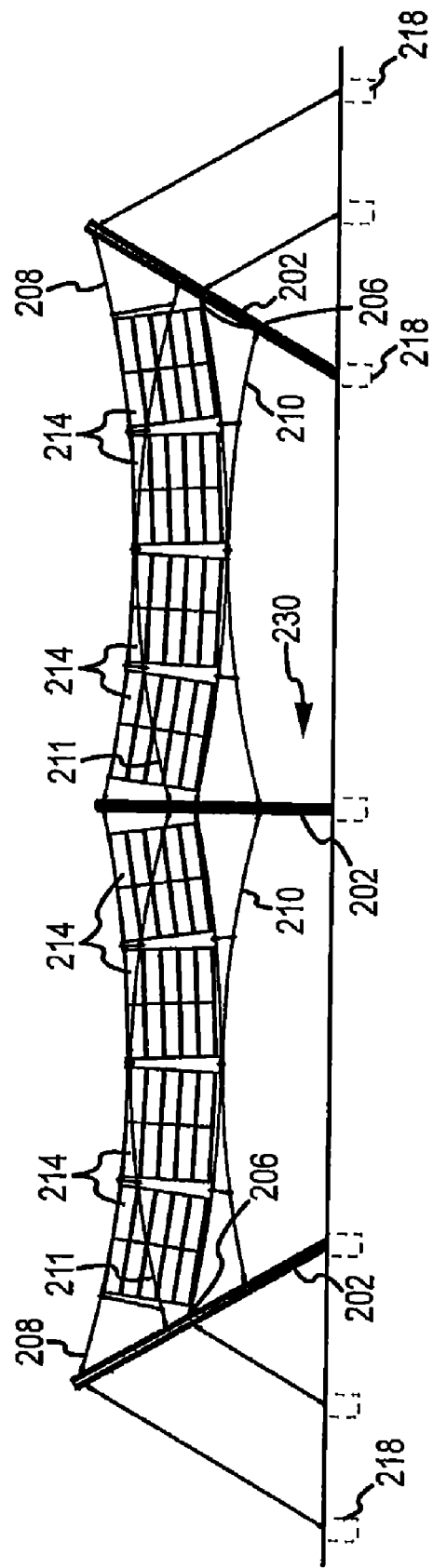
FIG. 18 is a rear elevation view of the embodiment of FIG. 17.

FIG. 17 illustrates yet another embodiment of the present invention. In this embodiment, an intermediate support 230 is provided that extends vertically from the ground, while the outside or exterior columns extend at an angle, like those illustrated in FIG. 15. In this embodiment, the receivers or pods 214 can also be defined as corresponding to a first group 226 and a second group 228. In the first group 226, the pods 214 extend between one of the exterior column pairs and the intermediate support 230, while the second group 228 of pods extends between the opposite exterior column pair and the intermediate support 230. FIG. 18 is a rear elevation view of the embodiment of FIG. 17, further disclosing particular details of this embodiment to include the complementary support cables 210 and 211.

Figure 19:
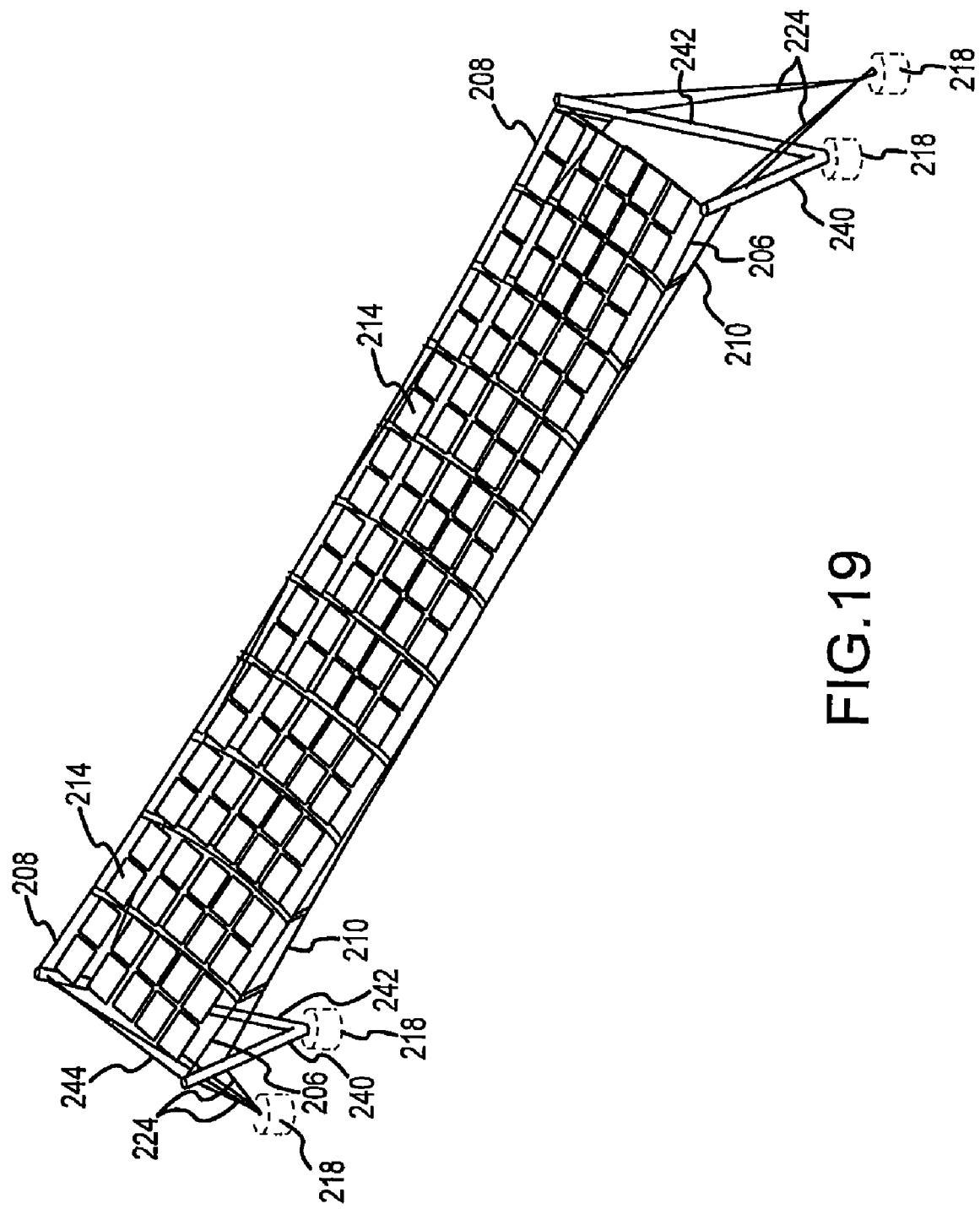
FIG. 19 is a perspective view of yet another solar panel array embodiment in accordance with the present invention.

FIG. 19 illustrates yet another preferred embodiment of the present invention. In this embodiment, in lieu of single columns that are secured to the mounting surface, the columns 240 and 242 are arranged in a V-shaped configuration. The lower ends of the columns 240 and 242 are anchored at the same location while the upper ends of the columns 240 and 242 diverge from one another. As with each of the previous embodiments, the V-configured columns 240 and 242 may be made of tubular members or other types of metallic members. As also shown, the anchor lines 224 for each pair of the V-configured columns may be oriented so that there is a single anchor point 218 from which the anchor lines extend. The V-shaped columns minimize the number of anchors 218 required for the array structure.

Referring to FIG. 20, a rear elevation view is provided of the embodiment of FIG. 19. This Figure also shows the manner in which the various anchor lines 224 for each column pair terminate at a common anchor point 218. FIG. 21 illustrates the manner in which the anchor lines 224 may extend in a V-shaped configuration to match the columns 240 and 242 and thus minimize the side profile of the system. Additionally, in this embodiment a stabilizing cable 244 may be provided that extends between the upper ends of the column pairs.

FIG. 22 illustrates yet another preferred embodiment of the present invention, wherein the V-shaped column supports 240 and 242 are utilized in an extended row of pods 214. More specifically, a pair of outside or end columns 246 are provided along with a pair of intermediate columns 248. Based upon the required length of the solar panel array, the necessary combination of intermediate column supports can be provided for adequate structural support.

Figure 23:
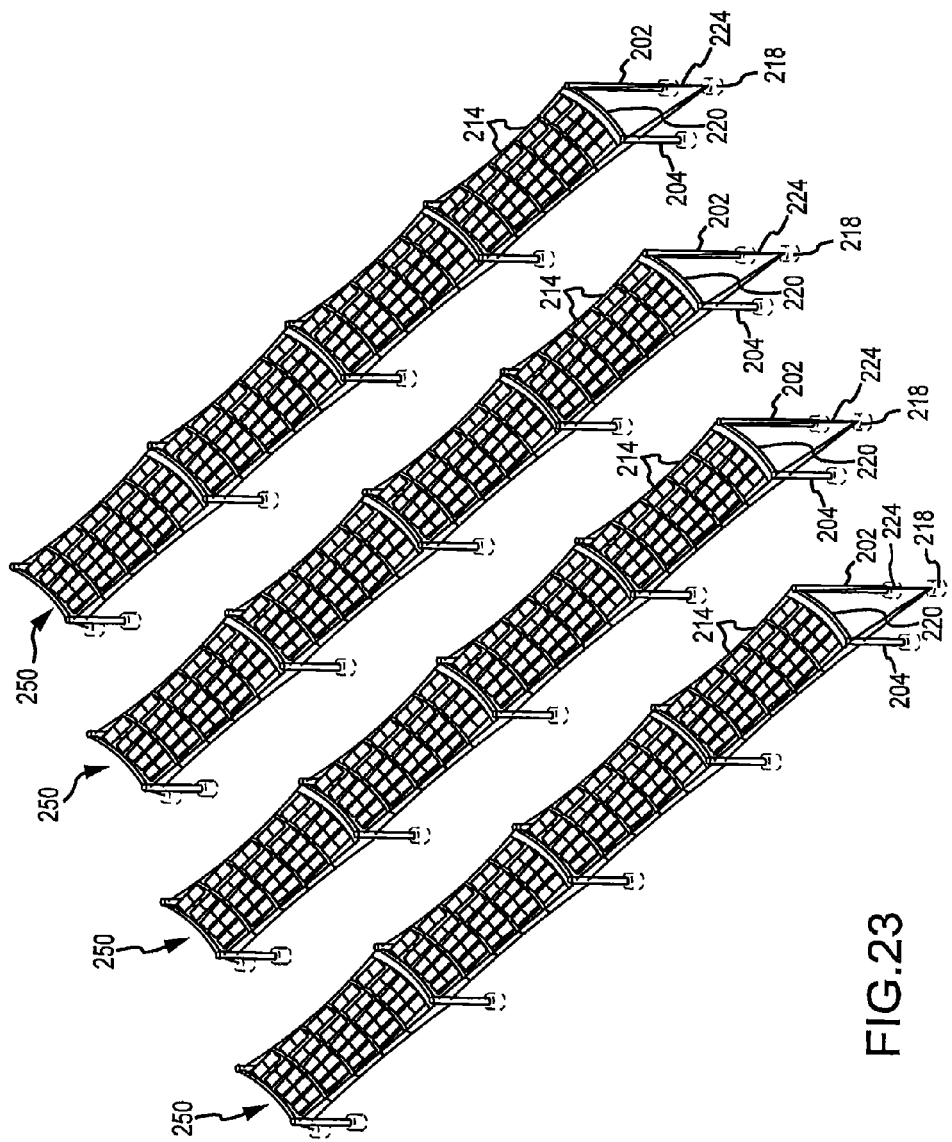
FIG. 23 is a perspective view of a plurality of rows of solar panel arrays.

Referring to FIG. 23, yet another embodiment of the present invention is illustrated comprising a plurality of rows 250 of solar panel arrays and wherein the column supports 202 and 204 extend substantially vertically from the mounting surface. In this embodiment, it is noted that the anchor lines 224 for each column pair extend to a common anchor point 218. The rows 250 may be selectively spaced from one another to provide the optimal area coverage for the solar panel arrays, as well as optimal shade in the event the arrays are used to cover a structure such as a parking lot. Thus, it shall be understood that the rows 250 may be either spaced more closely to one another, or farther apart depending upon the particular purpose of installation.

Figure 24:
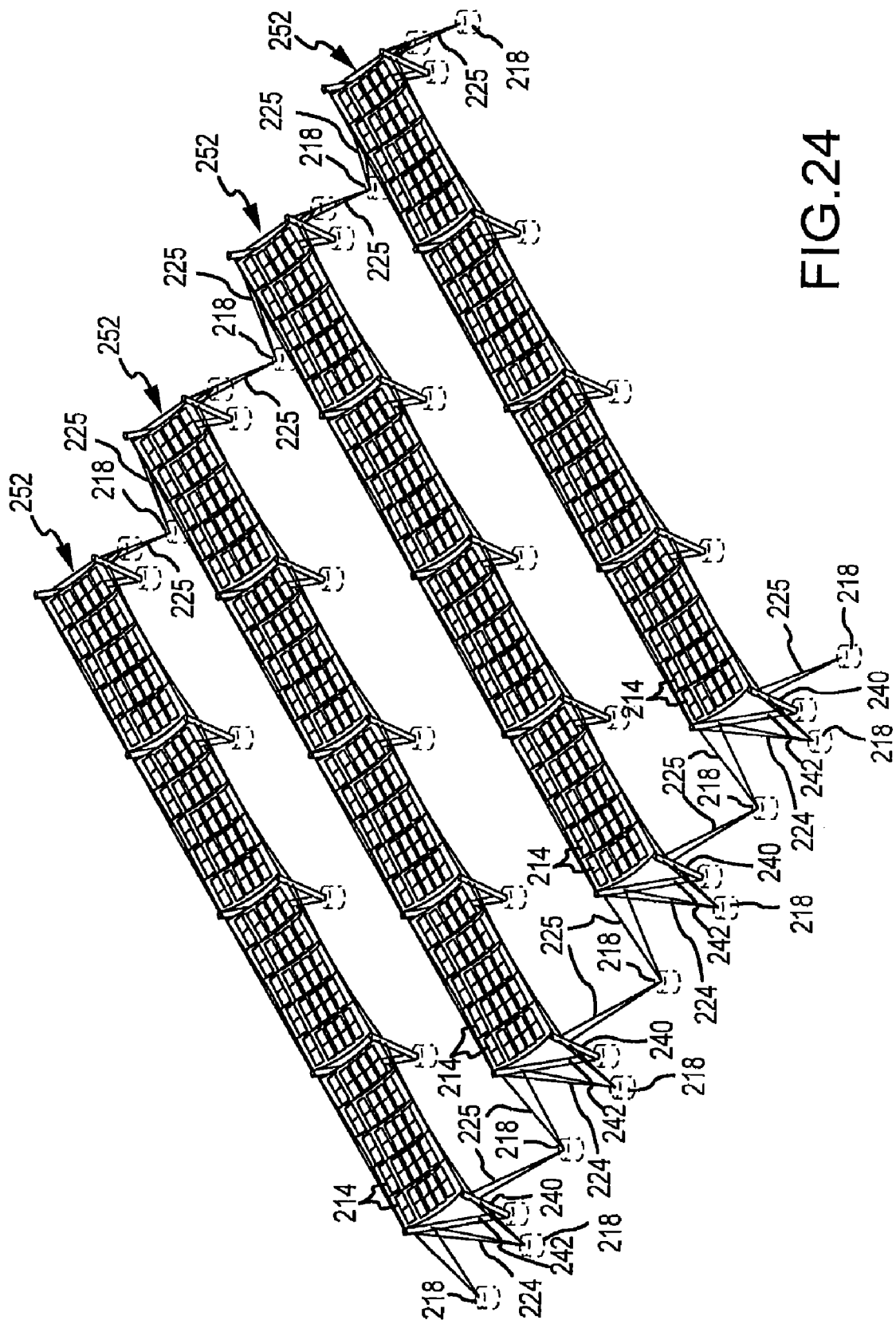
FIG. 24 is another perspective view of a plurality of rows of solar panel arrays.

FIG. 24 illustrates yet another preferred embodiment of the present invention, showing a plurality of rows 252 of solar panel arrays wherein the V-column configuration is used with column supports 240 and 242. As with the embodiment shown in FIG. 23, the rows 252 may be either spaced more closely to one another, or farther apart depending upon the particular purpose of installation. FIG. 24 also illustrates some additional anchor lines 225 that are used to further stabilize the rows 252 of solar panel arrays. These anchor lines 225 are particularly advantageous in handling laterally directed forces, such as wind.

With each of the embodiments of the present invention, it shall be understood that the particular height at which the solar panels are located can be selectively adjusted for the particular purpose of installation.

Figure 25:
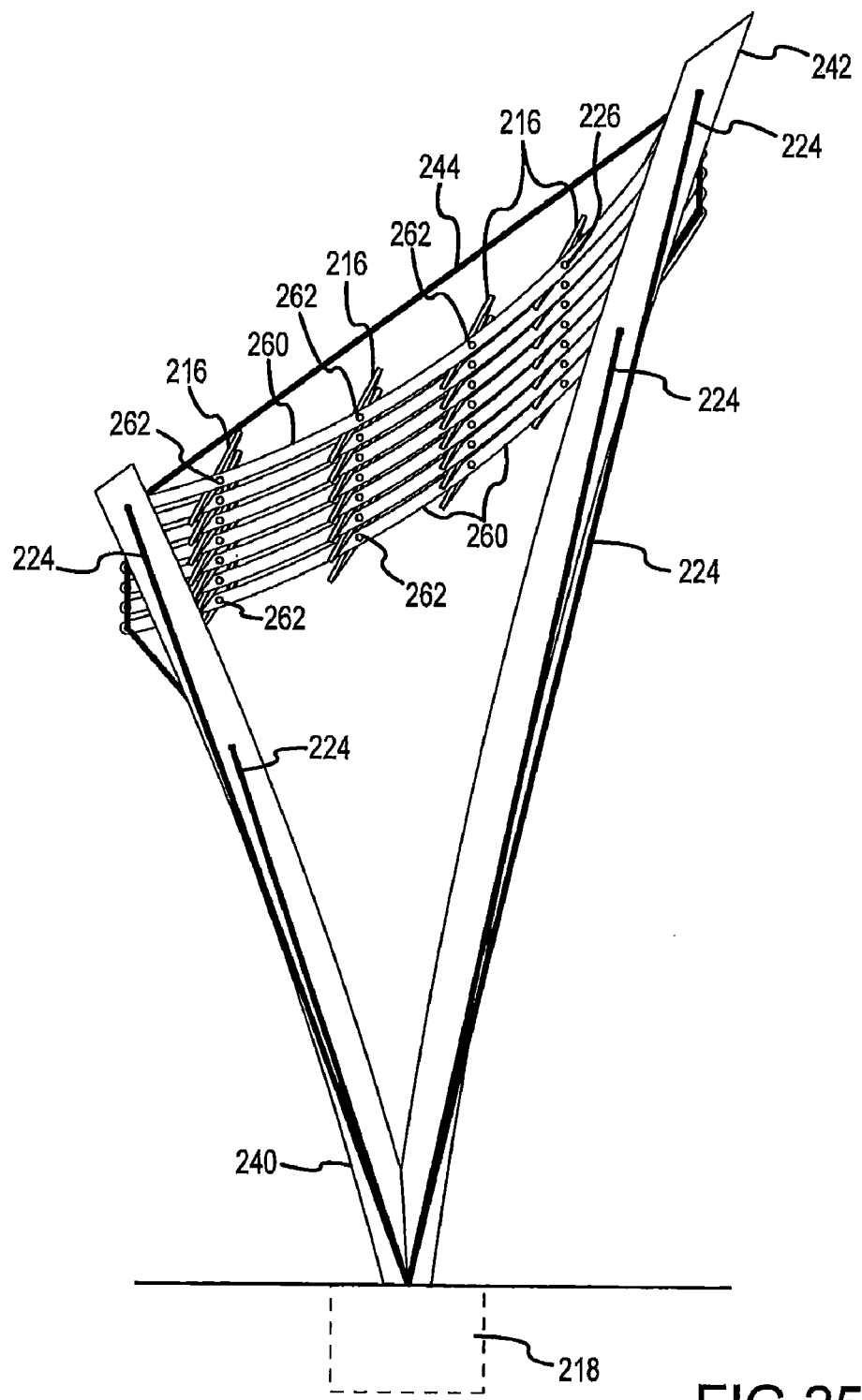
FIG. 25 is a side view of a solar panel array in yet another embodiment of the present invention.

FIG. 25 illustrates yet another preferred embodiment of the present invention, wherein each of the solar panels 216 may be rotatably mounted to their corresponding supporting pod or receiver. As shown, the embodiment of FIG. 25 incorporates curved struts 260 and pivot mounts 262 that enable each of the solar panels 216 to be disposed at a desired angle with respect to the sun. The pivot mounts 262 can take a number of forms. For example, a pivot mount 262 could include a continuous member such as a steel rod or square tubular member that extends horizontally across the corresponding receiver or pod and which is secured to an overlying solar panel 216. The rod is then rotatably mounted within the receiver or pod such that the solar panels 216 can be grasped and rotated to the desired inclination with respect to an optimal sun-capturing orientation. This configuration of mounting the solar panels on a round or square tube provides additional strength and rigidity to the pod structures, and reduces torsional and in-plane forces exerted on the solar panels from wind loads that cause the pods to move in the wind.

Figure 26:
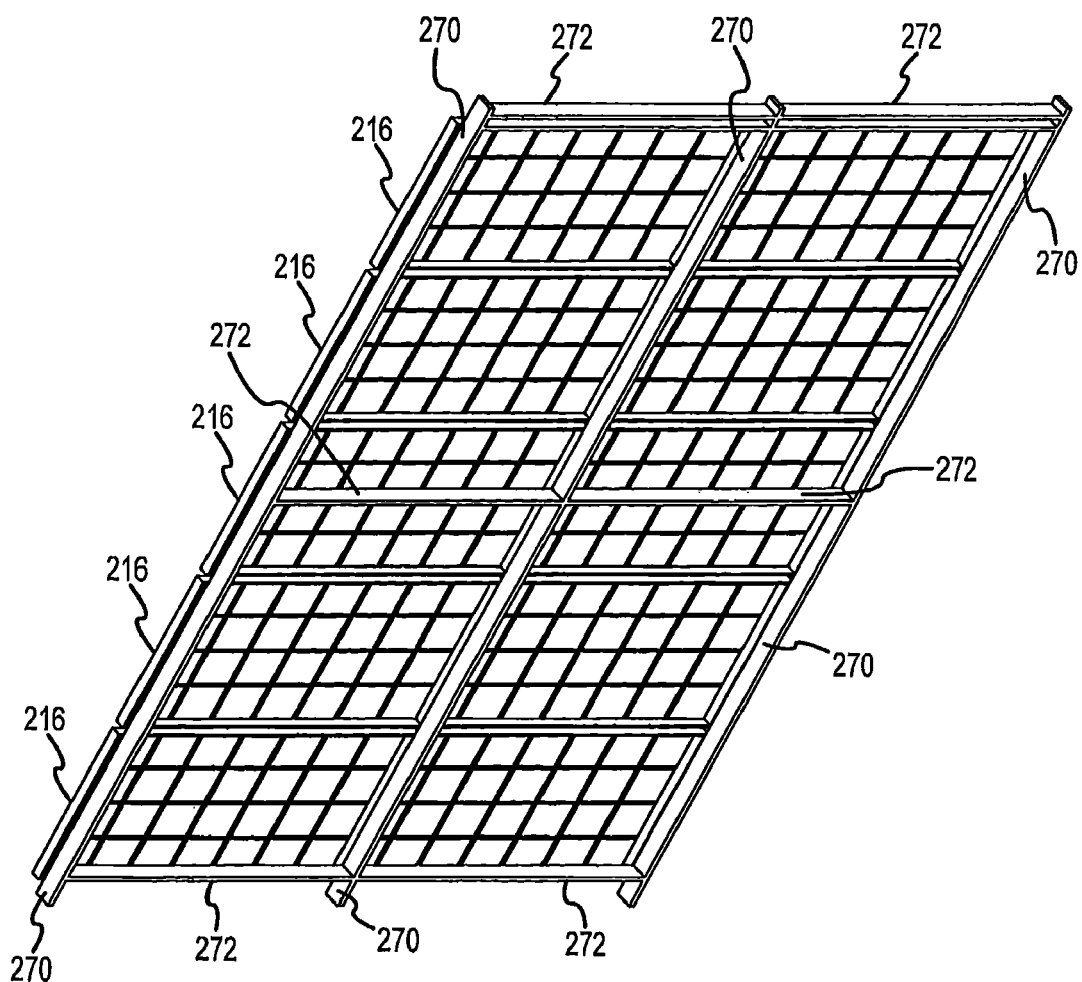
FIG. 26 is an enlarged perspective view of another illustrative pod used to support a plurality of solar panels in the present invention

FIG. 26 illustrates a receiver or pod 214 that may incorporate a group of linear or straight struts. As shown, a plurality of first struts 270, and a plurality of second orthogonally oriented struts 272 are provided to support the solar panels 216 mounted to the pod. The receiver or pod shown in FIG. 26 supports a group of ten solar panels 216 arranged in a 2 by 5 matrix. A width of the pod may be defined as the distance between the most outer or exterior first struts 270, and a height of the pod may be defined as the distance between the most outer or exterior second struts 272. The height of the pod can be increased by extending the length of the first struts 270 but not requiring the cables 206 and 208 to be secured at the opposite ends of the pod which would require the cables 206 and 208 to be spread further apart and therefore widening the overall size of the array. For this extended pod length, the cables 206 remain attached at their normal spacing and the extended ends of the struts 270 simply extend beyond the cables in a cantilevered arrangement. In this alternate pod construction, additional solar panels can be added to increase the power producing capability of the array without adjusting other design parameters. The spacing of the pods when mounted to the cables depends on a number of factors to such as the weight of the pods and panels, wind conditions, snow loading conditions and others. In one aspect of the invention, spacing the pods with gaps between the pods that does not exceed the widths of the pods is acceptable for some installations.

For the illustrative pod shown in FIG. 26, cable receivers 58 and 60 (such as shown in FIG. 7) may be incorporated thereon to allow the pod attach to the cables 206 and 208. As previously mentioned, while the cable receivers may be simply openings formed in the ends of the pods, the cable receivers may take another form such as a mechanism which selectively locks the pod onto the cable and therefore allows a pod to be removed for maintenance or replacement. Accordingly, it shall be understood that the pods can be removed from the cables as necessary to either generate another different combination of pod arrangements or to selectively replace/repair defective solar panels.

Figure 27:
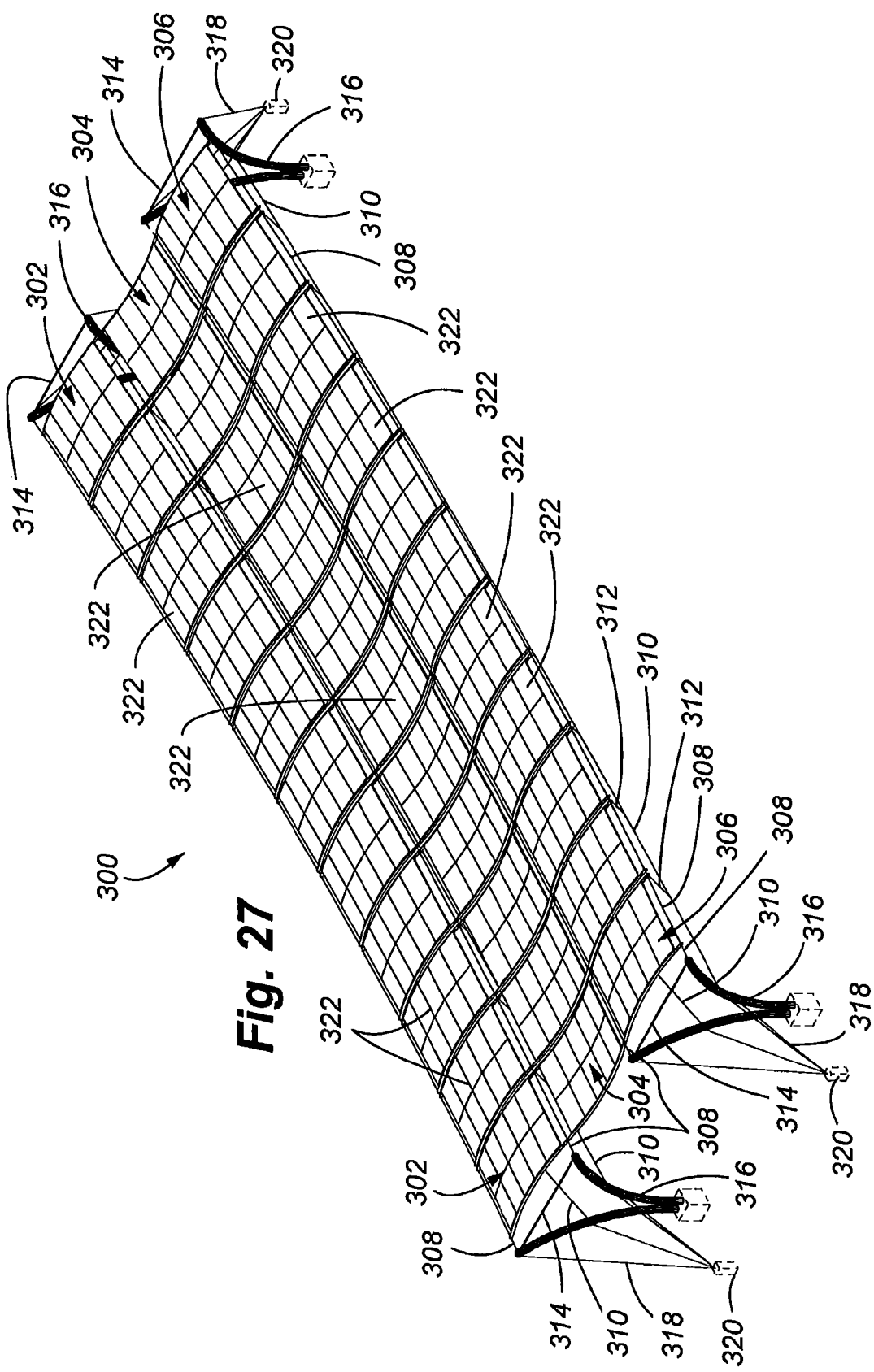
FIG. 27 is a perspective view of another embodiment of the present invention showing three rows of panel receivers/pods with both convex and concave curvatures when viewed from above.
Figure 28:
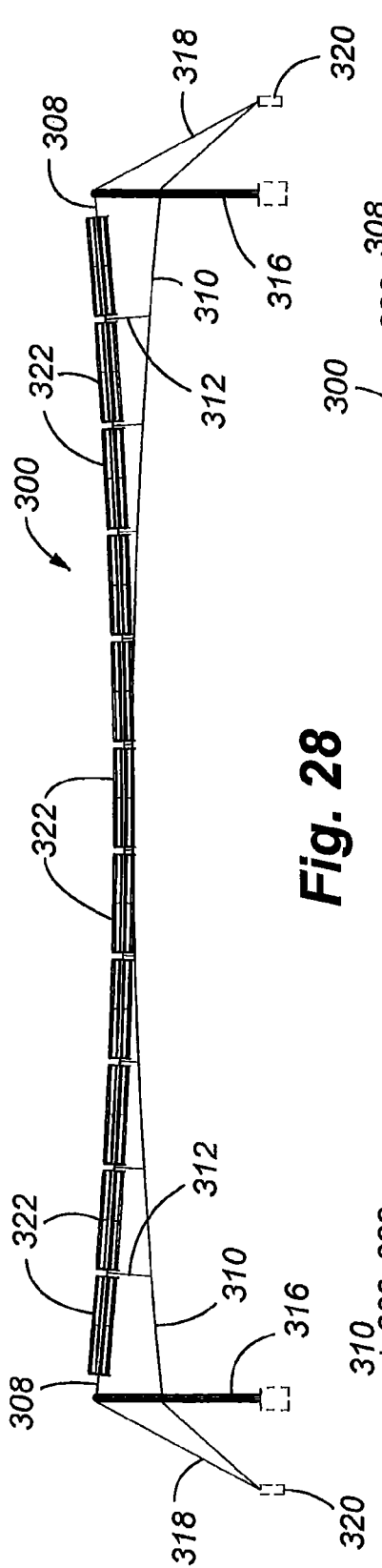
FIG. 28 is an elevation view of the embodiment of FIG. 27.

FIG. 27 illustrates another embodiment of the present invention shown as solar array 300 comprising three rows, or linear extending groups of panel receivers/pods, 302, 304, and 306. Exterior rows 302 and 306 are of the same construction, and are supported at their ends by corresponding columns 316. Thus, the columns 316 are located at the corners of the rectangular shaped solar array. In this embodiment, the columns 316 are v-shaped with their lower ends received in a common anchor/footer, and their upper ends diverging away from one another and being curved as shown. The cables used to support the pods 322 in this embodiment are similar to what is illustrated in the embodiment of FIG. 14; however, in the embodiment of FIG. 27, the pods 322 are oriented so as to extend more parallel with respect to the surface of the ground as explained in more detail below with reference to FIGS. 32 and 33. Row 304 is suspended between rows 302 and 306, and there are no end supporting columns that directly support row 304; rather, row 304 is supported only by the upper cables 308 extending on opposite lateral sides of row 304, and which also support the respective lateral sides of the adjacent rows 302 and 306. As shown in FIG. 28, complementary lower cables 310 are disposed below the upper cables 308, and have an opposite curvature as compared to cable 308. Vertically oriented interconnecting cables 312 connect cables 308 and cables 310. A cross-support cable or bar 314 (shown in FIG. 32) is provided between the upper diverging ends of the column members 316. A plurality of anchor cables 318 interconnects the columns 316 and anchor points 320 as also shown in FIG. 28.

As also shown in FIG. 27, the pods 322 in row 302 and the pods 322 in row 306 have a convex curvature when viewing the array from above, while row 304 has a concave curvature when viewed from above. This compound curvature arrangement of rows 302, 304, and 306 provides a wave-like appearance, and may offer certain benefits such as limiting wind and snow loading conditions, as well as providing greater options in terms of how the array may be oriented to best capture direct sunlight.

Figure 29:
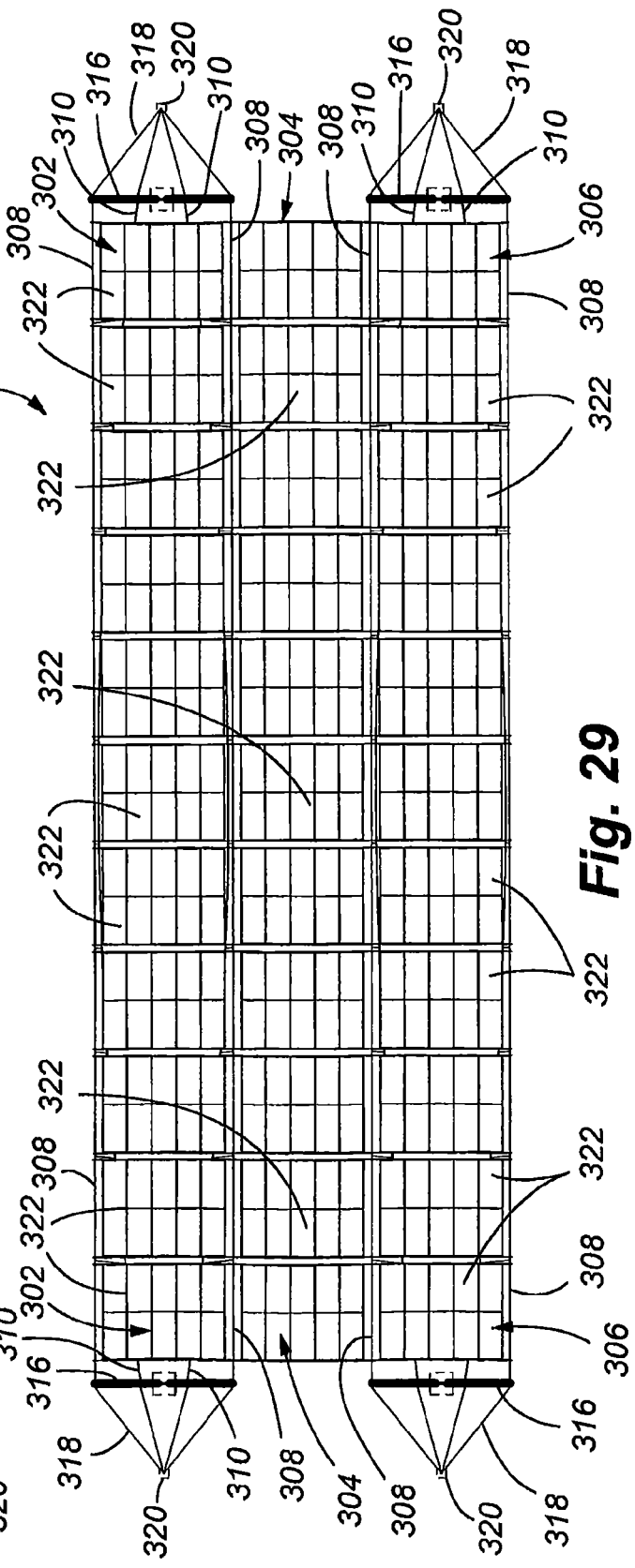
FIG. 29 is an overhead plan view of the embodiment of FIG. 27.

Referring to FIG. 29, it is shown that the rows 302, 304, and 306 extend straight or linearly, and parallel to one another. The embodiment of FIG. 27 provides an array of pods in a 3×11 configuration; however, it shall be understood that the length of the array may be modified to best fit the particular installation needs and therefore the rows of pods may incorporate less or more pods as needed. If the length of the pod is to be increased, then interior columns may be provided between spans as explained below with reference to embodiments such as shown in FIGS. 36-41.

Figure 30:
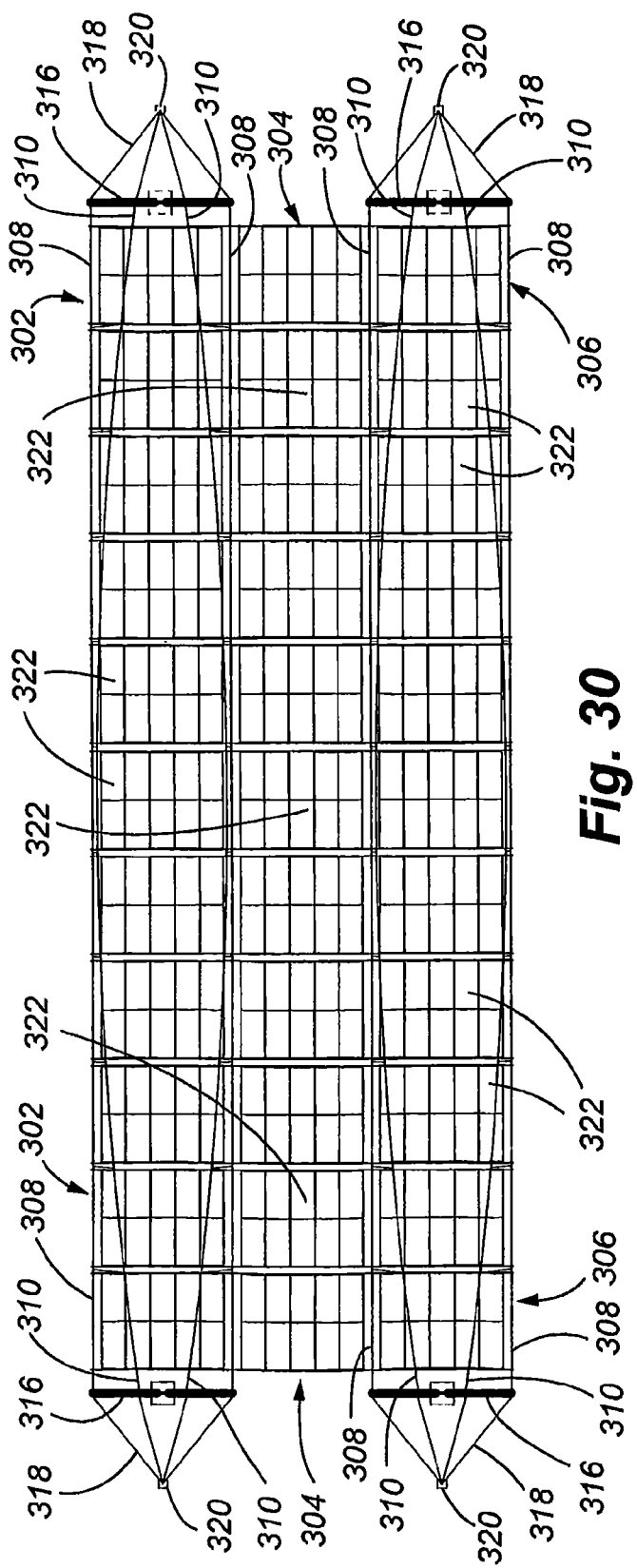
FIG. 30 is a bottom plan view of the embodiment of FIG. 27.
Figure 31:
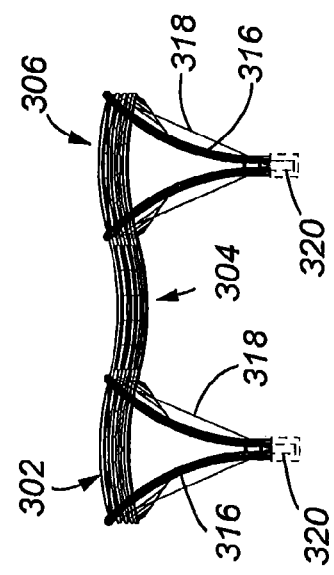
FIG. 31 is a side view of the embodiment of FIG. 27.

The bottom plan view of FIG. 30 further illustrates the particular arrangement of cables to include how complementary lower cables 310 are secured to the respective column members 316, and then extend in an arc or curve along the length of the respective rows. FIG. 31 further illustrates the convex and concave compound curvatures of the array when viewed from a side view of the array.

Figure 32:
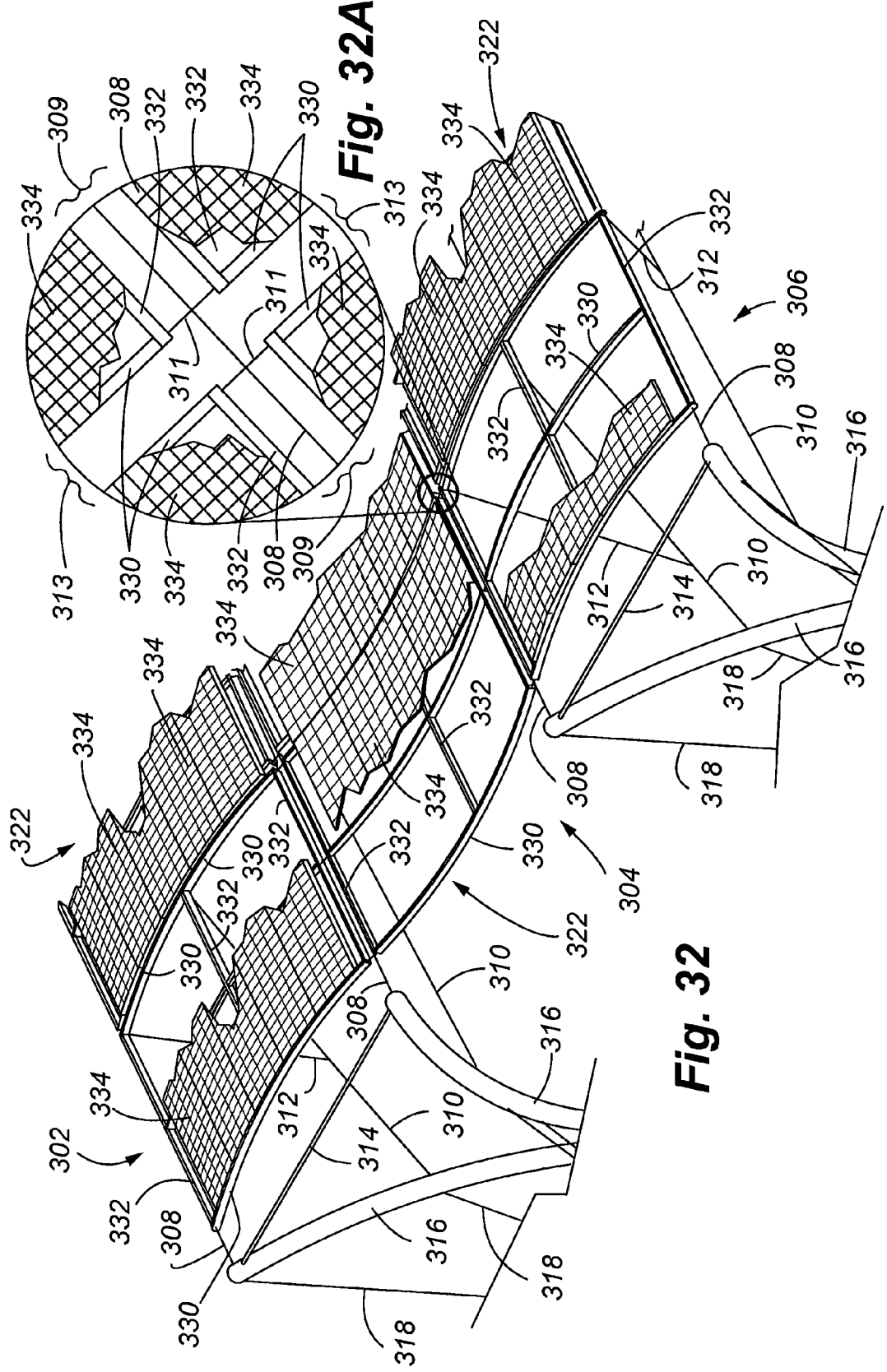
FIG. 32 is an enlarged fragmentary perspective view of the embodiment of FIG. 27 illustrating details of the pod constructions, cable connections, and the manner in which the solar panels are mounted to the curved struts of the panel receiver/pod rows.

Referring to FIG. 32, this enlarged fragmentary perspective view illustrates the manner in which the solar panels 334 may be mounted to the panel receivers/pods. The solar panels 334 are mounted to the collection of curved struts 330 and perpendicularly oriented and straight/linear struts 332. Specifically, each pod 322 is shown as having a group of three curved struts 330, and three straight struts 332; however depending upon loading conditions, enough structural support may be provided by the use of two curved struts 330 and two straight struts 332. The spacing of such a 2×2 strut arrangement can be designed to provide maximum support to the overlying solar panels. For example, it may be desirable to space the 2×2 arrangement of struts so that there is some overhang of the solar panels beyond the outside edges of the struts. For rows 302 and 306, the curved struts are placed in an orientation such that the ends curve downward and the middle portion or area of the curved struts extend above the ends. For row 304, the curved struts are reversed so that the ends curve upward and the middle area of the struts are disposed below the ends. The curvature of struts 330 in rows 302 and 306 provides the overhead convex appearance, while the curvature of struts 330 in row 304 provides the overhead concave appearance.

Referring to FIG. 32A, a greatly enlarged plan view of a section of FIG. 32 is shown. This view shows the intersection of four panel receivers/pods wherein a longitudinal gap 309 separates the pods between rows, and a transverse gap 313 separates the transverse group of three pods across the width of the array. The upper cable 308 bisects the longitudinal gap 309 between the facing struts 332. Interconnecting members 311 span the gap 309 and interconnect the facing ends of struts 332. Interconnecting members 311 may be, for example small sections of cable, or could be more rigid members such as rods or plates. In the event more rigid members such as rods or plates are used, a moment connection can be incorporated where the members 311 attach to the respective ends of the struts 332. It is also contemplated that in order to increase array rigidity or stability, additional members 311 may be placed to span the gaps 313 and therefore interconnect the facing curved struts 330.

Figure 33:
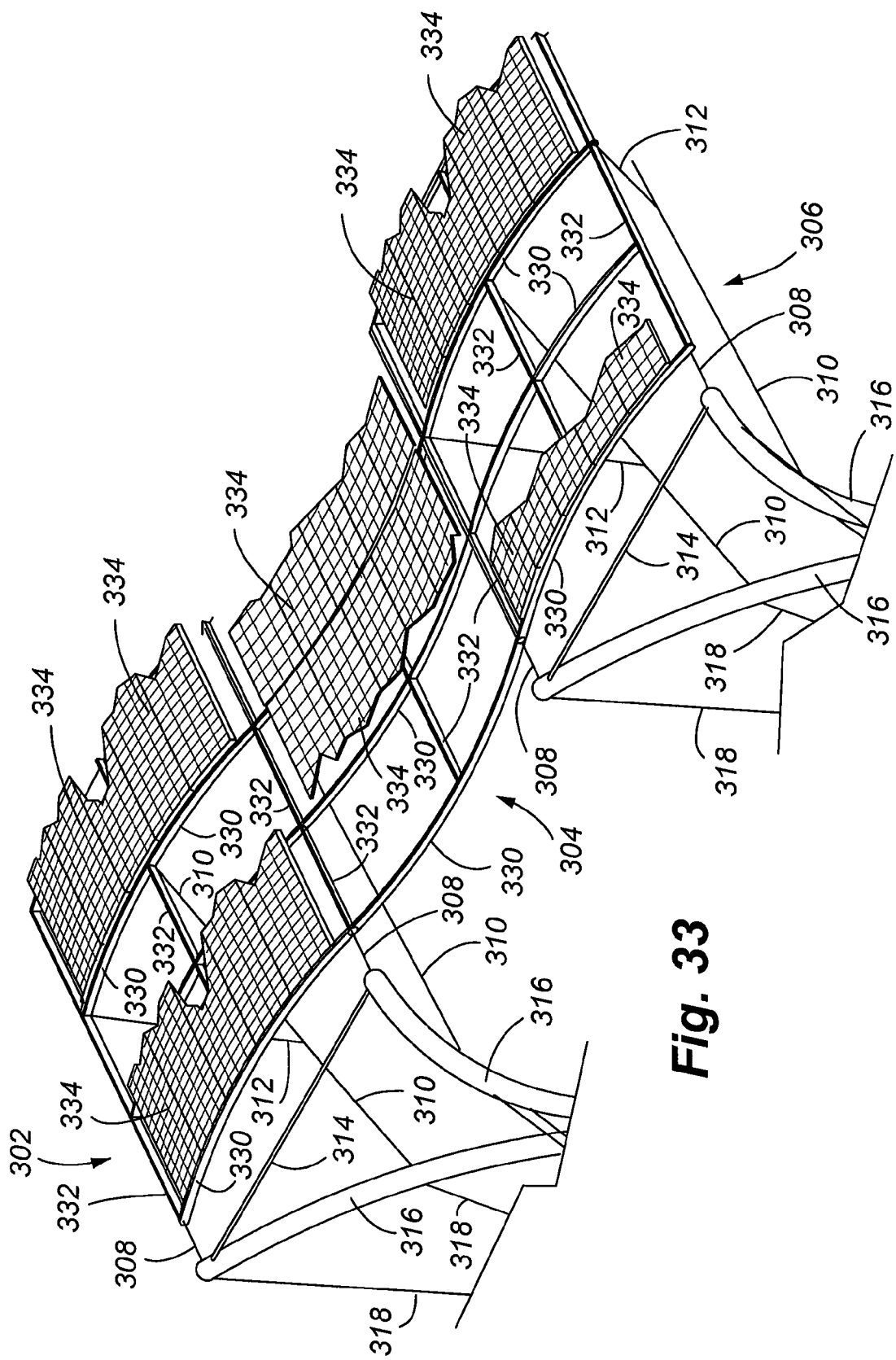
FIG. 33 is another enlarged fragmentary perspective view of the embodiment of FIG. 27, but illustrating an alternative construction for the curved struts that extend continuously across the rows of pods.

Now referring to FIG. 33, a different arrangement of struts is illustrated wherein curved struts 330 are continuous across the entire width or transverse section of the array. In this embodiment, the array is more rigid since there is no gap or separation 309 between row 304 and the exterior rows 302 and 306. The array still maintains the same wave-like shape, but has greater rigidity in the transverse or lateral direction. Thus, this strut arrangement can increase the structure's resistance to horizontal loading from wind or seismic events especially when cables 308 are sized to handle such anticipated loads.

Figure 34:
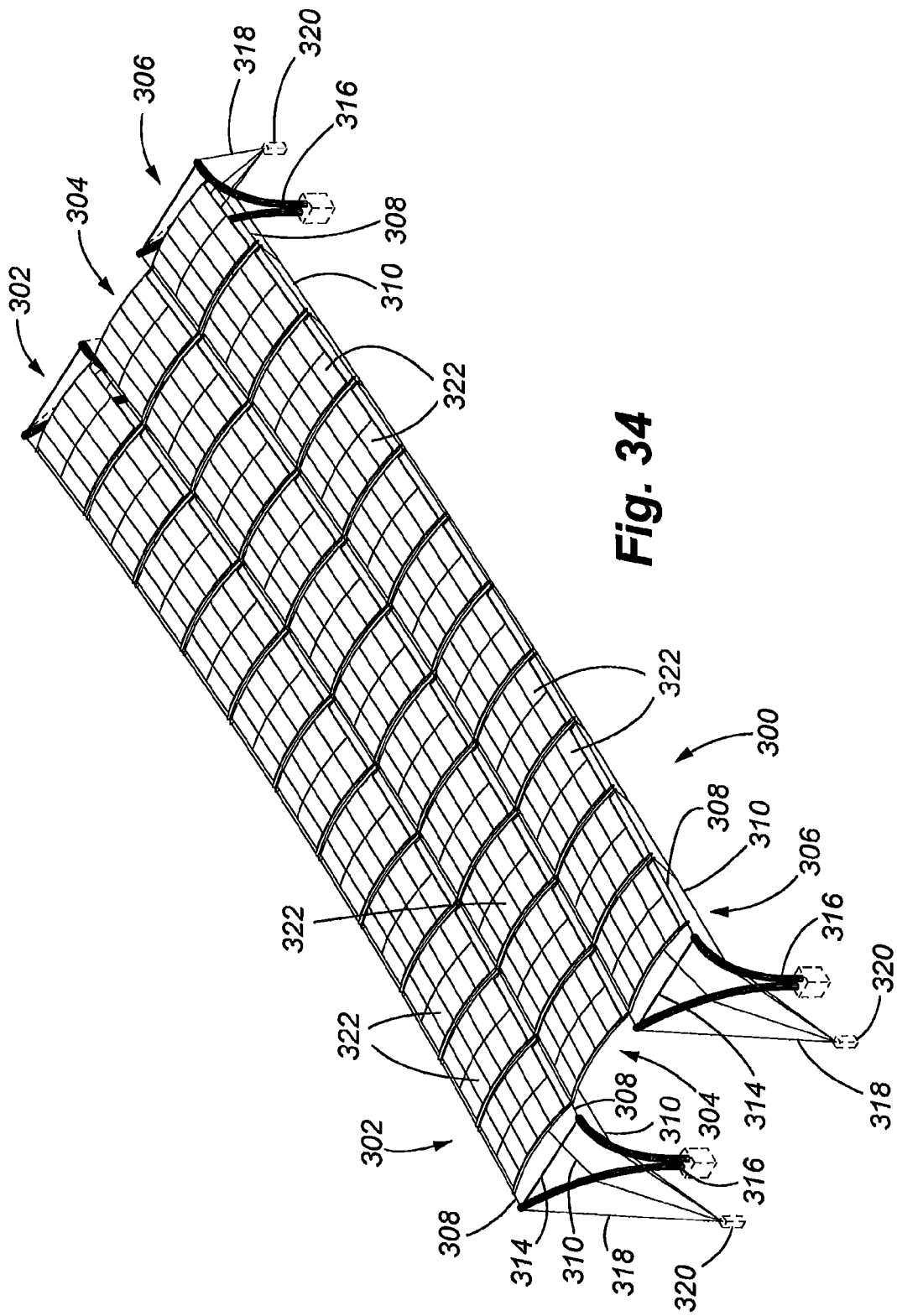
FIG. 34 is a perspective view of another embodiment of the present invention showing three rows of panel receivers/pods with convex curvatures when viewed from above.

Referring now to FIG. 34, another embodiment of a solar array 300 is illustrated wherein the intermediate or interior row 304 has a convex configuration as opposed to the concave configuration illustrated in FIG. 27. Therefore, the curved struts 330 for row 304 are oriented in the same manner as the curved struts used in rows 302 and 306 so that the opposite ends of the struts curve downward. This particular arrangement of the pods may also provide benefits with respect to managing wind or snow loading conditions, maximizing direct sunlight exposure, as well as to provide a different aesthetic appearance. Additionally, more complete water drainage is achieved by providing the convex shaped upper surface and therefore this pod arrangement is especially suited for those climates that may experience heavy precipitation.

Figure 35:
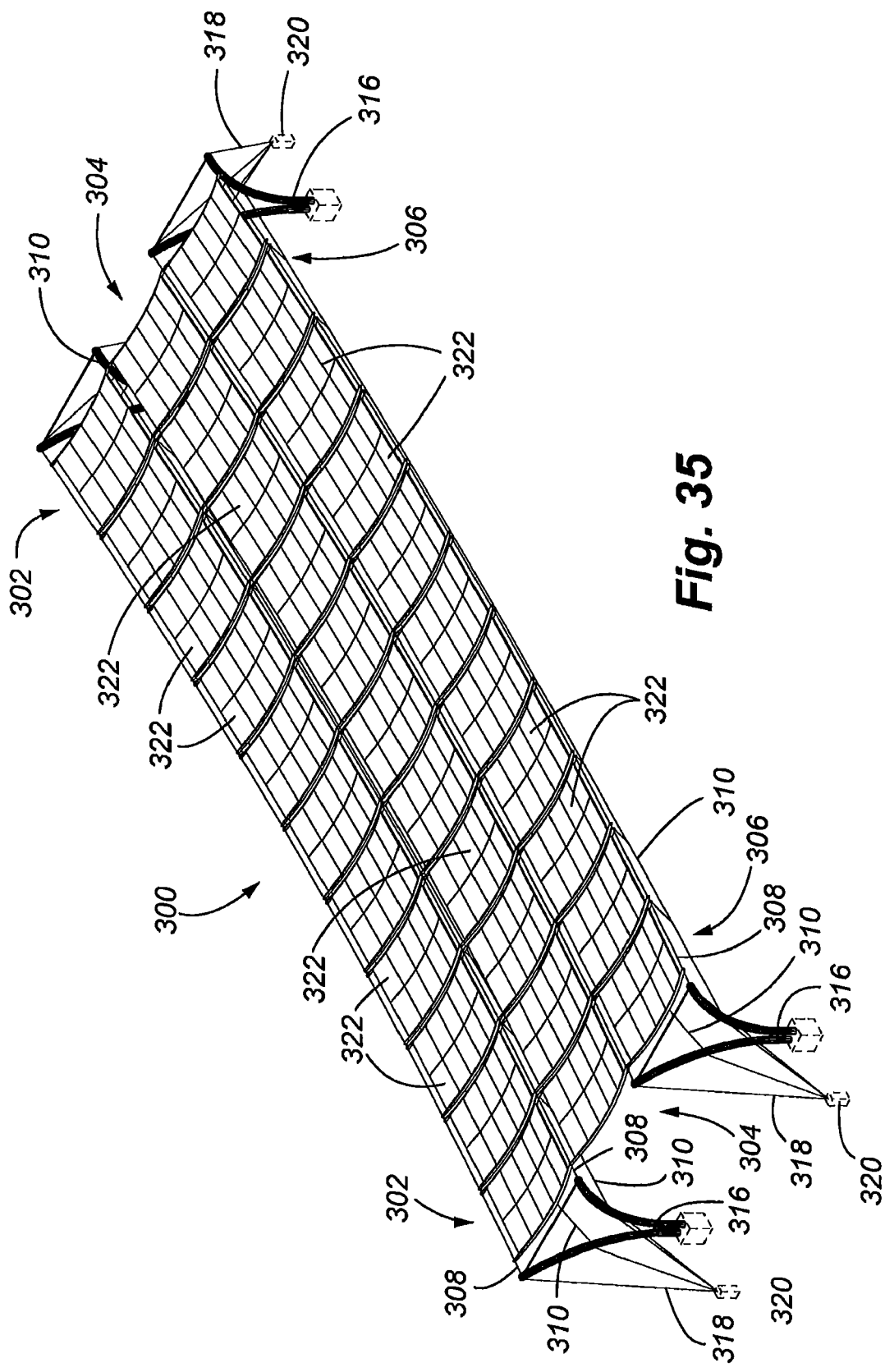
FIG. 35 is a perspective view of another embodiment of the present invention showing three rows of panel receivers/pods with concave curvatures when viewed from above.

Referring to FIG. 35, yet another configuration of an array 300 is provided wherein each of the rows 302, 304 and 306 have a concave configuration, like the configuration of row 304 in FIG. 27. Thus, the struts 330 are each oriented so that the opposite ends curve upward. This embodiment too may offer some benefits with respect to loading, maximizing sunlight capture, and a different aesthetic appearance.

Figure 36:
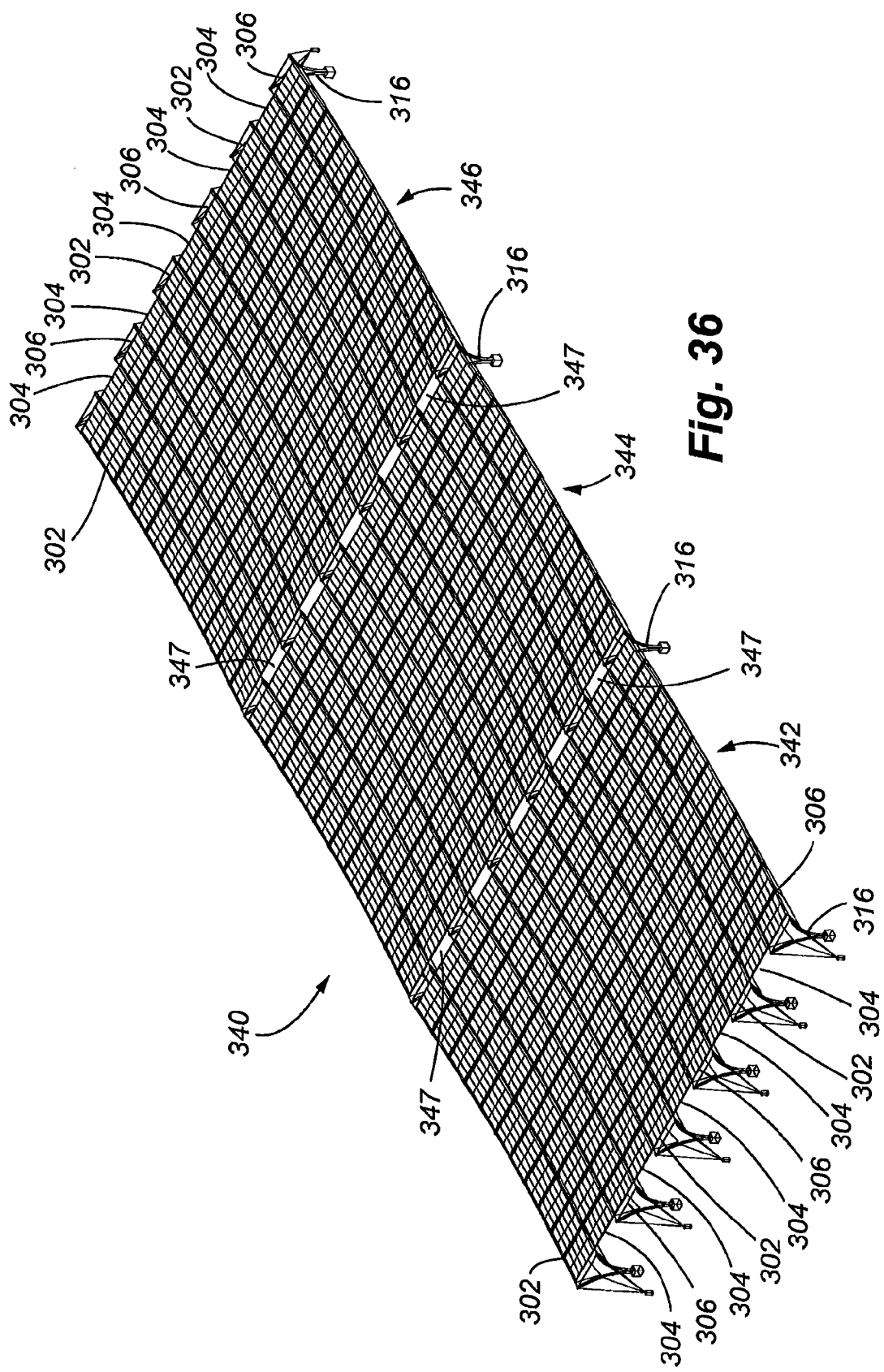
FIG. 36 is a perspective view of another embodiment of the present invention showing a plurality of three row configurations joined to form an array with three primary spans.

Referring to FIG. 36, another embodiment of the present invention is shown in a larger solar array system 340 comprising three primary spans 342, 344, and 346. The spans are defined as running transversely in relation to the rows of pods. This embodiment includes a plurality of sets of the three-row configuration of FIG. 27 as well as interconnecting rows 304 between the sets. Accordingly, FIG. 36 shows the rows of pods 302, 304, and 306 connected to one another in series. FIG. 36 also illustrates gaps 347 between the spans 342, 344, and 346 that accommodate mounting of intermediate columns 316. The embodiment of FIG. 36 is ideal for those installations when it is desired to maximize coverage of solar panels in a defined space, for example, to maximize electricity production and/or to provide a shaded area under the solar panels.

Figure 37:
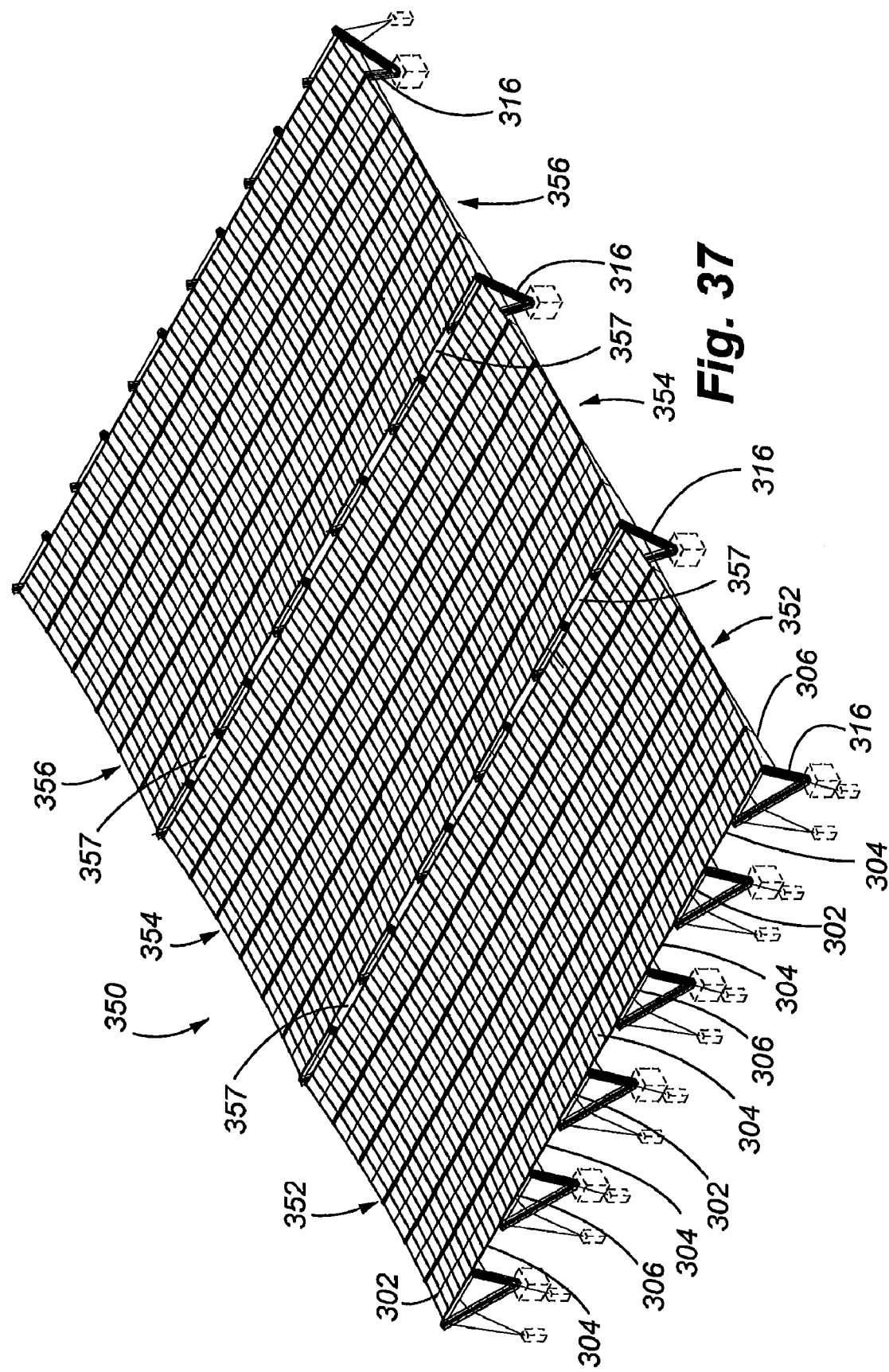
FIG. 37 is a perspective view of yet another embodiment of the present invention showing a plurality of three row configurations joined to form an array with three primary spans.

FIG. 37 illustrates yet another embodiment of the present invention showing an array 350 comprising three transversely oriented spans 352, 354, and 356. This embodiment also incorporates the sets of three row configurations of pods 302, 304, and 306 arranged in series to one another and including an interconnecting row 304 between each three-row grouping. The columns 316 are shown as v-shaped members and without curvature as compared to the columns 316 of FIG. 36. Gaps 357 are provided to allow mounting of the intermediate columns 316. FIG. 37 also represents that the pods incorporate continuous struts in the lateral or transverse direction thus eliminating gaps 309 if viewing FIG. 32A, but maintaining gaps 313.

Figure 38:
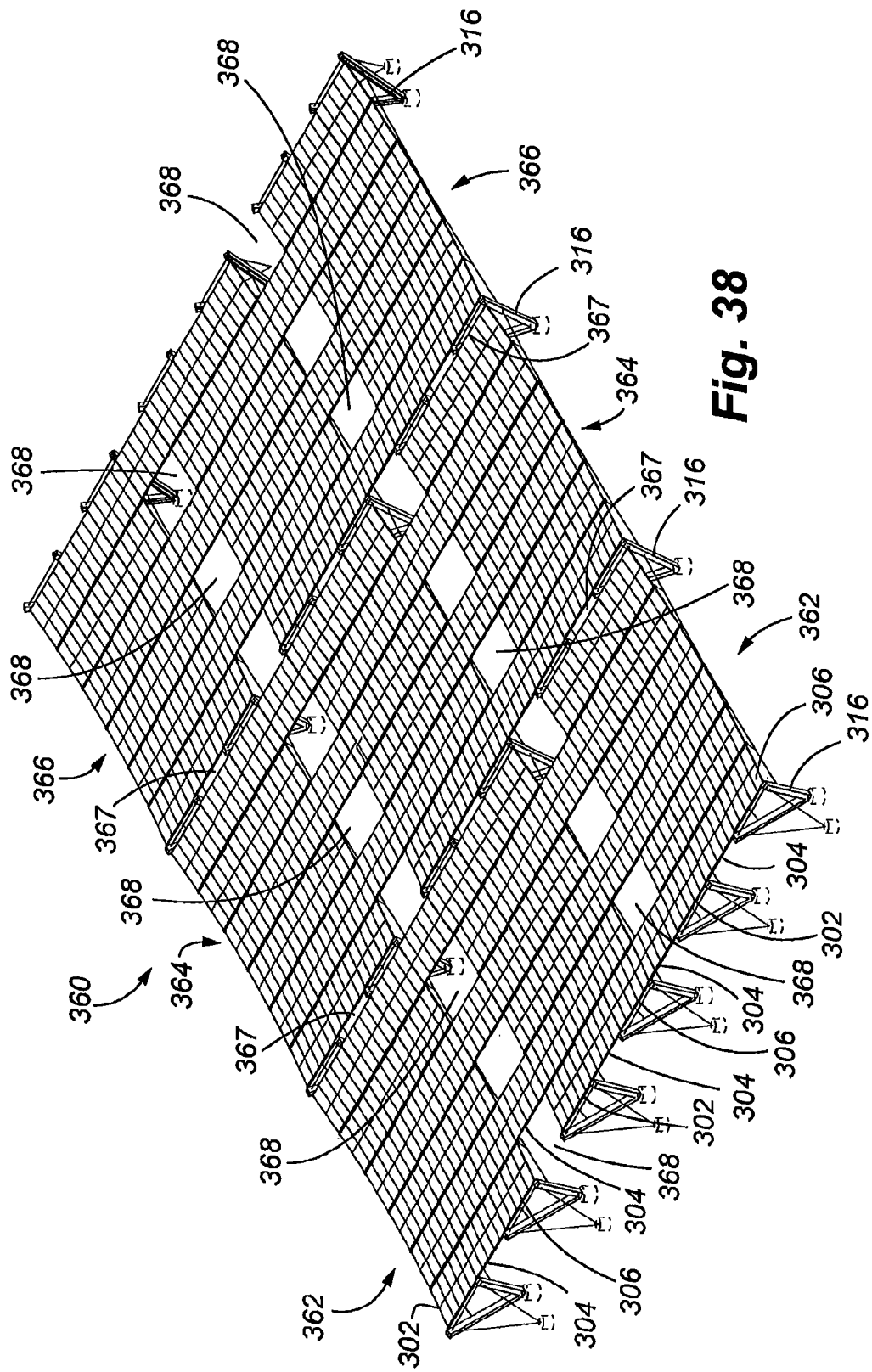
FIG. 38 is a perspective view of yet another embodiment of the present invention showing a plurality of three row configurations joined to form an array with three primary spans and a plurality of openings formed in the array by removing selected panel receivers/pods.

FIG. 38 illustrates yet another embodiment of the present invention illustrating an array 360 similar to the array 350 of FIG. 37, but the array of FIG. 38 further incorporates a plurality of gaps or open spaces 368 that are formed by removing selected pods from a selected row/span. Gaps 367 enable mounting of the intermediate columns 316. Three spans 362, 364 and 366 are shown in this embodiment. The removal of the pods in this manner may be useful for achieving one of many purposes, such as to modify wind/snow-loading conditions, to provide additional sunlight under the array, or to provide a desired visual impression. The increased amount of sunlight under the array will also facilitate better plant growth that may be desirable in some installations where landscaping under the array incorporates selected vegetation.

Figure 39:
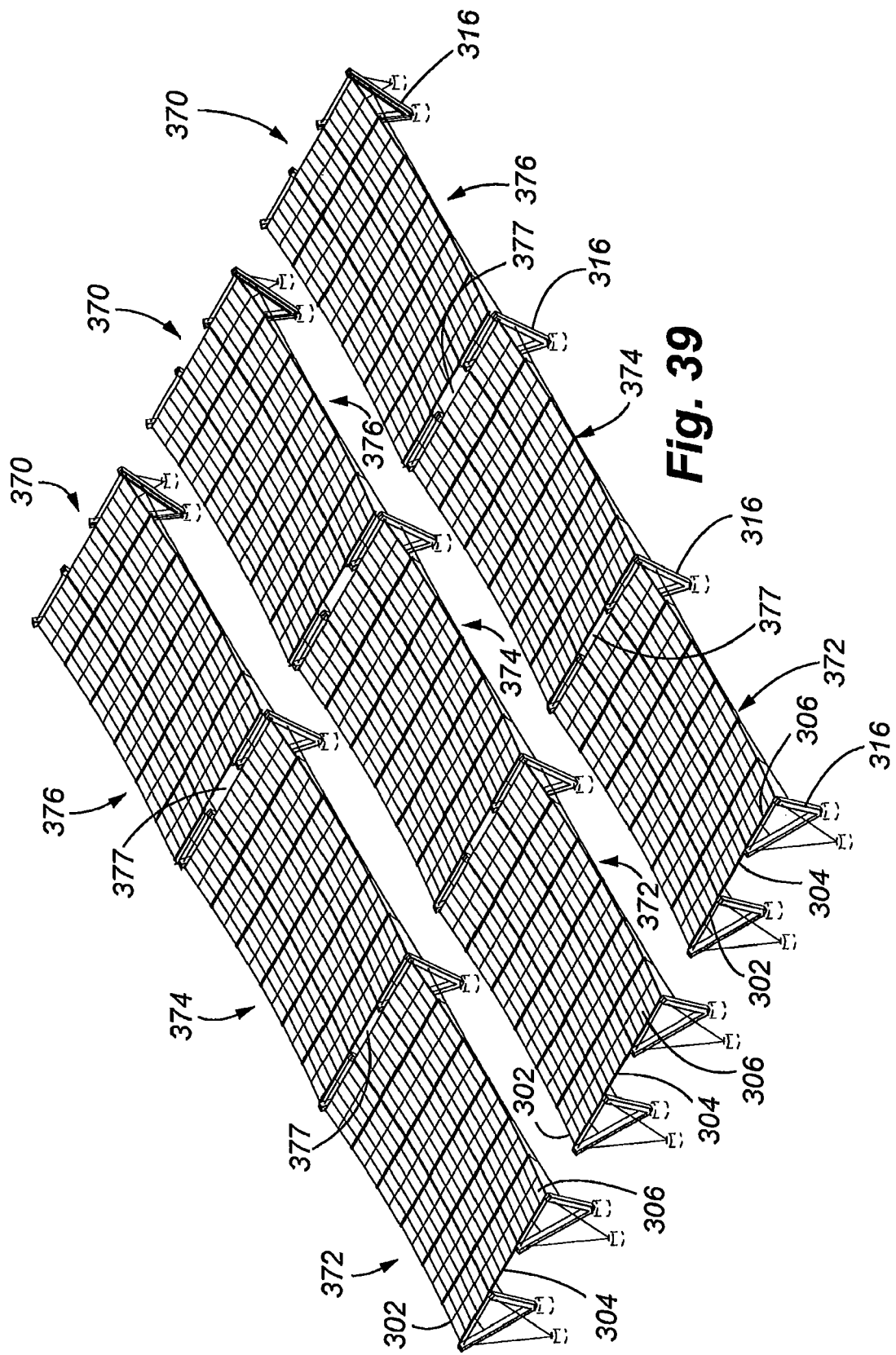
FIG. 39 is a perspective view of another embodiment of the present invention showing three groups of three row pod configurations spaced apart from one another.

Referring to FIG. 39, yet another preferred embodiment of the present invention is illustrated showing three spaced arrays 370, and each array 370 having three primary spans 372, 374, and 376, as well as the three row configuration of rows 302, 304, and 306. In the embodiment of FIG. 39, instead of providing an interconnecting row 304 of pods, there is complete separation among the arrays 370. Gaps 377 provide mounting space for the intermediate columns 316. This embodiment may be used in an installation where it may be necessary to provide gaps between the arrays due to the presence of interfering structures or natural obstacles, such as trees, lighting poles, etc. Safety requirements may also be accommodated by the gaps so that emergency vehicles with large heights are able to more easily access the areas between and under the arrays. Alternatively, it may be desirable for the installation to have a greater amount of sunlight between pod groups that is achieved by the spaced arrays.

Figure 40:
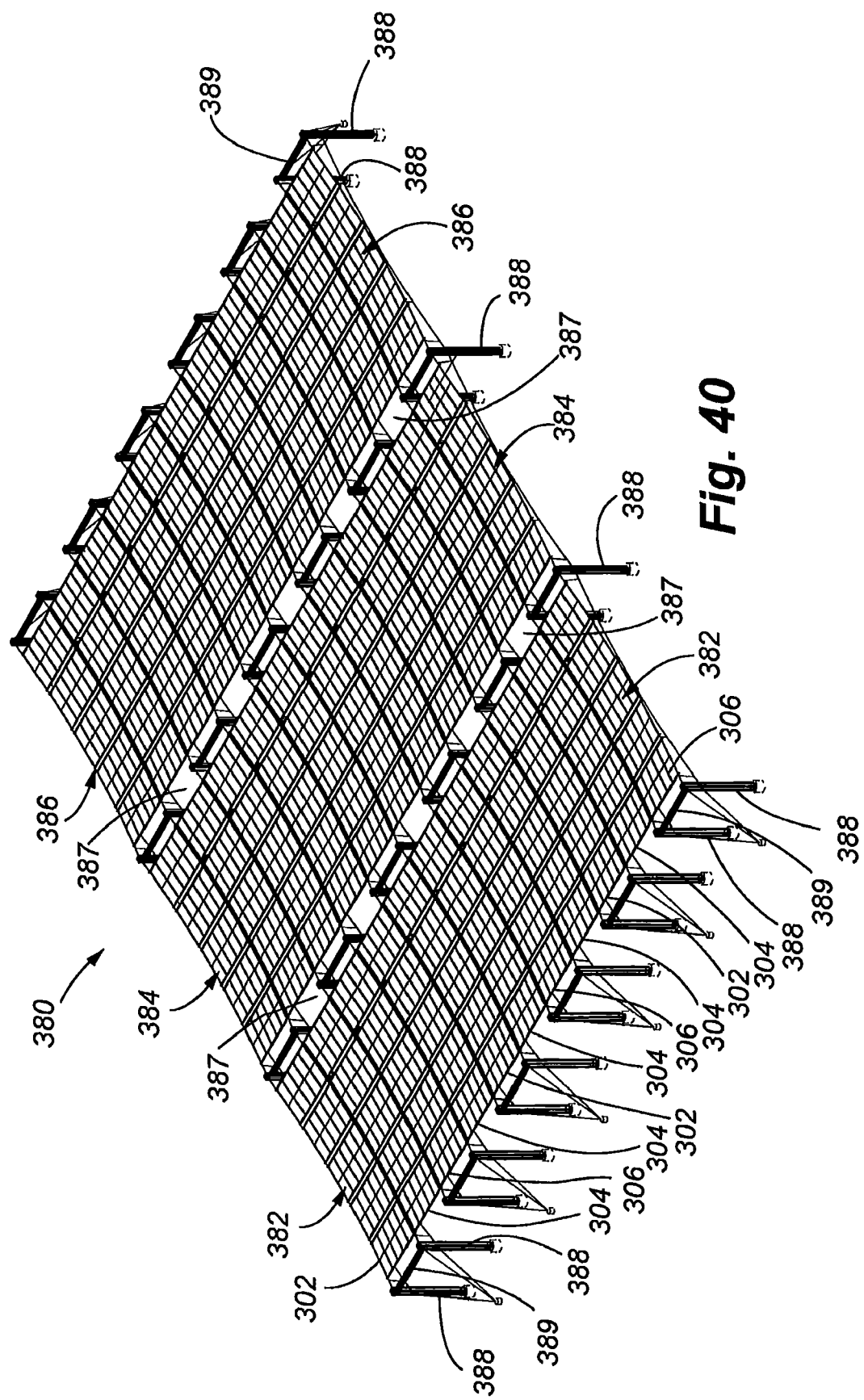
FIG. 40 is a perspective view of yet another embodiment of the present invention showing a plurality of three row configurations joined to form an array with three primary spans and incorporating different columns.

FIG. 40 illustrates yet another embodiment of the present invention shown as array 380 comprising three primary spans 382, 384, and 386. This embodiment also incorporates the three-row configuration of rows 302, 304, and 306 and the interconnecting rows 304 between each three-row grouping. Gap 387 provides mounting space for the intermediate columns 388. In this embodiment, the columns 388 are pairs of spaced vertical members, with an interconnecting and horizontally oriented cross support 389.

Figure 41:
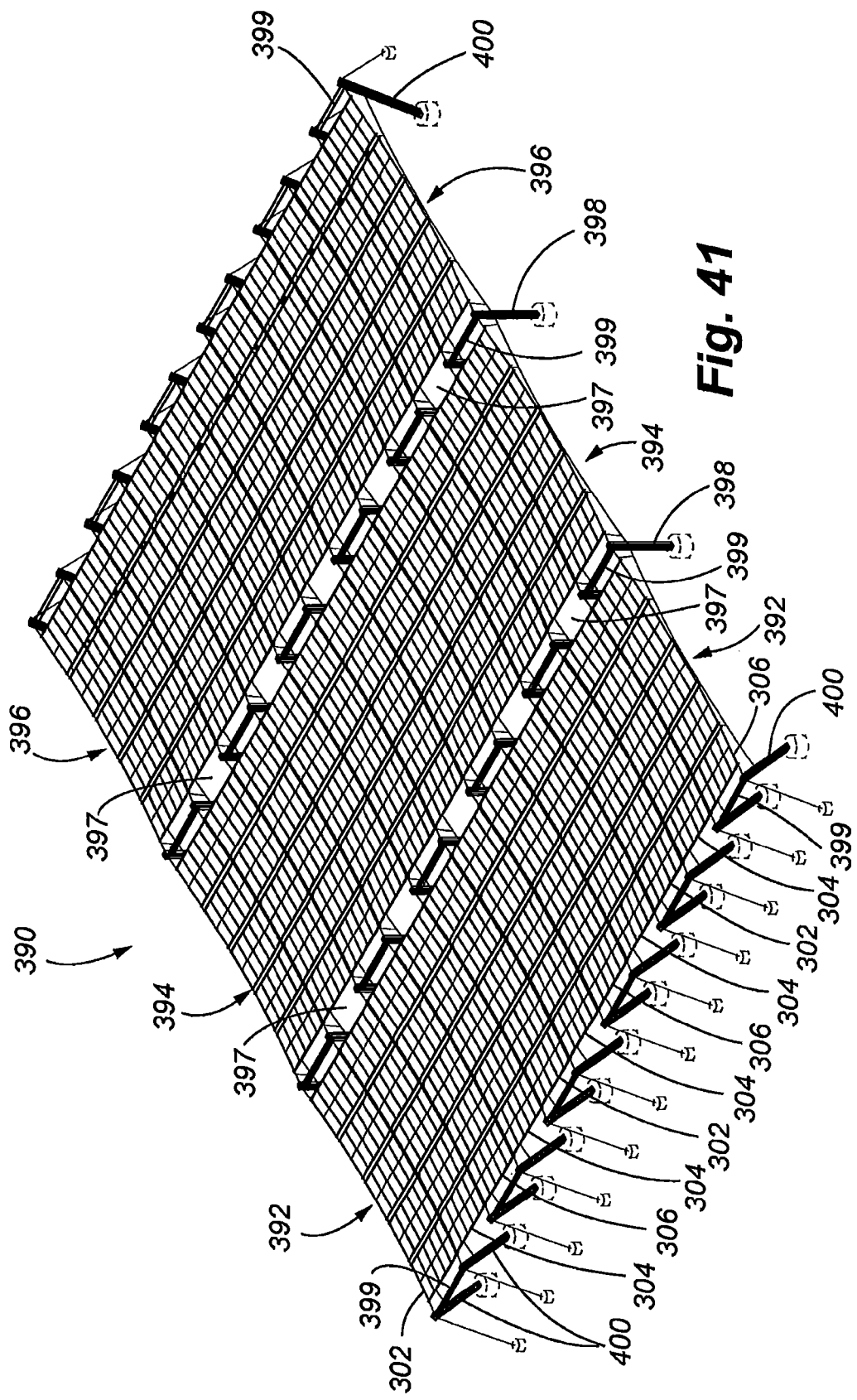
FIG. 41 is a perspective view of yet another embodiment of the present invention showing a plurality of three row configurations joined to form an array with three primary spans similar to the embodiment in FIG. 41, but incorporating exterior columns extending at an angle.

FIG. 41 illustrates yet another preferred embodiment of the present invention, showing an array 390 comprising three primary spans 392, 394, and 396, as well as the repeating arrangement of the three row configuration of rows 302, 304, and 306 and the interconnecting rows 304 between each three row grouping. Cross-support cables or bars 399 are provided between the upper ends of the columns. In this embodiment, the most outward or end group of columns 400 extends at an angle from the ground, while the interior columns 398 extend substantially perpendicular from the ground. Gaps 397 provide mounting space for the interior column 398.

The embodiments of FIGS. 27-41, are particularly suited as ground mount solar arrays, meaning that the height of the columns extends a shorter distance above the ground, such as eight to fifteen feet. The primary purpose of the ground mount solar arrays is to produce electricity. These ground mounts can be located in an area that may not be suitable for other construction purposes or may be used to fill in unusable space within a commercial or industrial area to produce power. Because of the lower height at which the solar panels are mounted, there is less of a safety concern as compared to overhead mounted solar panels. Accordingly, in the design of the ground mount fewer supporting materials are required, resulting in significant cost savings. For example, row 304 is suspended between rows 302 and 306 thus eliminating the need for additional column supports for that particular row of pods.

For the embodiments of FIGS. 27-41 as mentioned, the cable arrangement is similar to what is disclosed with respect to the embodiment of FIG. 14. Cables 308 extend substantially parallel to one another and have substantially the same curvature. Cables 310 are disposed below cables 308 and also extend substantially parallel to one another. Cables 310 have generally opposite curvatures as compared to cables 308. Cables 312 extend substantially perpendicular between cables 308 and 310. The gaps 309 between adjacent rows of pods, as well as the gaps 313 between adjacent pods in a row can be modified to best match the particular purpose of installation, as well as to provide the necessary support and airflow through the gaps in order to best handle wind and snow loading conditions.

Figure 42:
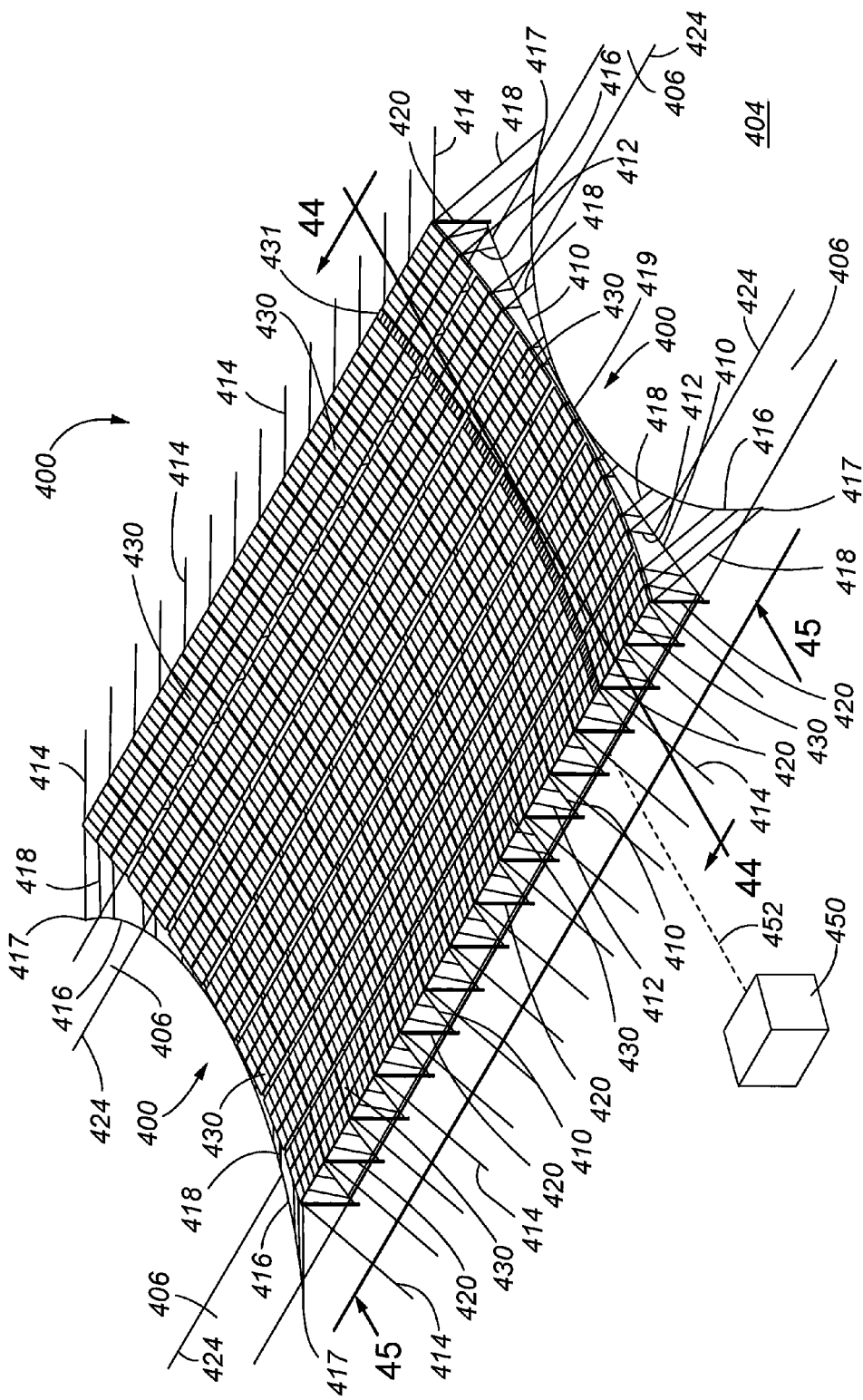
FIG. 42 is a perspective view of yet another embodiment especially adapted for installation over an aqueduct.

FIG. 42 illustrates another preferred embodiment of the present invention in a solar panel array 400 that is especially designed to be installed over a linear extending ground feature, such as a road or aqueduct. In the southwest region of the United States, aqueducts are used to transport large quantities of water from reservoirs to municipalities. The aqueducts are typically concrete-lined waterways that carry water within a bed 404 of the aqueduct. The sides of the aqueduct are defined by banks 406 that extend above the liquid level 424 of the waterway. In the case of array 400, it is designed to span the width of the aqueduct wherein the end of columns 420 are positioned outside or exterior of the sloping banks 406. The array 400 provides an effective way in which to shade the aqueduct, thereby reducing evaporation that naturally occurs in the aqueduct. Preferably, the array is mounted closely over the aqueduct in order to also disrupt or block wind which would normally freely flow over the aqueduct, thus, the solar panel also acts as a wind break to further prevent evaporation. Because of the remote location of many portions of various aqueducts, the solar arrays can be easily installed over the aqueducts without concern for interfering with other man-made structures.

FIG. 42 also illustrates an optional power substation 450 that is placed near the array 400, in which power is downloaded from the array 400 through power transfer line 452. Particularly in remote locations, one or more power stations 450 may be required in order to most efficiently store energy produced by the array 400, or to transmit the power to another substation.

Figure 43:
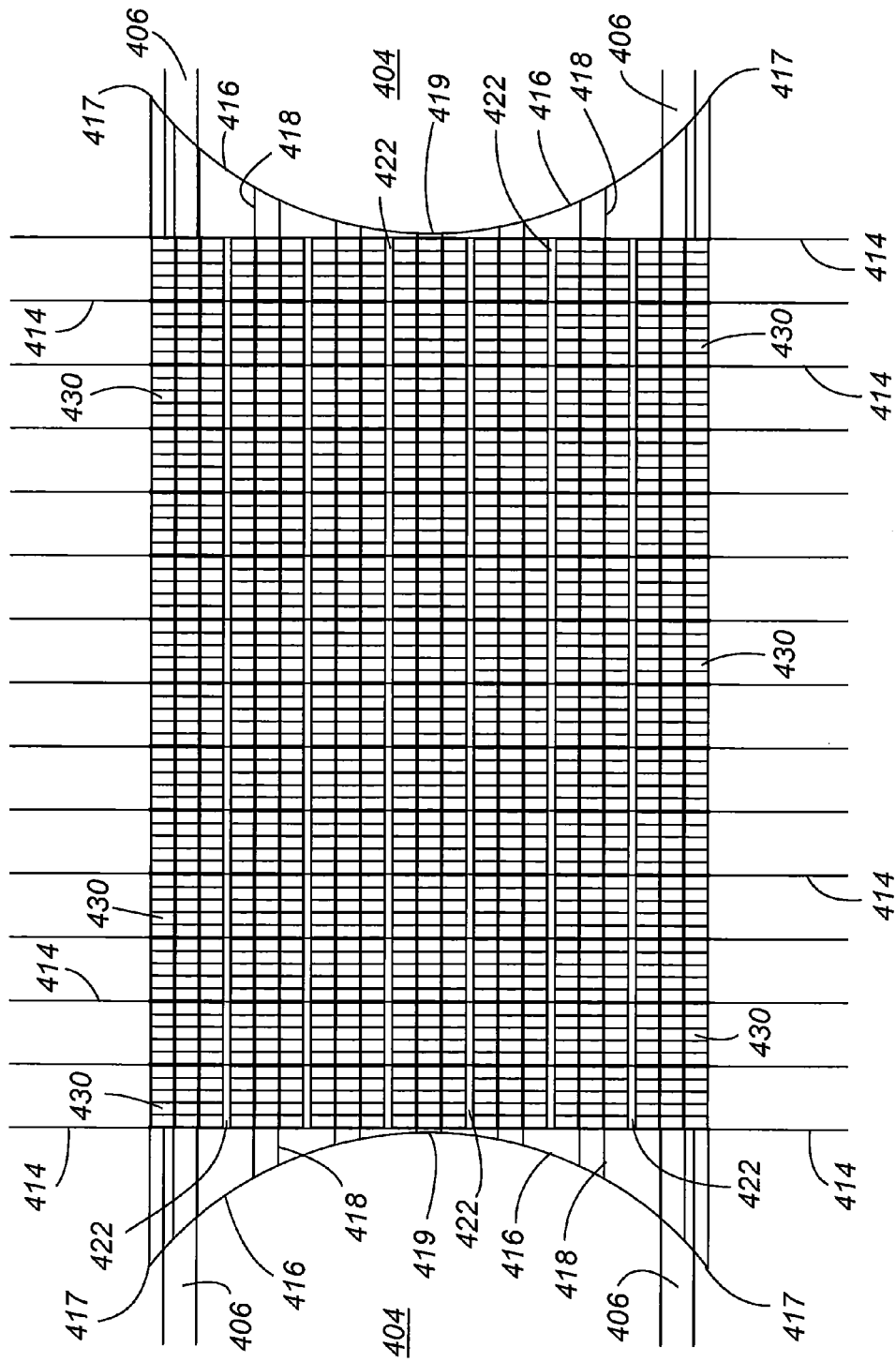
FIG. 43 is a plan view of the embodiment of FIG. 42.
Figure 44:
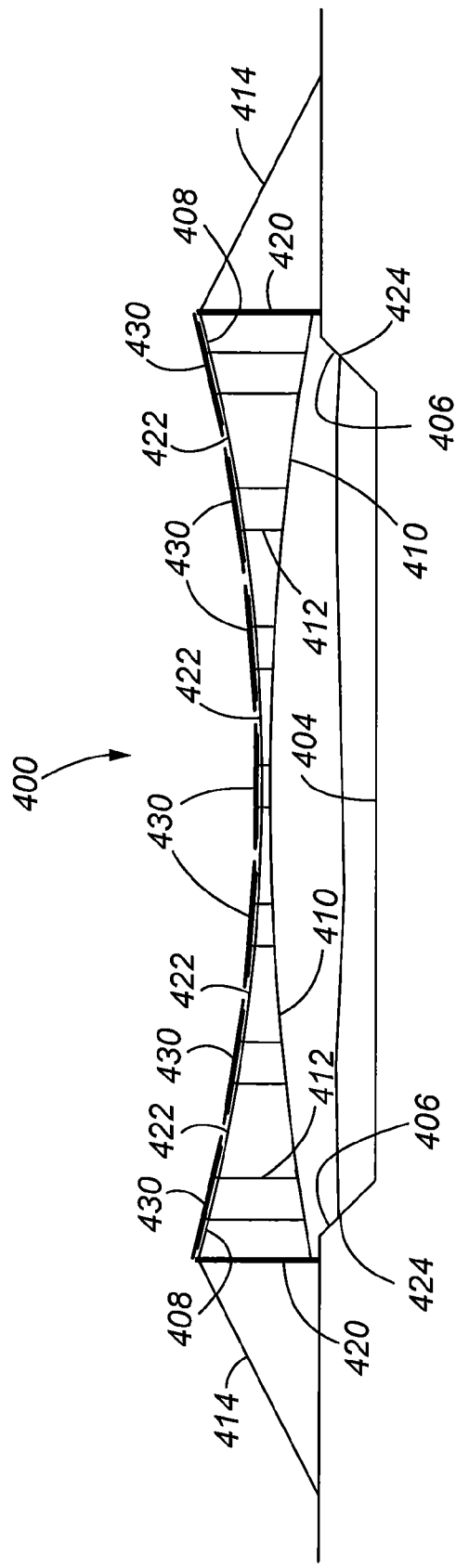
FIG. 44 is an elevation view taken along line 44-44 of FIG. 42.

Referring also to FIGS. 43 and 44, the array 400 comprises a plurality of upper support cables 408 that are secured to upper ends of the respective end columns 420. A complementary lower support cable 410 spans between lower ends of the respective end columns 420. A plurality of anchor cables 414 provide additional support for the end columns 420. The anchors in FIGS. 42 and 43 have been omitted for clarity. As with the previous embodiments, a plurality of interconnecting cables 412 connect the respective upper and lower support cables 408 and 410. On each longitudinal end of the array 400, a catenary cable 416 spans the aqueduct, and has a center portion connected at the longitudinal center 419 of the array. At this longitudinal center 419, the upper cable 408, lower cable 410, and catenary cable 416 intersect. A plurality of interconnecting catenary cables 418 extend longitudinally and interconnect the catenary cable 416 to the upper support cable 408. The array 400 comprises a plurality of pods/receivers 430 each containing a number of solar panels. The pods 430 can be selectively spaced from one another thus forming gaps 422. The columns 420 are placed exteriorly of the banks 406 so that the array 408 effectively covers the entire width of the aqueduct.

In order to provide maintenance for the array, a walkway 431 may be incorporated on various portions of the array so a person can walk to locations on the array to replace damaged solar panels or other components of the system. The walkway would replace one row of solar panels in each adjacent pod. The walkway could be made of a lightweight decking material and can also include handrails (not shown). In this figure, only one walkway is shown that extends transversely across the aqueduct; however additional walkways can be provided to allow direct access to other areas of the array in both transverse and longitudinal directions.

Figure 45:
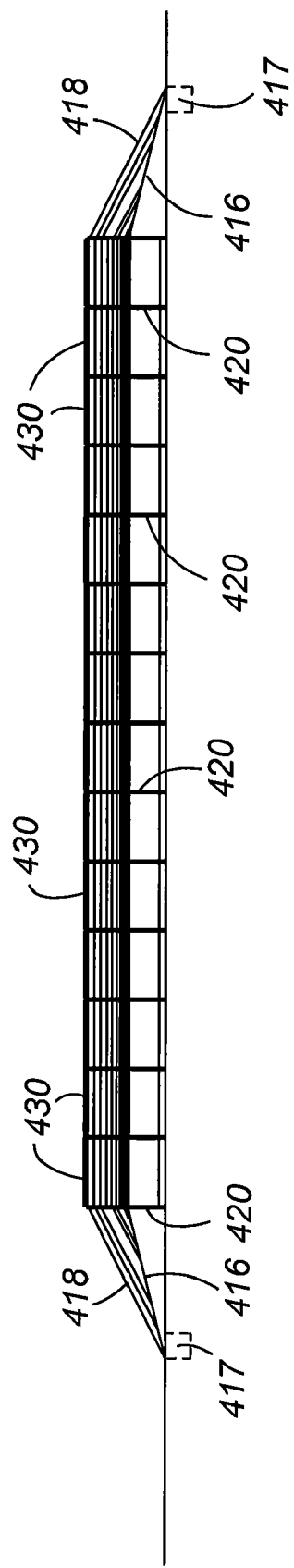
FIG. 45 is another elevation view taken along line 45-45 of FIG. 4.

FIG. 45 is a longitudinal elevation view taken along line 45-45 further illustrating details of the construction. FIG. 45 also illustrates the way in which the catenary cables 416 and the interconnecting cables 418 extend from the opposite longitudinal ends of the array. The catenary cables 416 are anchored at respective anchor points 417, that are also placed preferably in longitudinal alignment with the columns 420.

Figure 46:
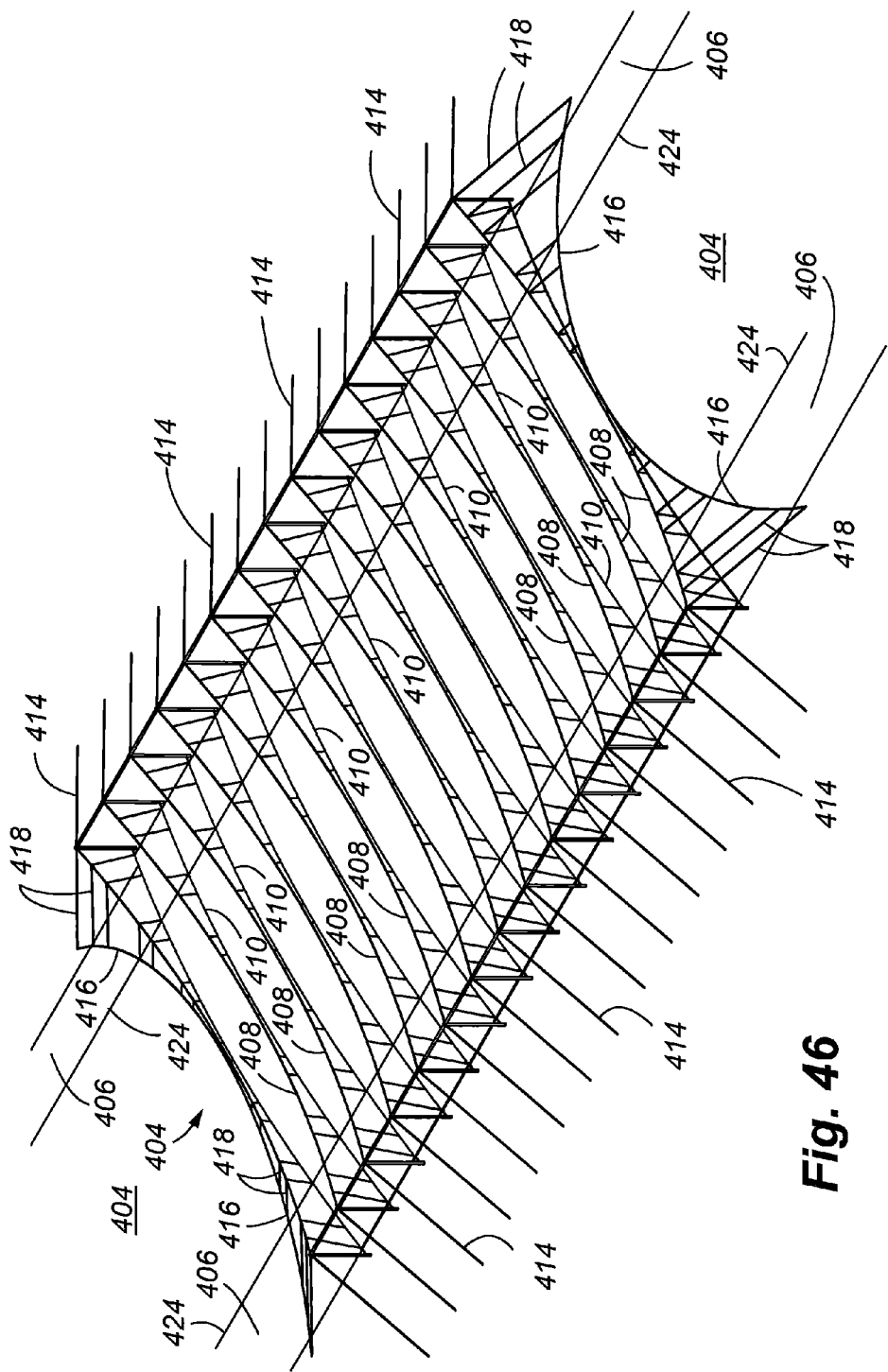
FIG. 46 is a perspective view of the embodiment of FIG. 42 illustrating the solar panels and receivers removed to better illustrate the arrangement of the cables.

FIG. 46 illustrates the array 400 with the pods removed to better show the arrangement of cables to include the upper cables 408, lower cables 410, catenary cables 416, anchor cables 414, and various interconnecting cables.

Figure 47:
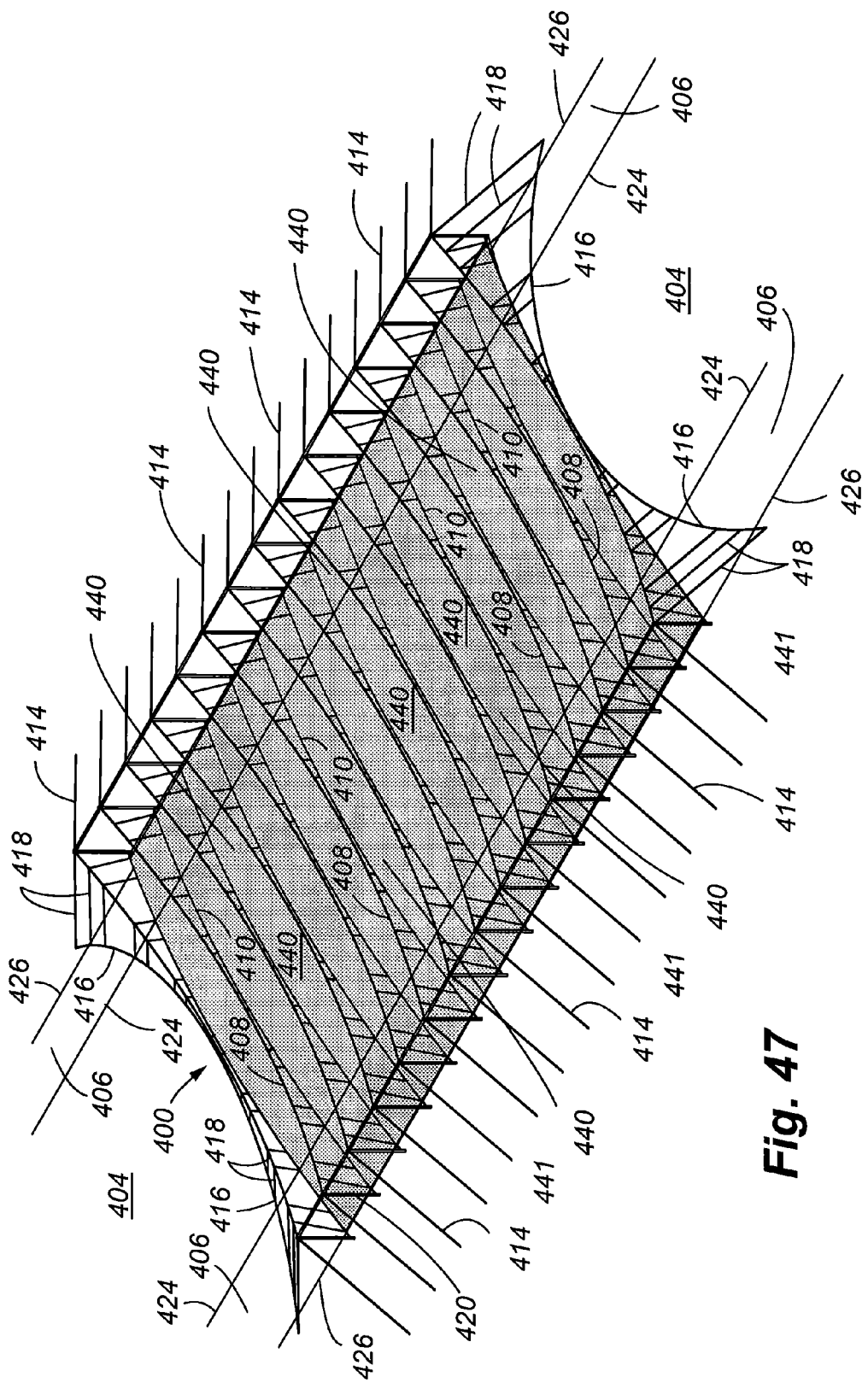
FIG. 47 is another perspective view as shown in FIG. 46, but further illustrating the protective membrane that is mounted to the lower support cables.

Referring to FIG. 47, another feature of this embodiment is to provide a membrane or cover that is suspended from the lower cables 410 so that the membrane can provide additional protection to the waterway to prevent evaporation. As shown in FIG. 47, the membrane 440 extends along the entire length and width of the array in order to provide cover for the aqueduct. Because of the curved arrangement of the lower cables 410, the lateral side edges 441 of the membrane 440 extend close to contacting the ground near the columns 420. Thus, the membrane effectively isolates the aqueduct from airflow in a lateral direction which also contributes in preventing evaporation.

For purposes of covering an aqueduct, the array 400 may extend for many miles and the repeating nature of panel receiver rows easily accommodates an extended length. Because of the vast amount of open space available for installing the array over many remote aqueducts, the array 400 can produce a tremendous amount of power, providing an effective way to prevent evaporation loss for water carried in the aqueduct.

Figure 48:
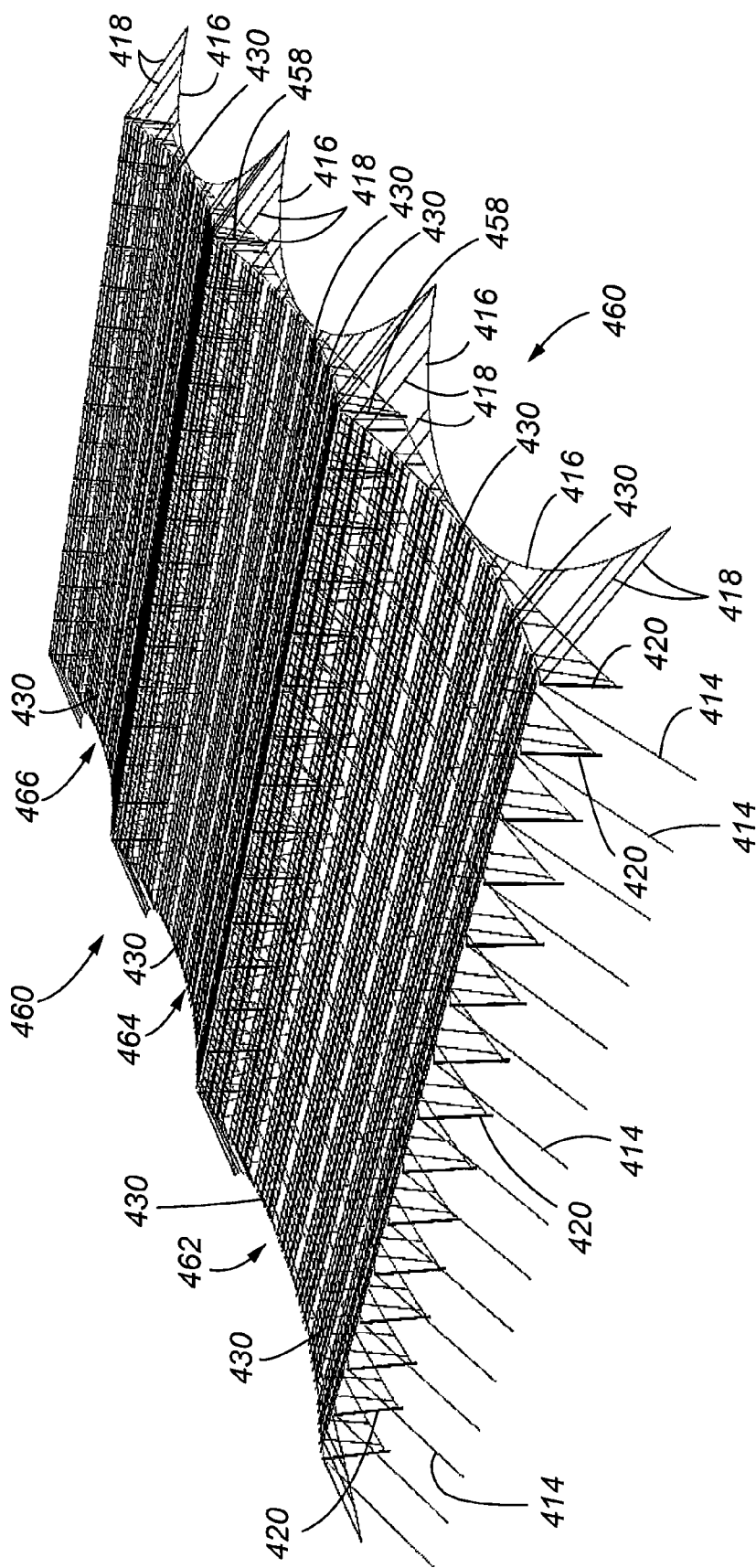
FIG. 48 is another perspective view of yet another embodiment of the present invention.

Referring now to FIG. 48, another embodiment of the present invention is illustrated in the form of an array 460 comprising three spans 462, 464, and 466. Like reference numbers used in this embodiment correspond to the same structural elements disclosed in the prior embodiment. These three spans are supported in the middle of the array by the two pairs of interior column groups 458. This embodiment also includes the catenary cable arrangement 416 on both longitudinal sides of the array to provide additional array support.

Figure 49:
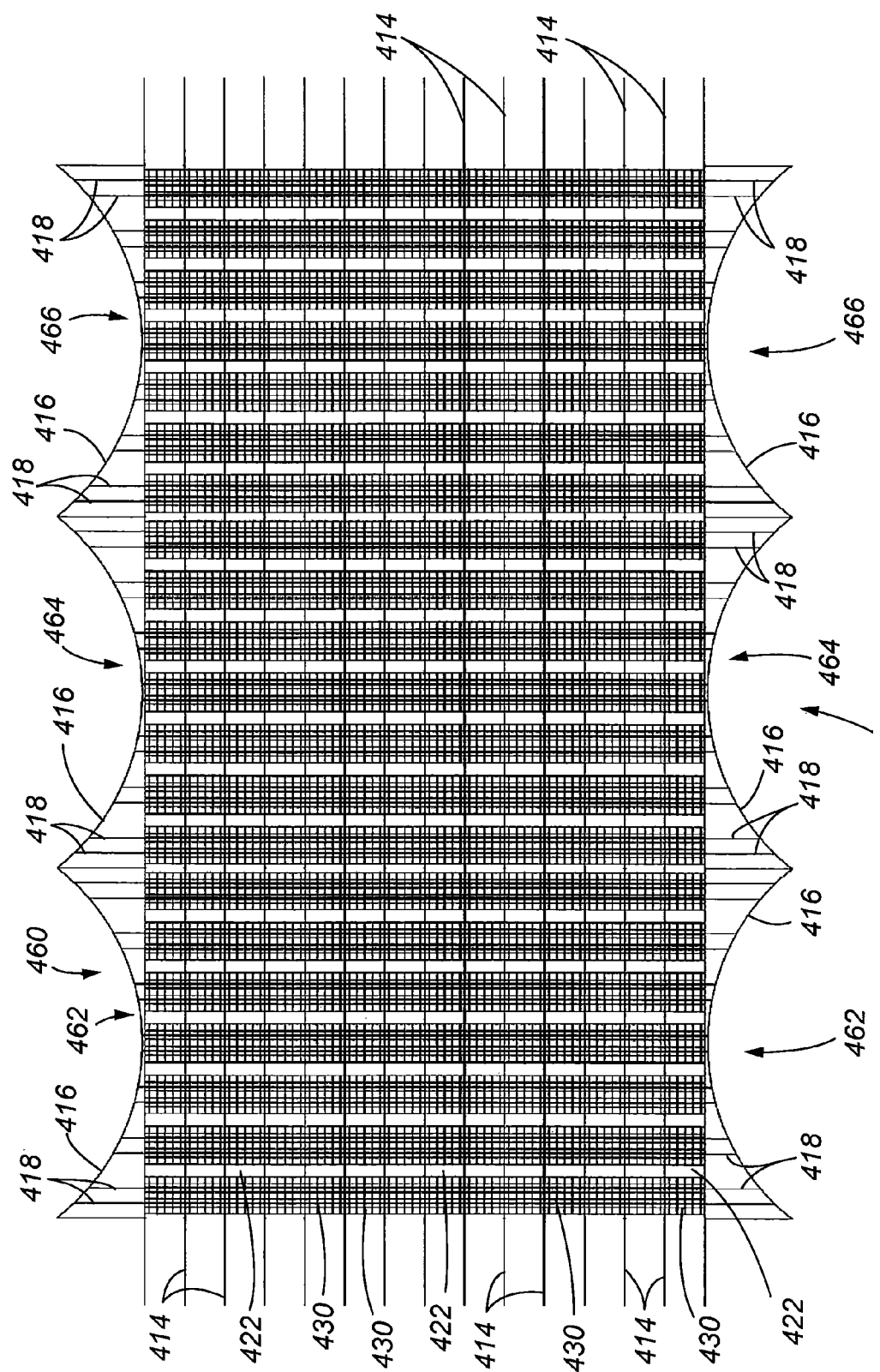
FIG. 49 is a plan view of the embodiment of FIG. 48.

FIG. 49 is a top plan view of the embodiment of FIG. 48 that illustrates the manner in which the anchor cables 414 and catenary cables 416 surround the array to provide support on all sides of the array.

Figure 50:
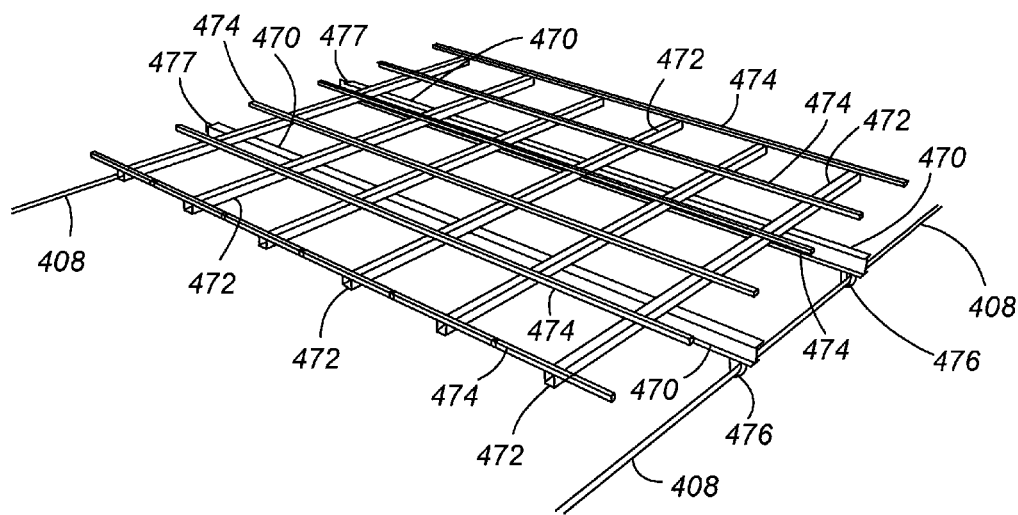
FIG. 50 is a perspective view of another pod or receiver construction in accordance with another embodiment of the present invention.

FIG. 50 illustrates another pod or receiver construction of the present invention. This pod construction is characterized by two main support beams 470 that are spaced from one another, and opposite ends of the main beams are secured to cables 408 by cable clamps 476. A plurality of intermediate struts 472 are spaced from one another and are secured to the pair of beams 470. The intermediate struts 472 are placed transversely with respect to the main beams, and extend substantially parallel with the cables 408. A plurality of solar panel support struts or upper struts 474 are then secured over the intermediate struts 472. The upper struts 474 extend substantially parallel with the beams 470, and extend transversely to the intermediate struts 472 and cables 408.

Figure 51:
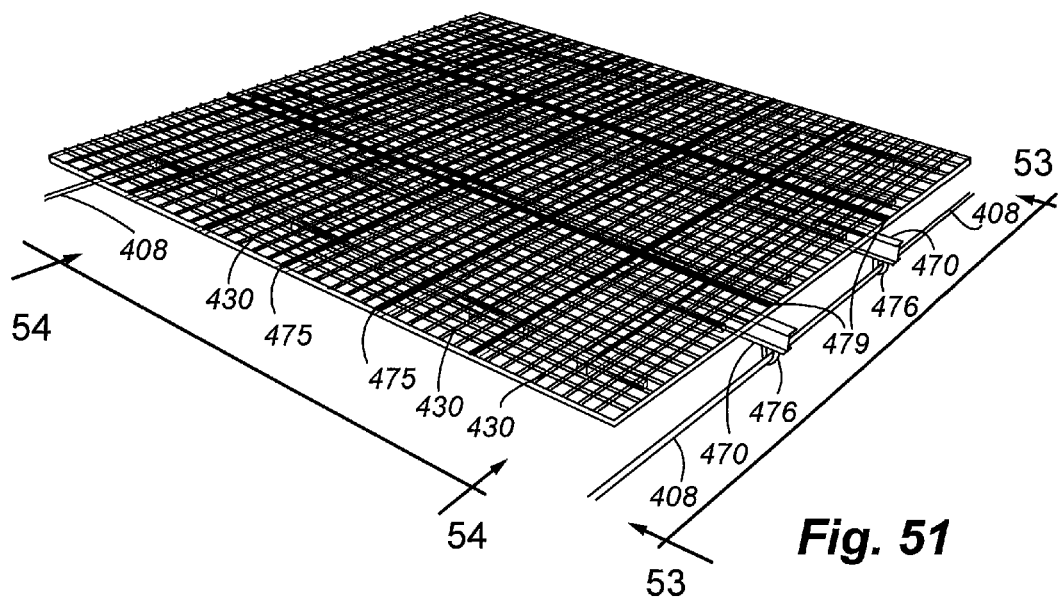
FIG. 51 is a perspective view of the receiver of FIG. 50 with the solar panels mounted thereon.

Referring to FIG. 51, a plurality of solar panels 430 are shown mounted to the upper struts 474. As shown, each of the solar panels 430 are separated from one another by longitudinal gaps 475 that extends parallel with the cables 408, and transverse gaps 479 that extend substantially parallel to the beams 470.

Figure 52:
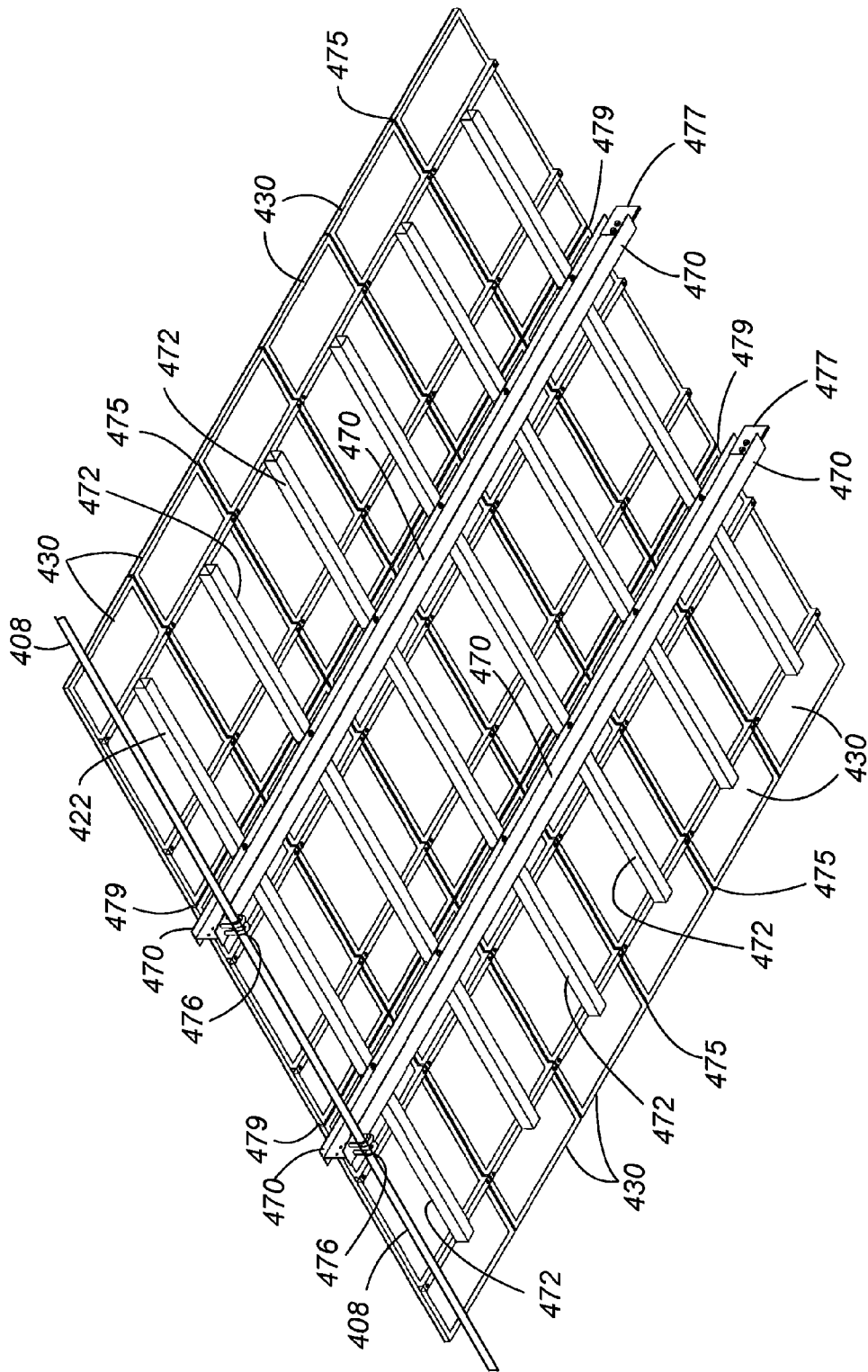
FIG. 52 is a reverse perspective view of the receiver/pod and solar panels of the embodiment of FIGS. 50 and 51.

FIG. 52 illustrates the pod construction from a reverse perspective angle that shows in more detail the manner in which the solar panels 430 are spaced and mounted to the upper struts 474 that overlie the intermediate struts 472 and beams 470.

As also shown in FIG. 52, the beams 470 each include a gusset plate 477 that extends from one end of the beam. The gusset plates 477 are used to interconnect adjacent panels in a row. Therefore, when the pods/panel receivers are placed in series with one another, the gusset plates 477 interconnect the pods. The gusset plates 477 provide additional structural rigidity for the pods as they are mounted to the cables 408.

Figure 53:
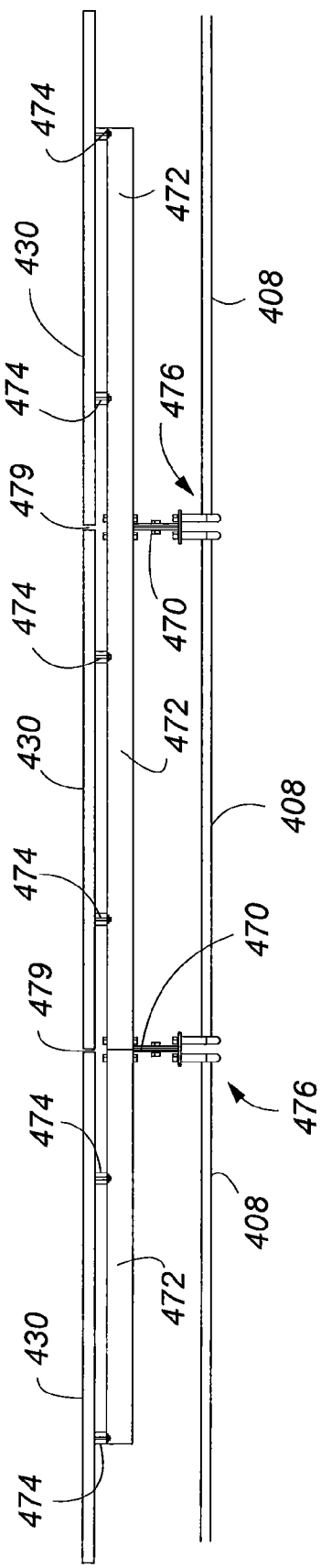
FIG. 53 is an elevation view taken along line 53-53 of FIG. 51.

Referring to FIG. 53, a side elevation view is taken along line 53-53 of FIG. 51. From this side view, it is shown that the transverse gaps 479 separate the respective pods 430 mounted upon upper struts 474. FIG. 53 also shows the cable clamps 476 that comprise a pair of U bolts extending below the beams 470. The U bolts are secured to opposite side flanges of the beams 470 and compress the cables 408 in order to provide a rigid connection between the beams 470 and the cables 408.

Figure 54:
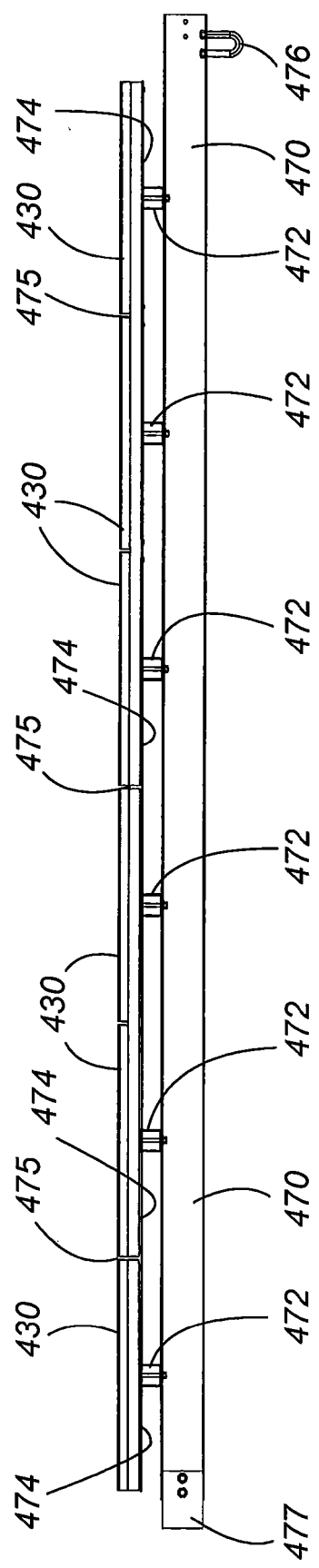
FIG. 54 is another elevation view taken along line 54-54 of FIG. 51.

FIG. 54 is another elevation view taken along line 54-54 of FIG. 51. From this side elevation view, it is also shown how the pods 430 are separated from one another by longitudinal gaps 475 and the manner in which the pods 430 are mounted to the underlying support structure.

The pod or receiver 430 shown in FIGS. 50-54 provide an important solution for preventing torsional forces or torques that may otherwise damage the solar panels. The solar panels are relatively stiff members that can be damaged if they are bent or twisted in an out-of-plane or non-planar fashion. More specifically, the solar panels are substantially flat and the flat upper or lower surface of the panels defines a plane. If the solar panels are twisted or torqued in an out-of-plane fashion, the solar panels can be damaged. FIG. 50 shows the beams 470 connected to the cables 408 that suspend the pod 430. The cables 408 will move based upon various wind and other loading conditions because the cables 408 have some capability to flex or bend; however, adjacent pairs of cables 408 will not always translate or move in an identical fashion, which can cause torsional forces to be transferred to the pods 430. Beams 470 that extend between the cables 408 maintain a constant or rigid planar orientation when used in combination with the intermediate struts 472. Furthermore, a rigid support is provided for the panels which prevents out of plane forces from being transmitted to the solar panels. Thus, any movement transferred to the pod results in a uniform, non-torsional displacement of the entire pod which therefore prevents damage to the panels when mounted to the pods.

Figure 55:
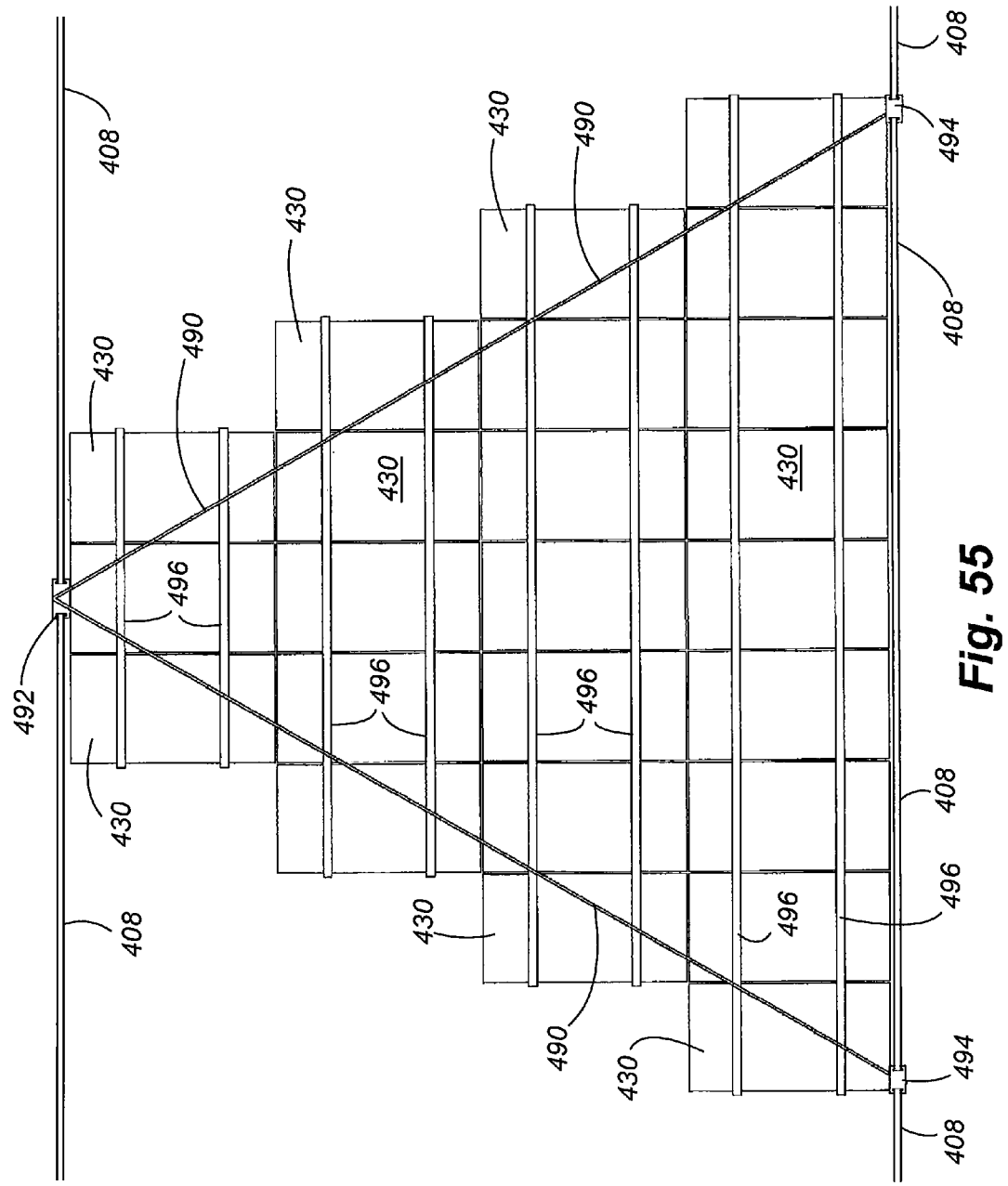
FIG. 55 is a plan view of yet another pod or receiver construction in accordance with another embodiment of the present invention.
Figure 56:
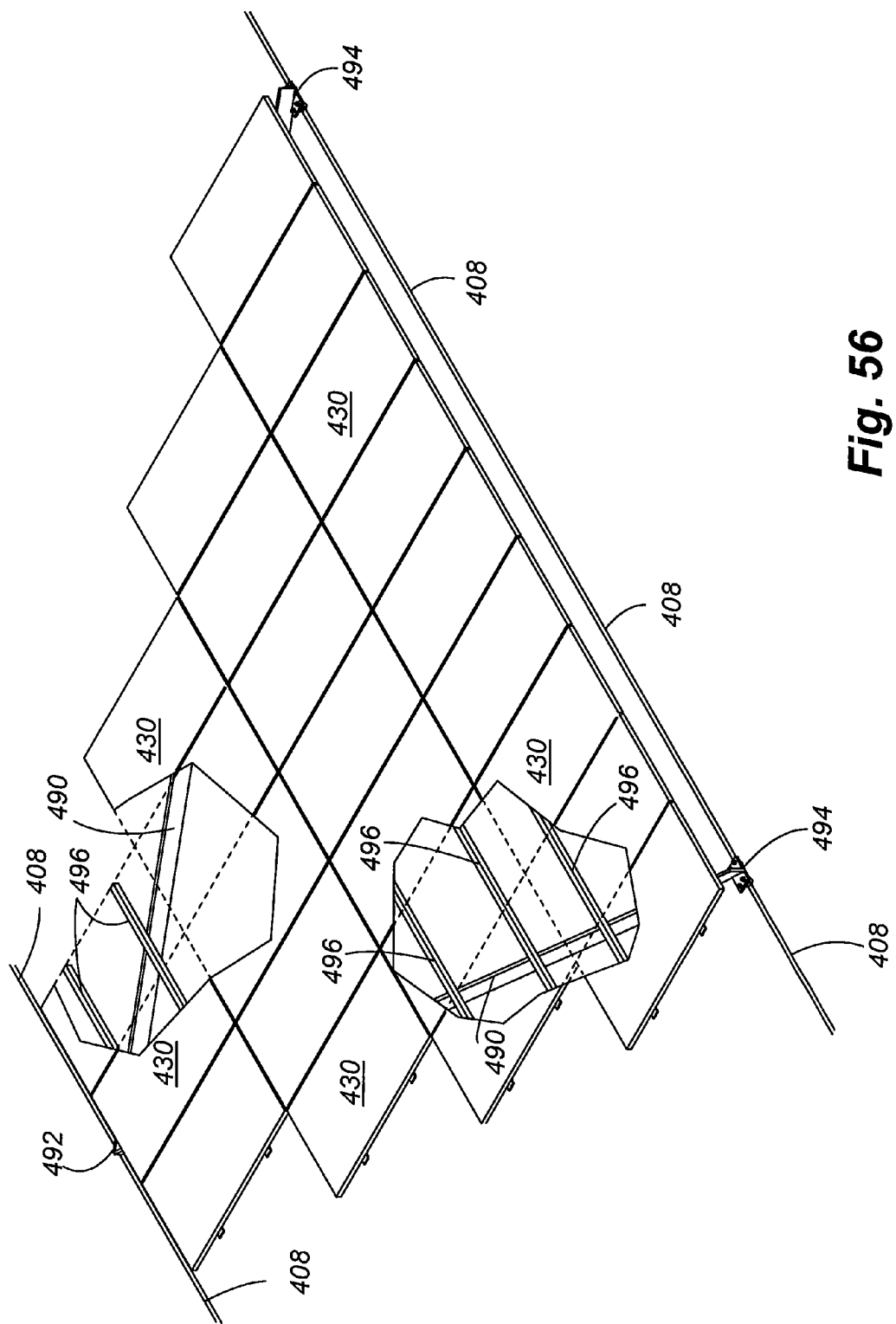
FIG. 56 is a perspective view of the embodiment of FIG. 55 illustrating the pod/receiver construction.

FIGS. 55 and 56 illustrate yet another preferred pod construction in accordance with the present invention. In this pod construction, a triangular configuration is achieved for the solar panels that are mounted to the pod 430. FIG. 55 is a bottom plan view that illustrates this pod construction wherein a pair of diagonal beams 490 extends from an apex connection 492. The beams 490 terminate at respective base connections 494. One cable 408 attaches to the apex 492 and the adjacent cable 408 attaches to the base connections 494. Adjustable U bolts may also be used at the apex connection 492 and the base connections 494 in order to provide a rigid connection from the cables to the beams 490. A plurality of longitudinally extending connecting struts 496 are spaced from one another and are secured to the diagonal beams 490. As shown, there are preferably two struts 496 that support each of the pods 430. The triangular shape of the pod is achieved by the selected lengths of struts 496.

FIG. 56 is a perspective view illustrating how the pods 430 appear when mounted with the triangular configuration.

Figure 57:
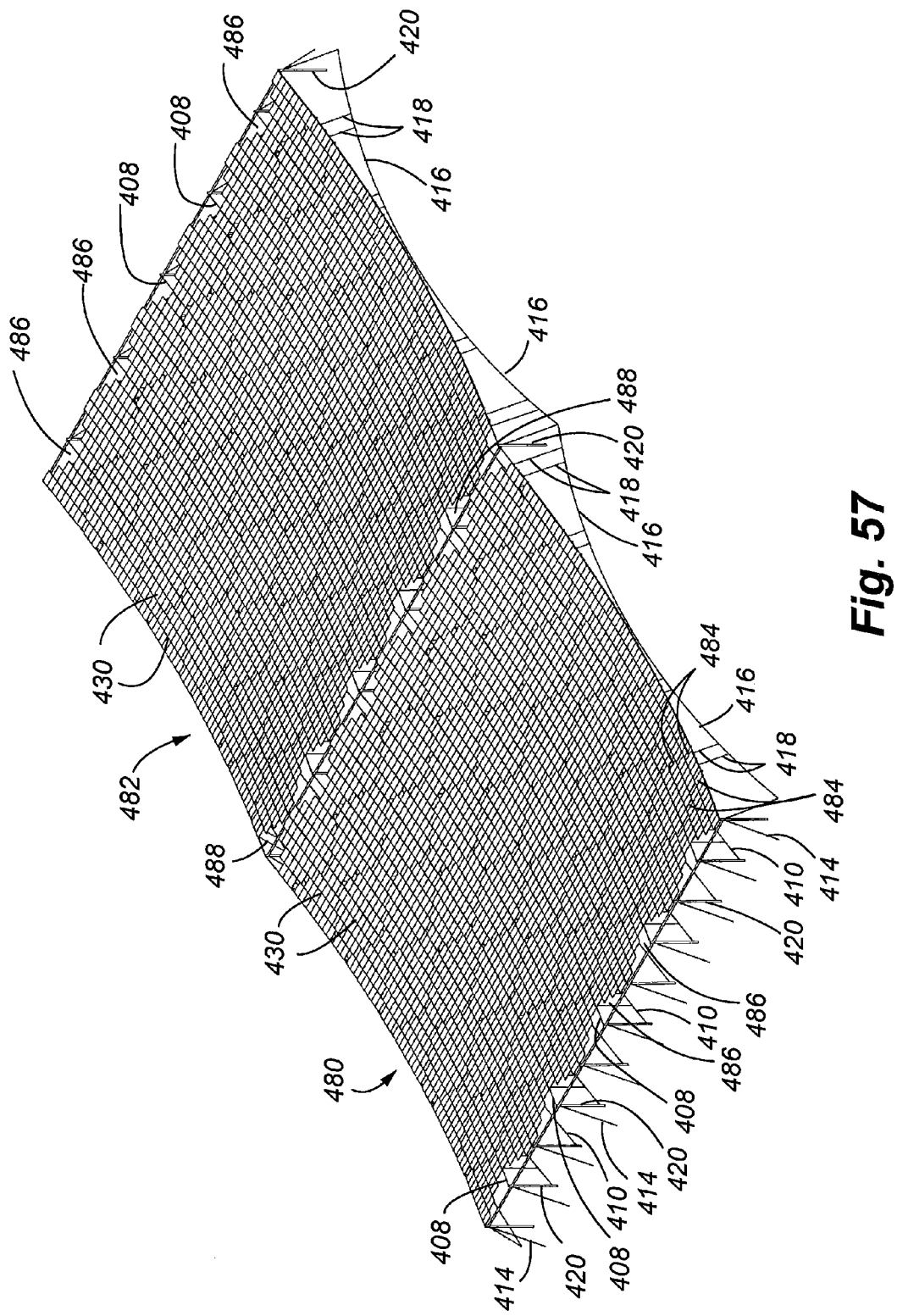
FIG. 57 is a perspective view of an array incorporating the triangular shaped pod/receivers shown in the embodiment of FIGS. 55 and 56.

FIG. 57 illustrates another example of an array wherein two spans 480 and 482 comprise an arrangement of solar panels that are mounted to the triangular pods 430. Like numbers in this figure also correspond to the same structure numbers as discussed above with respect to the embodiments shown in FIG. 42. When the pods 430 are secured to the cables 408, the triangular shaped arrangement of the solar panels allow the pods to be mounted in an overlapping configuration wherein the apex of one pod is mounted adjacent to one base side of the adjacent pod. Gaps 484 define the spaces between the solar panels mounted to adjacent pods. Gaps 486 are present at both opposite ends of the array and which illustrates the mounting arrangement of the triangular pods. In the center portion of the array, there is also a larger shaped gap 488 which again is produced by the triangular shape of the pods as mounted to the cables 408.

Figure 58:
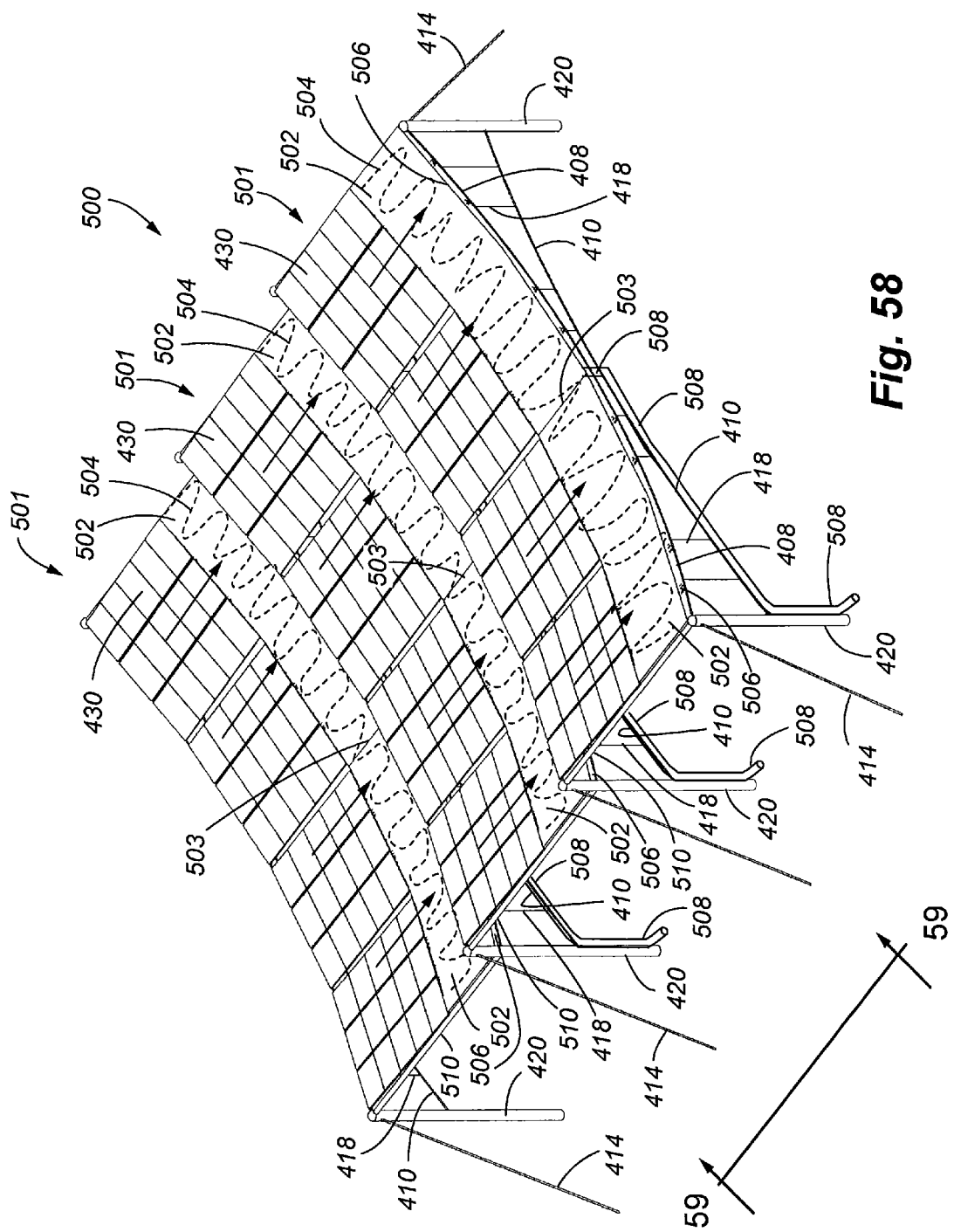
FIG. 58 is a perspective view of yet another embodiment in accordance with the present invention.
Figure 59:
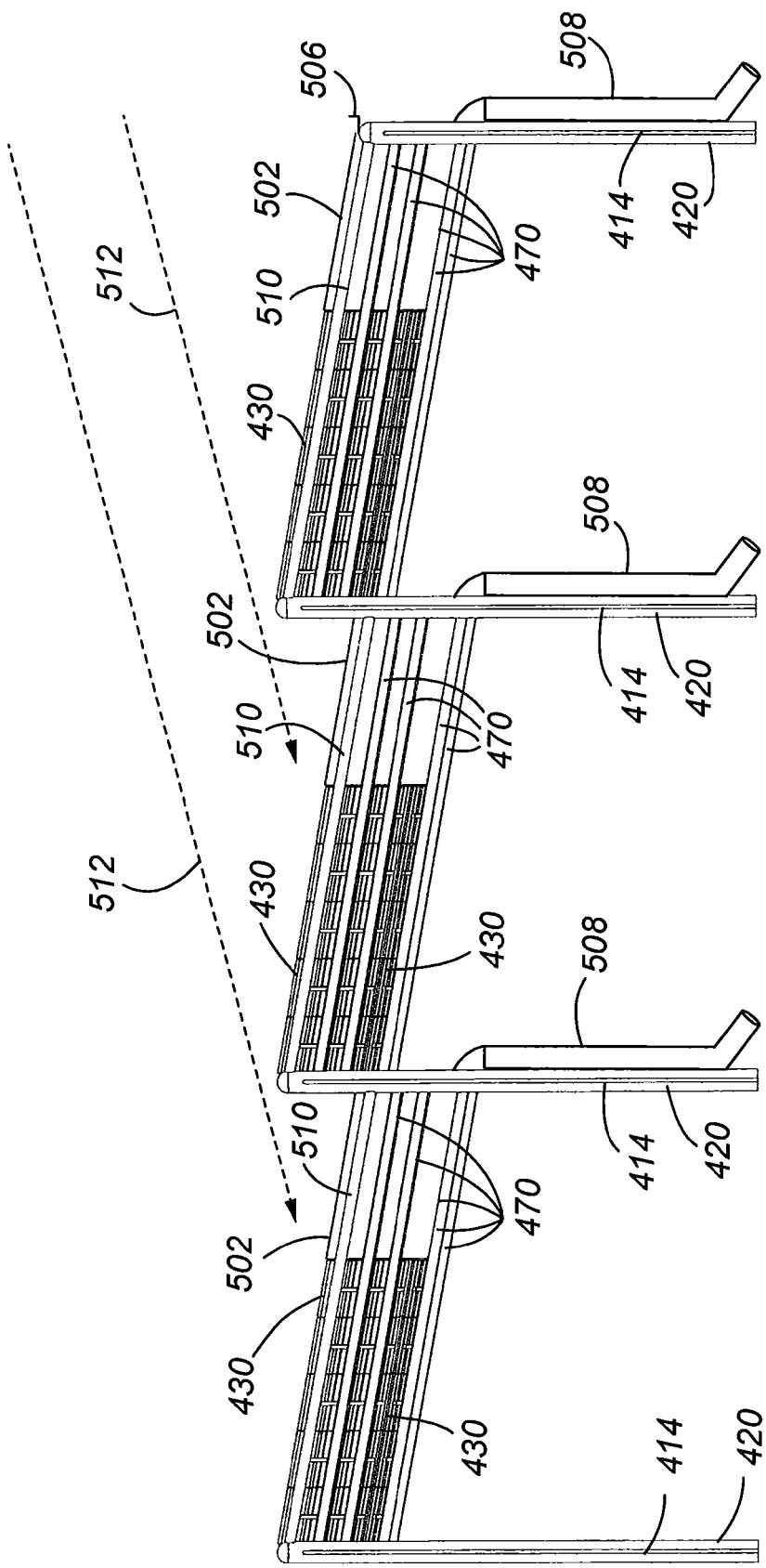
FIG. 59 is a side elevation view taken along line 59-59 of FIG. 58 illustrating further details of this embodiment.

FIGS. 58 and 59 illustrate yet another embodiment of the present invention in the form of an array 500 that is especially adapted for use in colder climates in which snow and ice are present during winter months. In this array 500, a plurality of rows 501 of pods are arranged in a parallel fashion and supported by respective cables and columns. Again, the same reference numbers used in this embodiment correspond to the same elements set forth above with respect to the prior embodiments. This particular embodiment shows that the solar pods 430 are tilted or canted at an angle. The front portion or edge of each of the pods includes heating sheets or panels 502 that extend continuously between the pods, one heating panel being located on each lateral side of the row 501. The heating panels 502 terminate or bisect at the middle 503 of each of the rows 501. Each of the heating panels or sheets 502 may incorporate a heating element 504, such as an electrical strip heater which is used to warm the panels 502 in order to melt snow or ice accumulating thereon. Referring also to FIG. 59, the incident angle of the sun is shown as dashed lines 512. These lines more particularly indicate the angle of the sun during winter months in which the heating panels 502 would be shaded during a significant portion of the daylight hours. If solar panels were used in lieu of the heating panels 502, then the solar panels would continue to accumulate snow and ice during the winter months, which would eventually cause a significant reduction in the area of the solar panels exposed to sunlight. As mentioned, the heating panels 502 are used to melt snow or ice, which then facilitates drainage of liquid from the pods 430 thereby keeping the array clear from snow or ice during periods of sunlight. Referring specifically to FIG. 58, the directional arrows illustrate that the melted ice/snow will travel downward to collect on panels 502. The crease or seam at the middle 503 constitutes the low point where the water will drain into a gutter 506 that is mounted to the front or facing surface of the heating panel 502. A drain line or downspout 508 is provided to collect the water from the gutter 506. As shown, the downspout 508 is secured to the lower cable 410, and traverses outward to one of the columns 420 where the water is then allowed to drain from the array. Each of the rows 501 includes the same drainage structure to drain water from each of the pods 430 in the row. Additional support may be provided between the cables 408 by cross supports 510 that interconnect the adjacent columns 420. The angle at which the pods are disposed can be modified to account for the position of the sun in the winter months. Thus, the area of the heating panels 502 can be minimized thereby increasing the available surface area for producing power from the pods 430.

FIG. 60 illustrates yet another preferred embodiment of the present invention that adds an airfoil feature 520 which comprises a plurality of pods that extend from one side or end of the array to the ground. As shown in FIG. 60, there are two airfoil features, one at each longitudinal end of the array 460. The airfoil 520 can utilize the same pod and panel construction as used on the array 460. FIG. 60A illustrates an alternative construction for a receiver/pod that can be used to secure the solar panels 522. As shown in FIG. 60A, a frame arrangement including a plurality of vertical struts 526 and a plurality of horizontal struts 528 are used to support the solar panels 522. Strut extensions 530 can be used to secure the pods to anchors 534 set in the ground. Alternatively, in lieu of a strut extension 530 that makes direct connection with an anchor, a rod or cable may extend coterminous with one of the vertical struts 526 in order to secure the pods between the array 460 and the ground.

Because high wind conditions could damage the array 460, the purpose of adding airfoils 520 is to stabilize the array 460 during high wind conditions by making the array more aerodynamically shaped.

Although the embodiment of FIG. 60 illustrates that an airfoil 520 comprises additional solar panels, it is also contemplated that the airfoil 520 could be made of a fabric, or some other material that does not act as a sun collecting unit. The benefits of providing better aerodynamics would still be achieved with such an airfoil in which a lower pressure is experienced in the area under the array, while a greater pressure exists above the array in order to stabilize the array during high wind conditions.

Figure 61:
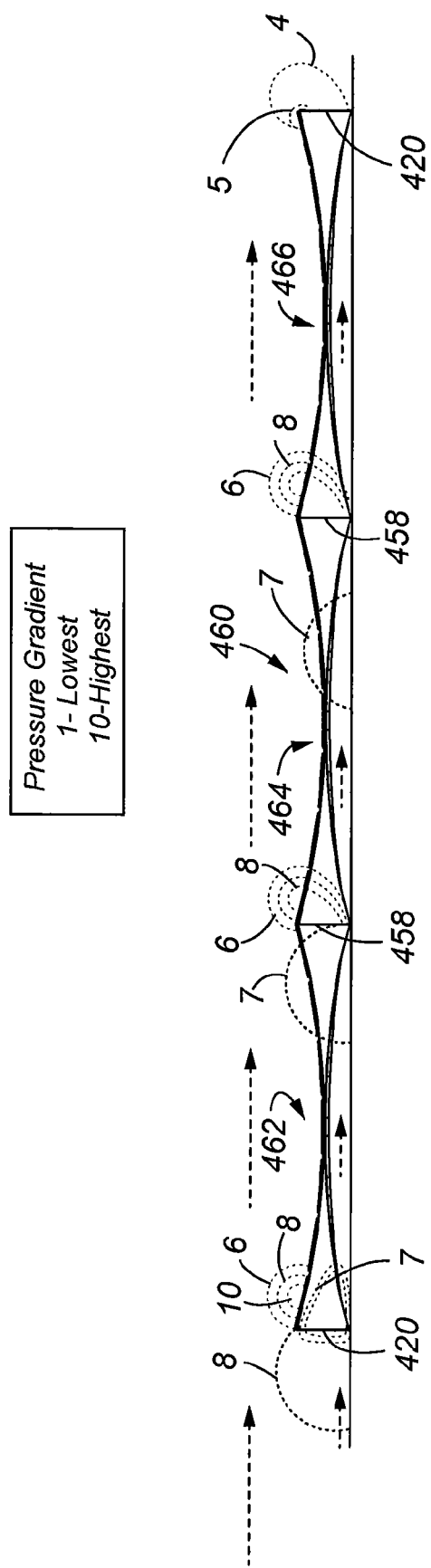
FIG. 61 is a side elevation view of one of the arrays of the present invention and specifically showing pressure patterns that are exerted upon the array based upon air flow traveling over and through the array.
Figure 62:
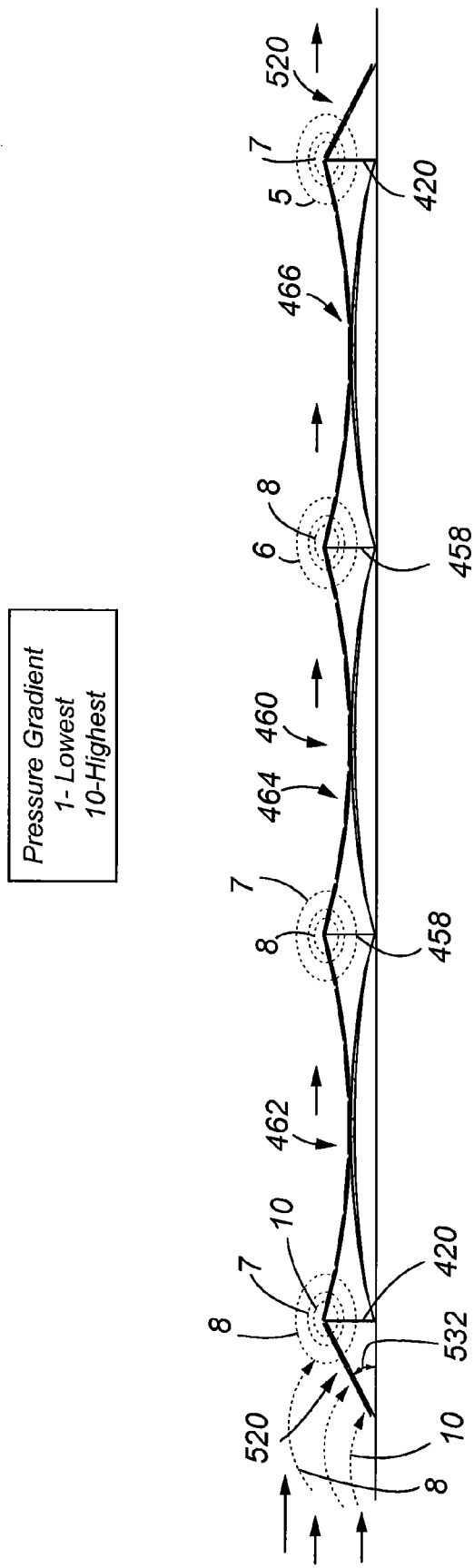
FIG. 62 is another elevation view of the array illustrated in FIG. 61 but further incorporating airfoils that change the resulting airflow pattern as air contacts the array.

Referring to FIGS. 61 and 62, side elevation views are provided to illustrate how airflow, specifically wind, creates pressure gradients on the array 460 with and without the use of airfoils 520. FIG. 61 illustrates an array 460 without airfoils. Directional arrows show an airstream that flows over and through the array. In FIG. 61, the high pressures areas are indicated by the circular or curved lines, and these lines are labeled on a scale from 1 to 10, 1 being the lowest pressure and 10 being the highest pressure areas. As shown, the highest pressure areas form on the leading edge of the array. Pressure areas are also formed over the respective columns 458 and 420. These higher pressure areas over the columns 458 and 420 are generally advantageous for holding down the array during high wind conditions. That is, the higher pressures over the columns are transmitted as downward forces to the columns that help to hold the columns in place during high wind conditions. However, the particularly high pressure area located at the leading edge of the array is problematic in that this high pressure could cause damage to the front portion of the array, and can otherwise degrade the stability of the array by lifting the front portion of the array away from the ground. Furthermore, significant airflow passes through and underneath the array which can also cause additional movement and vibration of the cables and columns. Referring to FIG. 62, the airfoils 520 are added to the array, and the pressure gradients have changed such that most of the pressure is located on top of the array, and there is very little pressure underneath the array due to the airfoils 520 directing the airflow over the top of the array. A higher pressure area is created just upstream of the airfoil 520; however, because of the angled orientation of the airfoil 520, this increases the downward force of the wind which further stabilizes the array in high wind conditions. In fact, as the wind speed increases, the greater the downward force that is transmitted to the array that assists to stabilize the array. FIG. 62 also shows some high pressure areas located over the columns 458 and 420 that also help in anchoring the array to the ground. With respect to the airfoil located at the trailing edge of the array, a pressure gradient also develops, but it is smaller than the pressure gradient located at the upstream or facing side of the array.

The angle 532 that is formed between the airfoil 520 and the surface upon which the system is mounted can be adjusted to best provide the desired air pressure over the system to avoid system damage during high wind conditions. This angle can be adjusted by lengthening or shortening the span of the airfoil 520 between the column 420 and the mounting surface.

For winds that contact the array in the lateral or transverse direction as opposed to the longitudinal direction, as evidenced by the elevation view of FIG. 62, wind has very little effect on the array since the profile of the array is minimized with little interfering structure with the airflow. The symmetrical nature of how the pods in each row align with one another, as well as the aligned arrangement of the cables and columns provides this minimum aerodynamic profile for minimum wind interference. By provision of the airfoils 520, the array is better able to withstand high wind conditions and stability is actually increased as wind speeds increase.

Figure 63:
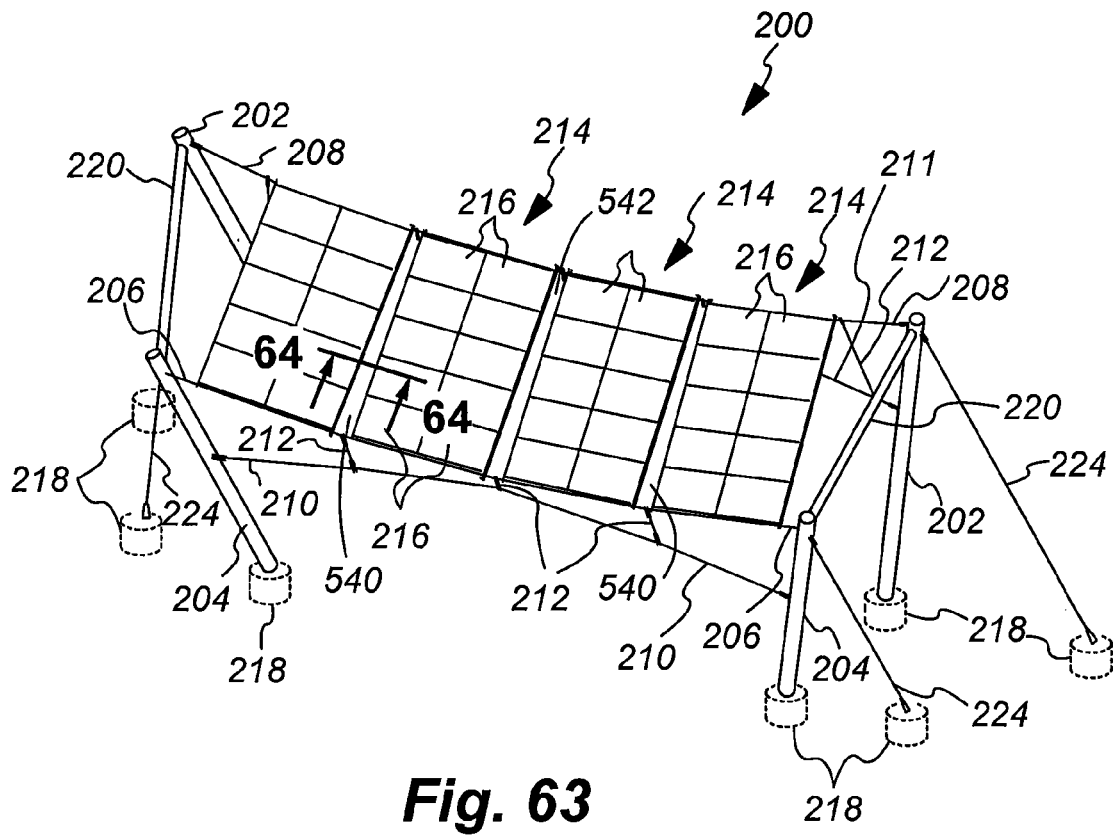
FIG. 63 is a perspective view of the embodiment illustrated in FIG. 14 but further incorporating flexible sealing brackets between the receivers.
Figure 64:
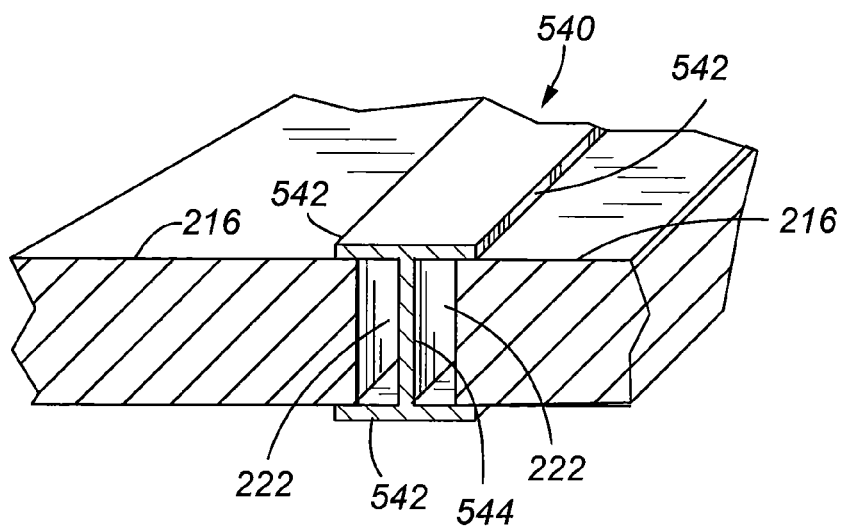
FIG. 64 is an enlarged fragmentary perspective view taken along line 64-64 of FIG. 63 illustrating details of a sealing bracket.

FIG. 63 illustrates a modification to the embodiment of FIG. 14. In FIG. 63, the gap or space 222 between the pods 214 is filled with a flexible sealing bracket 540 as shown in detail in FIG. 64. In the event it is undesirable for water to pass through the gaps between the pods 214, such as when the array is used for a protective parking structure, the flexible sealing bracket 540 spans the gap 222 and interconnects the facing ends of adjacent solar panels 216. The bracket 540 is shown in an I beam configuration having a pair of flanges 542 interconnected by a web 544. The ends of the solar panels 216 are frictionally engaged between the upper and lower flanges 542 on each side of the web 544. The brackets 540 can be made from flexible and elastomeric material such as synthetic rubber. Because the bracket 540 is flexible, some shifting or movement is allowed between the facing solar panels 216 in order to dampen or absorb movement of the cables which otherwise may cause a torsional force to be transmitted to the panels.

It shall be understood that the preferred embodiments of the present invention may incorporate any one of the pods/receiver constructions to best fit the particular installation needs. Thus, in some installations, it may be preferable to have curved struts as opposed to straight struts, or vice versa. The particular pod/receiver construction can also be selected based upon its structural rigidity and capability to mount a selected number of solar panels. The number of struts/beams used in any of the pods/receiver constructions can be selected to minimize required materials, but satisfy the rigidity and strength requirements for the particular installation.

Additionally, it shall be appreciated that the number of solar panels mounted to each pod can be configured for the particular installation. Thus, the pods may contain more or less solar panels as compared to what is illustrated in the preferred embodiments.

The flexible electric cables 82a and 82b may be incorporated in each of the embodiments of the present invention in order to allow each of the solar panel arrays to be coupled to a substation for gathering of produced power. As also mentioned, the solar panel arrays may be electrically coupled to sources of stored electric power such as batteries or fuel cells.

Other arrangements of electrical cables may be used to most effectively transfer power from the solar panels to the power storage location or to a substation.

It will also be appreciated that due to the unique manner in which the solar panels may be supported by the modular nature of the pods, there is almost a limitless combination in the shape and size of an array that can be constructed for installation. The cables and columns can be arranged to provide the necessary support for not only very differently sized and shaped arrays, but also arrays being either ground mounted or overhead mounted.

Those skilled in the art will recognize that the present invention may be manifested in a variety of forms other than the specific embodiments described and contemplated herein. Accordingly, departures in form and detail may be made without departing from the scope and spirit of the present invention as described in the appended claims.

What is claimed is:

1. In combination, a solar panel system and an aqueduct that carries water, said combination comprising:
   a plurality of panel receivers each having a plurality of solar panels mounted thereto, said plurality of panel receivers being arranged in a combination defining a solar panel array having a length and width;
   a plurality of columns positioned at exterior edges of said solar panel array;
   a plurality of upper cables extending between respective columns, said panel receivers being supported by pairs of respective upper cables;
   a plurality of complementary lower cables extending between the columns; and
   a protective membrane secured to said plurality of lower cables and extending over a substantial portion of said length and width of said array, said protective membrane spaced below said array and defining a gap therebetween; and
   an aqueduct carrying water, said aqueduct including a bed and opposing banks that extend from said bed and above a water level of the water, said columns of said solar panel array being mounted exteriorly of said banks wherein said array spans a width of said aqueduct, and wherein said membrane is disposed above the water level of the aqueduct.

* * * * *